United States Patent
Murayama

(10) Patent No.: US 7,812,365 B2
(45) Date of Patent: Oct. 12, 2010

(54) HEAT DISSIPATION MEMBER, SEMICONDUCTOR APPARATUS AND SEMICONDUCTOR LIGHT EMITTING APPARATUS

(75) Inventor: Takashi Murayama, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/334,272

(22) Filed: Dec. 12, 2008

(65) Prior Publication Data

US 2009/0095960 A1  Apr. 16, 2009

Related U.S. Application Data

(63) Continuation of application No. 10/576,154, filed as application No. PCT/JP2004/015259 on Oct. 15, 2004, now Pat. No. 7,482,636.

(30) Foreign Application Priority Data

| Oct. 15, 2003 | (JP) | ............................. 2003-355399 |
| Mar. 17, 2004 | (JP) | ............................. 2004-075577 |
| Apr. 5, 2004 | (JP) | ............................. 2004-110817 |
| Jun. 1, 2004 | (JP) | ............................. 2004-163491 |

(51) Int. Cl.
  *H01L 33/00* (2010.01)

(52) U.S. Cl. ................. 257/99; 257/714; 257/E33.058; 257/E33.075

(58) Field of Classification Search ................... 257/98, 257/99, E33.061, E33.075, 714, E33.058
See application file for complete search history.

(56) References Cited

U.S. PATENT DOCUMENTS

| 6,848,819 | B1 | 2/2005 | Arndt et al. |
| 7,235,878 | B2 * | 6/2007 | Owen et al. ................. 257/714 |
| 2005/0218468 | A1 * | 10/2005 | Owen et al. ................. 257/433 |

FOREIGN PATENT DOCUMENTS

| JP | 47-27495 | 10/1972 |
| JP | 59-161966 | 9/1984 |
| JP | 8-139479 | 5/1996 |

(Continued)

OTHER PUBLICATIONS

Morita et al., "High Output Power 365 nm Ultraviolet Light Emitting Diode of GaN-Free Structure", The Japan Society of Applied Physics, vol. 41 (2002) pp. L1434-L1436, Part 2, No. 12B, Dec. 15, 2002.

*Primary Examiner*—Minh-Loan T Tran
(74) *Attorney, Agent, or Firm*—Ditthavong Mori & Steiner, P.C.

(57) ABSTRACT

A heat dissipation member includes a first plate-shaped member and a second plate-shaped member. The first plate-shaped member has a first surface thermally connectable with a heat generating element and a second surface. The second plate-shaped member is thermally connected with the second surface of the first plate-shaped member. The first plate-shaped member and the second plate-shaped member form a laminated-plate-shaped member. The laminated-plate-shaped member defines an inlet for admission of a fluid and an outlet communicating with the inlet for ejection of the fluid. The second surface of the first plate-shaped member forms asperities thereon.

11 Claims, 22 Drawing Sheets

FOREIGN PATENT DOCUMENTS

| | | |
|---|---|---|
| JP | 9-307040 | 11/1997 |
| JP | 11-163412 | 6/1999 |
| JP | 2000-92858 | 3/2000 |
| JP | 2001-36148 | 2/2001 |
| JP | 2002-315358 | 10/2002 |
| JP | 2002-353515 | 12/2002 |
| JP | 2002-353516 | 12/2002 |
| JP | 2002-544673 | 12/2002 |
| JP | 2003-92009 | 3/2003 |
| WO | WO03/001612 A1 | 1/2003 |

* cited by examiner (a)

(b)

(c)

(a)

(b)

(c)

(a)

(b)

(c)

(a)

(b)

ADMISSION    EJECTION (a)

(b)

(a)

(b)

(c)

HEAT DISSIPATION MEMBER, SEMICONDUCTOR APPARATUS AND SEMICONDUCTOR LIGHT EMITTING APPARATUS

CROSS-REFERENCE TO RELATED APPLICATIONS

This application is a continuation application of U.S. patent application Ser. No. 10/576,154 filed Apr. 17, 2006, which is the U.S. National Stage application of PCT application PCT/JP04/015259, filed Oct. 15, 2004, which claims priority under 35 U.S.C. §119 to Japanese Patent Application No. 2003-355399 filed Oct. 15, 2003, Japanese Patent Application No. 2004-075577 filed Mar. 17, 2004, Japanese Patent Application No. 2004-110817 filed Apr. 5, 2004, and Japanese Patent Application No. 2004-163491 filed Jun. 1, 2004. The contents of these applications are incorporated herein by reference in their entirety.

BACKGROUND OF THE INVENTION

1. Technical Field

The present invention relates to a heat dissipation member, a semiconductor apparatus having the heat dissipation member, and a semiconductor light emitting apparatus having the heat dissipation member.

2. Background Art

A lighting apparatus with a number of light emitting diodes mounted on a conductive plate is proposed as a lighting apparatus employing light emitting diodes. For example, in a lighting apparatus shown in Patent Document 1, a cooling member is connected to a conductive plate in a side where light emitting diodes are not mounted, thus, heat dissipation of light emitting diodes is accelerated to provide a lighting apparatus that can emit high power light. In addition, in order to further improve heat dissipation, a cooling fluid is circulated in the cooling member.

Furthermore, in a vacuum fluorescence tube shown in Patent Document 2, for example, an anode of a conductor with a phosphor layer coated thereon, and a cathode that opposes to the anode are provided in a vacuum case. This vacuum fluorescence tube is used as a vacuum fluorescence tube of a light source for a facsimile. In this case, a part of the anode with the phosphor layer coated thereon extends outwardly of the vacuum case as an extending portion. The extending portion serves as a cooling portion that is exposed to the outside air. In this fluorescent tube, the anode with the phosphor layer coated thereon is made of a heat conductive metal such that the aforementioned cooling portion aids heat dissipation, thus, heat generation of the phosphor layer that is coated can be reduced. Accordingly, in the vacuum fluorescence tube, deterioration of the phosphor is prevented, thus, it is possible to improve luminous efficiency and to maintain high-brightness light emission.

Typical cooling means in a heat sink used against heat dissipation of a heating element, such as semiconductor device is divided into two types, one is passive cooling means, and another one is active cooling means. In the former, heat of the heat generating element is dissipated by using a heat sink with a high heat capacity. In the latte, heat is taken away by flowing cooling water in a heat sink with a heat generating element mounted thereon. In recent years, since semiconductor apparatuses are required to further increase output or brightness, active cooling means is preferably employed in terms of cooling efficiency.

In semiconductor apparatuses employing passive cooling means, for example, an infrared semiconductor laser array has been provided one to several tens watts (W) of light output. The semiconductor laser array refers to an array that has a plurality of resonators arranged on a single semiconductor crystal, or to an array that has respective resonators arranged on a plurality of separated semiconductor crystals.

Moreover, a semiconductor laser array with stack structure has been provided several tens to several kilowatts (W) of light output. Active cooling means is employed in this type of semiconductor apparatus with stack structure. For example, Patent Document 3 has been proposed a technique that cools directly under a semiconductor laser array with a water path provided in a heat sink. A plurality of very small holes that are formed by narrowing the water path are provided in the water path so as to spray pressurized fluid toward directly below heat generating elements. The fluid is vigorously sprayed toward directly below the semiconductor laser array, thus, it is possible to improve heat transmission efficiency. In the structure of this semiconductor apparatus, the water path is designed such that the fluid is incident upon the heat dissipation surface of the heat generating element such as semiconductor laser at substantially right angle.

Patent Document 1: Japanese Laid-Open Patent Publication TOKUHYOU No. 2002-544673

Patent Document 2: Japanese Laid-Open Patent Publication TOKUKAI No. SHO 59-161966

Patent Document 3: Japanese Laid-Open Patent Publication TOKUKAI No. HEI 8-139479

SUMMARY OF THE INVENTION

According to one aspect of the present invention, a heat dissipation member includes a first plate-shaped member and a second plate-shaped member. The first plate-shaped member has a first surface thermally connectable with a heat generating element and a second surface. The second plate-shaped member is thermally connected with the second surface of the first plate-shaped member. The first plate-shaped member and the second plate-shaped member form a laminated-plate-shaped member. The laminated-plate-shaped member defines an inlet for admission of a fluid and an outlet communicating with the inlet for ejection of the fluid. The second surface of the first plate-shaped member forms asperities thereon.

According to another aspect of the present invention, a heat dissipation member includes a first plate-shaped member and a second plate-shaped member. The first plate-shaped member has a first surface thermally connectable with a heat generating element a second surface. The second plate-shaped member is thermally connected with the second surface of the first plate-shaped member. The first plate-shaped member and the second plate-shaped member form a laminated-plate-shaped member. The laminated-plate-shaped member defines an inlet for admission of a fluid and an outlet communicating with the inlet for ejection of the fluid. The first plate-shaped member has a surface area (b) of the second surface being opposed to a contact region of the heat generating element. The surface area (b) is larger than a contact area (a) of the heat generating element in the first surface.

According to further aspect of the present invention, a semiconductor apparatus includes the heat dissipation member and the heat generating element. The heat generating element is formed of a semiconductor.

According to the other aspect of the present invention, a semiconductor light emitting apparatus includes a heat dissipation member and a plurality of light emitting elements. The heat dissipation member dissipates heat generated by a heat generating element. The heat dissipation member is formed of two plate-shaped members that form a flow path for flowing cooling fluid between them. The plurality of light emitting elements are mounted to be two-dimensionally arranged on a main surface of the heat dissipation member.

Figure 1:
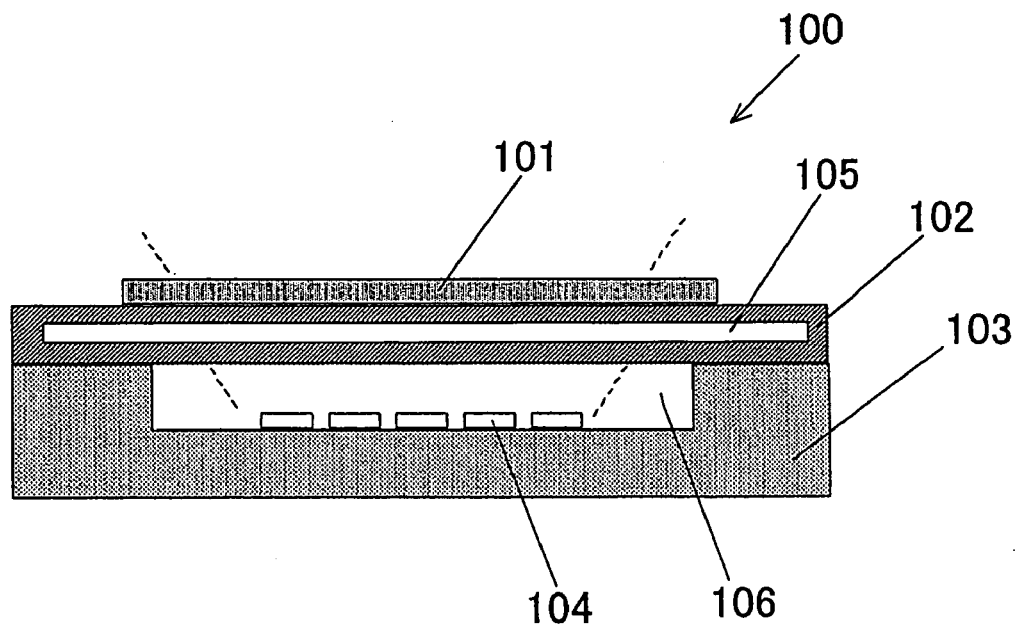
FIG. 1 is a cross-sectional view schematically showing a light emitting device according to one embodiment of the present invention.

EXPLANATION OF REFERENCE LETTERS OR NUMERALS 1, 10 Heat Generating Element
2 First Plate-Shaped Member
3 Second Plate-Shaped Member
100, 200, 300, 400 Light emitting device
101, 201, 301, 401 Light Conversion Member
102, 202, 302, 402 Heat Dissipation Member
103 Support Member
104 Semiconductor Light Emitting Element
105 Flow Path
106, 111 Recessed Portion
107 Insulating Member
108 Supporting substrate
109 Second Heat Dissipation Member
109a, 115a First Plate-Shaped Member
109d, 115b Second Plate-Shaped Member
110 Third Flow Path
112 Flow Path
113 Second Flow Path
114 O-Ring
115 First Heat Dissipation Member
116 Conductive Member
302 Transparent Member

DESCRIPTION OF THE EMBODIMENT

Preferred embodiments according to the present invention are described with reference to the drawings. It should be appreciated, however, that the embodiments described below are illustrations of a light emitting device to give a concrete form to technical ideas of the invention, and a light emitting device of the invention are not specifically limited to description below. Additionally, the sizes and the arrangement relationships of the members in each of drawings are occasionally shown larger exaggeratingly for ease of explanation.

First Embodiment

A light emitting device of a first embodiment of the present invention comprises a light emitting element, a light conversion member including a phosphor material that is capable of absorbing light emitted from the light emitting element at least partially and emitting light in different wavelength, and a heat dissipation member that is located in a side where the light conversion member is provided as viewed from the light emitting element. That is, the light emitting device according to the present invention comprises a semiconductor light emitting element, a light conversion member, and a heat dissipation member, thus, the heat dissipation member aids heat dissipation from the light conversion member containing a phosphor. Accordingly, even in the case where the phosphor is exposed to high power excitation light, since self-heat generation of the phosphor can be suppressed, and deterioration of the phosphor can be prevented, the output of light emitting device does not deteriorate. Therefore, high power light, such as white range light, can be emitted.

The light emitting device according to this embodiment has the light conversion member located in an orientation where light from the light emitting element is incident, and the heat dissipation member that is located adjacent to or inside the light conversion member and aids heat dissipation from the light conversion member. The heat dissipation member preferably has a flow path that is located in a side where the light conversion member is located. The flow path can contain a refrigerant for aiding heat dissipation from the light conversion member. Accordingly, self-heat generation of the phosphor that is exposed to high power and high energy excitation light can be suppressed. In this specification, hereinafter, the "refrigerant" refers to a thermal cooling medium, such as cooling water, cooling gas and inert liquid with a low boiling point, or a solid thermal gradient medium, such as Peltier element. When the refrigerant is circulated, heat dissipation is improved, however, the present invention is not limited to this circulation.

The light conversion member in this embodiment is spaced at a certain interval away from the light emitting element, and is located in the orientation where light from the light emitting element is incident. This can reduce that heat from the light emitting element affects the phosphor as compared with a conventional light emitting device with a light conversion member that directly coats a light emitting element. Particularly, in this embodiment, it is preferable that the light conversion member is applied to the heat dissipation member that is configured to be a flat grid shape to form openings. Alternatively, the heat dissipation member may be configured to be a three-dimensional grid shape inside the light conversion member. In other words, it is preferable that the heat dissipation member extends in a net shape inside the light conversion member. In this case, the light conversion member is formed in at least one surface where light from the light emitting element is incident, or where light is observed.

In addition, it is preferable that a periphery part of the light conversion member that is applied in a flat shape as viewed from a side where light is observed is thermally connected to a support member on which the semiconductor light emitting element is mounted. The term "thermally connected" refers to direct connection between components, or connection between components through a high thermal conductive material other than them, and to connection where heat can be conducted well between connected components. In this case, heat is efficiently conducted from a central part of the light conversion member that is applied in a flat shape toward the periphery part as viewed from a side where light is observed. Accordingly, the heat dissipation characteristics of the phosphor material are further improved. Therefore, it is possible to provide a light emitting device with higher power.

The heat dissipation member according to this embodiment preferably has a light reflection member that reflects light from the light emitting element or light with a wavelength converted by the light conversion member in a prescribed direction. More specifically, the light conversion member, the light reflection member, and the heat dissipation member are laminated in order from the side where light from the semiconductor light emitting element is incident. On the other hand, in the case where the heat dissipation member is a transparent material, the light conversion member, the heat dissipation member, and the light reflection member may be laminated in order from the side where light from the semiconductor light emitting element is incident. A white metal, such as Al, Ag and Rh, or an alloy containing at least one element of them can be given as a material of the light reflection member. Alternatively, the heat dissipation member may be formed of the metal material with high reflectivity such that the heat dissipation member directly reflects light emitted from the light conversion member.

Plating, sputtering, screen printing, or the like, can be employed as a method that directly applies the aforementioned light reflection member to the heat dissipation member. The light reflection member according to this embodiment is not limited to be directly applied to the heat dissipation member, but may be a separate member that is formed of the aforementioned material, and provided adjacent to the heat dissipation member.

At least a part of the heat dissipation member can be a curved surface that is radiated with light from the semiconductor light emitting element and directs light from the phosphor material in a prescribed direction. The curved surface can have various shapes such as paraboloid and ellipsoid so as to collect light from the semiconductor light emitting element and to direct it in a prescribed direction.

The heat dissipation member according to this embodiment includes at least a pair of an inlet for admission of the refrigerant and an outlet for ejection of the refrigerant that is circulated through the flow path of the heat dissipation member on an outer wall of the heat dissipation member. The location, number, and shape of the outlet or inlet are selected to improve a cooling effect in consideration of the size, and shape of the light emitting device, and are not limited to this form. Thus, the refrigerant can be circulated in the heat dissipation member.

In the case where the density of light incident on the light conversion member is not less than 3 $W/cm^2$, and the light emitting device is driven by applying a electric current, the temperature of the light conversion member is set to not more than 200° C., preferably to 120° C., and more preferably to 100° C. Accordingly, the heat dissipation characteristics of the light emitting device are improved, therefore, it is possible to provide a high power light emitting device. The components according to this embodiment will be described.

The components of the light emitting device according to the first embodiment are now described.

(Heat Dissipation Member)

The heat dissipation member in the light emitting device according to this embodiment is a member that aids heat dissipation from the light conversion member, particularly the phosphor material contained in the light conversion member, in a side where light from the light emitting element is incident. In addition, the heat dissipation member is a member that is thermally connected to the support member on which the light emitting element is mounted, and dissipates heat from the light conversion member toward the support member. Hereinafter, the heat dissipation member is described in more detail.

The heat dissipation member according to this embodiment refers to a member that is provided with the light conversion member containing the phosphor directly thereon or so as to sandwich a high thermal conductive material other than them between them, and conducts heat generated from the phosphor externally of the light emitting device. In addition, the heat dissipation member according to this embodiment also refers to a member that has the flow path for cooling the phosphor, is provided with the light conversion member containing the phosphor thereon, and conducts heat generated from the phosphor externally of the light conversion member. It is preferable that the heat dissipation member is thermally connected to the support member on which the light emitting element is mounted. Additionally, it is preferable to provide an air cooling fan, a solid thermal gradient medium, such as Peltier element, and a heat dissipation block on the back surface of the light conversion member or in the periphery of the heat dissipation member. This allows heat of the light conversion member or heat dissipation member to be effectively externally conducted.

It is preferable that the heat dissipation member is formed of a material that can pass at least light from the light emitting element, or a material that can pass light from both the light emitting element and the light conversion member. In this case, the light conversion member can be provided on at least one of a main surface in a side where light is observed on the heat dissipation member, and a main surface in a side where light from the light emitting element is incident. Although the light conversion member is connected directly to the heat dissipation member, the light conversion member is not limited to this form. Needless to say, the light conversion member may be mounted to the heat dissipation member so as to sandwich a transparent member other than them between them. In addition, the shape of the light conversion member in a side where light is observed can have a lens shape in consideration of the optical characteristics of light from the light emitting device. Alternatively, the light emitting device can have an optical member for control of directivity of light from the light emitting device such as convex lens and concave lens in addition to the light conversion member. Additionally, the heat dissipation member may have a transparent part that contains the phosphor to serve as the light conversion member. Moreover, the flow path of the refrigerant for cooling the phosphor may be formed inside the light conversion member.

In this embodiment, the flow path of the refrigerant is applicable to a path closed or opened externally of the light emitting device. As one example of the heat dissipation member having an opened flow path, the heat dissipation member can have a flat plate that is made of a metal, such as copper and aluminum, and is provided with a flow path for passing the refrigerant therethrough. In the case where the heat dissipation member has a transparent part, a transparent resin, a quartz material, or the like, is selected as a material of the transparent part. In addition, in order to circulate the refrigerant through the heat dissipation, the heat dissipation member has at least one pair of an inlet and an outlet on its outer wall surface. The heat dissipation member can have a plurality of plate-shaped members at least one of which has a groove or asperities, and through holes as the inlet and outlet. For example, the heat dissipation member has a first plate-shaped member that has a groove or a recessed shape and through holes as the inlet and outlet, and a second plate-shaped member. Surfaces of the first and second plate-shaped members that are opposed to each other are bonded, thus, the flow path of the heat dissipation member can be formed. Needless to say, in this embodiment, the shape of the heat dissipation is not limited to an illustrated shape. In the first plate-shaped member as a portion of the heat dissipation member, for example, a recessed portion is formed so as to be gradually wider and then narrower from the location where one of openings (inlet or outlet) is formed to other opening. This allows the refrigerant to smoothly circulate through the flow path. Additionally, it is preferable that small grooves or asperities are formed on an inner wall surface of the recessed portion. This increases the contact area between the refrigerant and the heat dissipation member, and thus can improve a heat dissipation effect for the light emitting device.

As one example of the heat dissipation member having a closed flow path, the heat dissipation member can have a heat pipe that is made of a metal, such as copper and aluminum, and is provided with the refrigerant sealed therein. Particularly, in another embodiment, a heat pipe is a metal tube that is made of a metal, such as copper and aluminum, in which a hydraulic fluid for conveying heat, such as water, CFCs, alternative CFCs and Fluorinert, is sealed, for example. In this case, the hydraulic fluid is heated and evaporated in a heat input part (high temperature part), and the evaporated liquid moves and then liquefied in a heat dissipation part (lower temperature side). The liquefied hydraulic fluid is moved back to the heat input portion by capillary phenomenon, thus this cycle is repeated. Accordingly, a heat conveying member with high heat conductivity can be provided.

The heat dissipation member can have various types of shapes and sizes in consideration of a heat dissipation direction and a heat dissipation effect. For example, asperities are formed on the inner wall surface of the flow path that is opposed to a surface on which the light conversion member is provided. This increases the contact area between the aforementioned inner wall surface and the refrigerant as compared with the case where asperities are not formed, and thus can improve the heat dissipation characteristics from the light conversion member. In addition, in the heat dissipation member that is configured to be a grid shape to form openings, a plurality of through holes can be formed in a plate-shaped material of heat dissipation member so as to be arranged in a matrix shape. Alternatively, the through holes can be formed by connecting a plurality of line materials in a grid shape.

In the heat dissipation member formed in a plate shape, it is preferable that the minimum distance d (mm) between its surface that is opposed to the light conversion member and the inner wall surface of the flow path satisfies the following Equation.

$$0.05 < d < (C/800) \qquad \text{(Equation 1)}$$

where C is the thermal conductivity in W/mK of a plate-shaped member that composes the heat dissipation member.

For example, in the case where the heat dissipation member is formed of oxygen-free copper, it is preferable that d (mm) is set within the following range.

$$0.05 < d < 0.5 \quad \text{(Equation 2)}$$

Additionally, in the case where the heat dissipation member is formed of ceramics, such as alumina and aluminum nitride, it is preferable that d (mm) is set within the following range.

$$0.05 < d < 0.25 \quad \text{(Equation 3)}$$

If the value of d is lager than the upper limit, the thermal resistance of the heat dissipation member becomes too large. In this case, thermal interference between the light emitting elements adjacent to each other becomes remarkable. Accordingly, the light emitting elements cannot be mounted at high density. If the value of d is smaller than the lower limit, the plate-shaped member cannot be easily processed.

(Support Member)

The support member according to this embodiment refers to a member that is provided with the light emitting element mounted thereon and a conductive wire for supplying electric power to the light emitting element, and serves as a support member for supporting other components to achieve sufficient mechanical strength of the light emitting device. The supporting member can have various sizes in consideration of heat dissipation characteristics, the output of light emitting device and so on, and have various shapes in consideration of the shape of light emitting device. In addition, in order to control distribution of light, a reflector may be provided on a part of the support member.

For example, the support member may have inclined walls that reflect light from the light emitting element in the direction where the light is observed. The inclined walls can be formed as inner walls of a tapered recessed portion and the inner walls are opposed to the light emitting element mounted in the recessed portion. In addition, a reflector layer may be formed on the inclined walls for excellent reflection of the light from the light emitting element. In order to efficiently dissipate heat conducted from the light emitting element toward the heat dissipation member side, the support member preferably has high heat conductivity. Ceramics, copper, aluminum, and a phosphor bronze plate can be given to employ each of them alone as preferable examples of materials with high heat conductivity. In addition, it is preferably used with silver or palladium that is coated on its surface, or with metal plating such as silver and gold, solder plating or the like that is performed on its surface.

(Semiconductor Light Emitting Element)

The semiconductor light emitting element refers to a laser diode or light emitting diode that emits light of a wavelength capable of exciting the phosphor. The semiconductor light emitting element preferably has a light emitting layer that emits light of a particular wavelength capable of efficiently exciting the phosphor.

Various semiconductors, such as BN, SiC, ZnSe, GaN, InGaN, InAlGaN, AlGaN, BAlGaN, and BInAlGaN can be given as materials of the semiconductor light emitting element. Si, Zn, and so on, can be included in these elements as impurity elements and serve as the center of light emission. Particularly, a nitride semiconductor (e.g., a nitride semiconductor containing A and Ga, or a nitride semiconductor containing In and Ga, i.e., $In_xAl_yGa_{1-x-y}N$ $0 \leq x$, $0 \leq y$, $x+y \leq 1$) can be given as a material of light emitting layer that can efficiently emit light with a short wavelength from the visible region to the ultraviolet region capable of efficiently exciting the phosphor. B can also be employed as a III group element in addition to the material. P or As can be substituted as a part of N of a V group element. Homo structure, hetero structure, or double-hetero structure with MIS junction, PIN junction, pn junction, or the like, can be employed as the structure of semiconductor. Various light-emission wavelengths can be selected depending on materials and mixed crystal ratios of semiconductor layer. The semiconductor layer can have a single- or multi-quantum-well structure provided with thin layer(s) for quantum effect.

Any method known as a growth method of nitride semiconductor can be employed as a growth method of the aforementioned nitride semiconductor. For example, MOVPE (Metal-Organic Chemical Vapor Deposition), MOCVD (Metallorganic Chemical Vapor Deposition), HVPE (Hydride Chemical Vapor Deposition), MBE (molecular beam epitaxy method), and so on, can be given as examples, but the present invention is not limited to them. In particular, since MOCVD can provide excellent crystallinity, it is preferably employed.

In the case where a nitride semiconductor is employed, a material, such as sapphire, spinel, SiC, Si, and ZnO, is preferably employed as a substrate for semiconductor. In order to form a nitride semiconductor with excellent crystallinity in quantity, it is preferable to employ a sapphire substrate. A semiconductor can be formed on the sapphire substrate by using MOCVD. A buffer layer of GaN, AlN, GaAlN, and so on, is formed on the sapphire substrate, and then a nitride semiconductor with pn junction is formed thereon.

The following double-hetero structure can be given as an example of the light emitting element employing a nitride semiconductor with pn junction. In the double-hetero structure, a first contact layer formed of n-type gallium nitride, a first cladding layer formed of n-type aluminum-nitride gallium, an active layer formed of indium-gallium nitride, a second cladding layer formed of p-type aluminum-nitride gallium, and a second contact layer formed of p-type gallium nitride are successively laminated on the buffer layer.

A nitride semiconductor has n-type conductivity in the state where an impurity is not doped. In the case where a desired n-type nitride semiconductor is formed to improve luminous efficiency or to achieve other purpose, it is preferable that Si, Ge, Se, Te, C, or the like, is doped, if necessary. On the other hand, in the case where a p-type nitride semiconductor is formed, Zn, Mg, Be, Ca, Sr, Ba, or the like, which are p-type dopants, are doped. Even if a nitride compound semiconductor is doped with a p-type dopant, this can hardly provide p-type conductivity. Accordingly, after a p-type dopant is doped, it is preferable to achieve low resistance by heating with a furnace, plasma irradiation, and so on.

In order to widely provide a current supplied to the light emitting element over the whole area of the p-type semiconductor, a diffusion electrode is formed on the p-type semiconductor. In addition, p-side and n-side pad electrodes that are connected to conductive members such as bumps or conductive wires are formed on the diffusion electrode and the n-type semiconductor, respectively.

The p-side and n-side pad electrodes of the semiconductor light emitting element are electrically connected to conductive members or heat dissipation members that are provided in an insulating member through the conductive wires. Alternatively, the semiconductor light emitting element is mounted in a flip chip mounting manner through solder or bump, and is electrically connected to the support member or the heat dissipation members.

An electrode formation surface of the nitride semiconductor layer construction can be a light-outgoing surface. Alternatively, a side of the substrate on which nitride semiconductor layers are laminated can be a light-outgoing surface. In the case where the side of the substrate on which nitride semiconductor layers are laminated can be a light-outgoing surface, a protection film is preferably formed except surfaces where the electrodes of the nitride semiconductor element are formed. In this case, the electrodes that are formed on the nitride semiconductor layer construction are connected to external terminals, and so on, through metallizing layers (bumps) in a facedown manner. In the case where the side of the substrate is a light-outgoing surface, light-outgoing efficiency is improved.

The nitride semiconductor element according to the present invention may have a structure where a p-type nitride semiconductor layer, an active layer, and an n-type nitride semiconductor layer are formed so as to sandwich a conductive layer and a p-electrode between the p-type nitride semiconductor layer and a supporting substrate, and an n-electrode was formed on the n-type nitride semiconductor layer. This nitride semiconductor element has an opposed electrode configuration where the p-electrode and n-electrode are opposed to each other so as to sandwich the nitride semiconductor layers. In the case of this nitride semiconductor element, the n-electrode side is a light-outgoing surface. Since, in a nitride semiconductor (in particular, GaN group semiconductor), an n-type layer has low resistance, the size of n-electrode can be reduced. Since reduction of the size of n-electrode reduces an area where light is cut off, the light outgoing efficiency can be improved.

Moreover, a semiconductor light emitting element according to another form is composed only of nitride semiconductor layers, and has opposed electrodes that are formed on the upper and lower surfaces of the semiconductor layer construction. This type of semiconductor light emitting element with opposed electrodes is secured with a conductive adhesive agent such that one of the electrodes opposes the heat dissipation member according to this embodiment. The insulating member according to this embodiment is provided with the conductive member that is coated from a surface opposing the support member to a recessed portion thereof. Accordingly, the one of the electrodes of the light emitting element is electrically connected to the heat dissipation member, and the other electrode is connected to the aforementioned conductive member through a conductive wire. For example, silver paste, or a eutectic material, such as Au—Sn, and Ag—Sn, can be given as a material of the conductive adhesive agent.

A formation method of this type of semiconductor light emitting element with opposed electrodes is now described. First, after n-type and p-type nitride semiconductor layers are laminated similarly to the aforementioned semiconductor element, an insulating film is formed on a p-electrode as a first electrode and the p-type nitride semiconductor layer except the p-electrode. On the other hand, a supporting substrate is prepared to be attached on this semiconductor layer construction. Specifically, Cu—W, Cu—Mo, AlN, Si, SiC, and so on, can be given as materials of the supporting substrate. A structure with an intimate-contact layer, a barrier layer and a eutectic layer is preferably employed for an attachment interface. For example, metal layers, such as Ti—Pt—Au and Ti—Pt—AuSn are formed. These types of metal layers are alloyed, and compose a conductive layer in the following process.

Subsequently, a surface of the supporting substrate where the metal layers is formed and a surface of the nitride semiconductor layer construction are opposed to each other, and heat is applied thereto while pressing them. Then, a different material substrate is removed by irradiation of an excimer laser from a different material substrate side, or grinding. After that, an outer periphery part is etched by RIE, or the like, to form the nitride semiconductor element, thus, the nitride semiconductor element with the outer periphery part being removed is obtained. In addition, asperities may be formed (dimple processing) on an exposed surface of the nitride semiconductor by RIE, or the like, to improve light-outgoing efficiency. The cross-sectional shape of the asperities can be a mesa shape, an inverse mesa shape, and so on. The plan shape can be an island shape, a grid shape, a rectangular shape, a circular shape, polygonal shape, and so on. Finally, an n-electrode as a second electrode is formed on an exposed surface of the aforementioned nitride semiconductor layer construction. Ti/Al/Ni/Au, and W/Al/WPt/Au can be given as examples of a material of the electrode.

(Light Conversion Member)

A phosphor applicable to the present invention a material that absorbs a part of light from the light emitting element and emits luminescent radiation of a wavelength different from the absorbed light. Particularly, the phosphor employed in this embodiment is excited by at least light emitted from the semiconductor light emitting element, and emits luminescent radiation of a converted wavelength. The phosphor and a binding agent that binds this phosphor compose the light conversion member. The binding agent can be composed of a transparent resin such as epoxy resin, or a transparent inorganic material produced from a silicone resin or metal alkoxide with high light-resistance as an original material by a sol-gel method, for example. The light conversion member can be applied on the heat dissipation member by various methods, such as screen printing, ink-jet application, potting, and mimeograph printing. In addition, the phosphor may be contained in a transparent heat dissipation member. The phosphor that can be contained in the light conversion member according to this embodiment is now described.

<Aluminum Garnet Group Phosphor>

The aluminum garnet group phosphor employed in this embodiment is a phosphor that contains Al, at least one element selected from the group consisting of Y, Lu, Sc, La, Gd, Tb, Eu, and Sm, and least one element selected from the group consisting of Ga and In, and is activated by at least one element selected from the group consisting of rare earth elements. This aluminum garnet group phosphor is excited by visible light or ultraviolet rays emitted from an LED chip, and emits radiation.

$YAlO_3$:Ce, $Y_3Al_5O_{12}$:Ce, $Y_4Al_2O_9$:Ce, $(Y_{0.8}Gd_{0.2})_3Al_5O_{12}$:Ce, $Y_3(Al_{0.8}Ga_{0.2})_5O_{12}$:Ce, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.05}Al_5O_{12}$ can be given as the example. Particularly, in this embodiment, two kinds of yttrium aluminum oxide group phosphors (yttrium-aluminum-garnet phosphors (hereinafter, occasionally referred to as "YAG group phosphors")) with different compositions that contain Y and are activated by Ce or Pr can be employed. Particularly, in use for high luminance and for a long time, it is preferable that $(Re_{1-x}Sm_x)_3(Al_{1-y}Ga_y)_5O_{12}$:Ce (where, $0 \leq x \leq 1$, $0 \leq y \leq 1$, and Re represents at least one element selected from the group consisting of Y, Gd, and La), or the like, is employed.

Since the phosphor of $(Re_{1-x}Sm_x)_3(Al_{1-y}Ga_y)_5O_{12}$:Ce has a garnet structure, it has heat, light, and moisture resistances, and its peak of excitation spectrum can be near 470 nm. In addition, the light emission peak is near 530 nm, and it is possible to provide broad emission spectrum with foot extending to 720 nm.

In the light emitting device according to present invention, two or more kinds of phosphors may be mixed. That is, as for the aforementioned YAG phosphor, the wavelength components of RGB can be increased by mixing two or more kinds of phosphors of $(Re_{1-x}Sm_x)_3(Al_{1-y}Ga_y)_5O_{12}$:Ce with different Al, Ga, Y, La, and Gd, or different content of Sm. At present, light emitting elements have unevenness in their light-emission wavelengths. Accordingly, adjustment of mixture of two or more kinds of phosphors can achieve desired white range light, or the like. Specifically, adjusting the amount of phosphor with a different chromaticity point depending on the light-emission wavelength of light emitting element can provide light emission of arbitrary point on the chromaticity diagram on the line connected between the phosphor and the light emitting element.

When blue group light emitted from the light emitting element using a nitride group compound semiconductor as a light emitting layer is mixed with green group light and red group light emitted from a phosphor with yellow body color for absorption of the blue light, it is possible to provide desired white range light-emission color display. In the light emitting device, in order to provide this color mixture, particles or bulk of the phosphor may be included in various resins, such as epoxy resin, acrylic resin and silicone resin, or transparent inorganic substance such as silicon oxide and aluminum oxide. The resin or the substance including the phosphor can be formed in a dot shape or a film shape to be thin to the extent that light from the light emitting element passes depending on various applications. Arbitrary color tone such as electric bulb color including white can be provided by adjusting the ratio between the phosphor and the transparent inorganic substance, or by selecting the light-emission wavelength of light emitting element.

In addition, when two or more kinds of phosphors are disposed in a certain order in the direction of light incident from the light emitting element, it is possible to provide a light emitting device capable of efficiently emitting light. That is, for example, when layers are laminated on the light emitting element with a reflective member, it is possible to effectively use the reflected light; one layer is a color converting member containing a phosphor capable of absorbing light in long wavelength side and emitting light with long wavelength, and other layer is a color converting member capable of absorbing light in wavelength side longer than that and emitting light with longer wavelength.

In use of a YAG phosphor, even in the case where the phosphor is located to be in contact with or close to a light emitting element with irradiation illuminance (Ee)=not less than 0.1 W·cm$^{-2}$ and not more than 1000 W·cm$^{-2}$, it is possible to provide a light emitting device with effective and sufficient resistance.

Since a YAG group phosphor that is activated by cerium and can emit luminescent radiation of green group light, used in this embodiment, has garnet structure, it has heat, light, and moisture resistance, and its peak of excitation spectrum can be near 420 nm to 470 nm. In addition, the light emission peak wavelength $\lambda p$ is near 510 nm, and provides broad emission spectrum with foot extending to near 700 nm. On the other hand, since a YAG group phosphor, which is an yttrium aluminum oxide group phosphor activated by cerium and can emit luminescent radiation of red group light, used in this embodiment, also has garnet structure, it has heat, light, and moisture resistance, and its peak of excitation spectrum can be near 420 nm to 470 nm. In addition, the light emission peak wavelength $\lambda p$ is near 600 nm, and provides broad emission spectrum with foot extending to near 750 nm.

In the composition of YAG group phosphor with garnet structure, substituting Ga for a part of Al shifts the emission spectrum toward the short wavelength side. Substituting Gd and/or La for a part of Y in the composition shifts the emission spectrum toward the long wavelength side. Thus, varying composition can continuously adjust the luminescent color. Accordingly, the ideal condition of conversion into white range light emission by using blue group light emission of nitride semiconductor is provided by continuous variation of intensity in the long wavelength side by composition ratio of Gd, and so on. When the substitution of Y is less than twenty percent, the green component increases and the red component reduces. On the other hand, when it is not less than eighty percent, the red component increases but luminance sharply reduces. In addition, similarly to the excitation absorption spectrum, in the composition of YAG group phosphor with garnet structure, substituting Ga for a part of Al shifts the excitation absorption spectrum toward the short wavelength side. Substituting Gd and/or La for a part of Y in the composition shifts the excitation absorption spectrum toward the long wavelength side. It is preferable that the peak wavelength of the excitation absorption spectrum of YAG group phosphor is in the short wavelength side relative to the peak wavelength of the emission spectrum of light emitting element. In this construction, when a current supplied to a light emitting element increases, the peak wavelength of the excitation absorption spectrum substantially agrees with the peak wavelength of the emission spectrum of light emitting element. Accordingly, it is possible to provide a light emitting device in which occurrence of chromaticity deviation is kept in check without reduction of excitation efficiency of phosphor.

The aluminum garnet group phosphor can be produced as follows. First, as for the phosphor, an oxide or a compound, which easily becomes into an oxide at high temperature, is employed as a material of Y, Gd, Ce, La, Al, Sm, Pt, Tb, and Ga, thus, the material is obtained by sufficiently mixing them at the stoichiometric ratio. Alternatively, a mixed material is obtained by mixing a coprecipitated oxide with an aluminum oxide and a gallium oxide; the coprecipitated oxide is obtained by burning a material obtained by coprecipitating solution, in which a rare earth element of Y, Gd, Ce, La, Sm, Pr, and Tb are dissolved in acid, with an oxalic acid at the stoichiometric ratio. After mixing the mixed material and an appropriate amount of fluoride such as ammonium fluoride as flux, inserting them in to a crucible, then burning them at temperature 1350° C. to 1450° C. in air for 2 hours to 5 hours, as a result, a burned material can be obtained. Next, the burned material is crushed in water by a ball mill. Then washing, separating, drying it, finally sifting it through a sieve, the photo-luminescent phosphor can be obtained. Additionally, a method for producing a phosphor according to another embodiment includes two steps for burning. In a first burning step, mixture composed of mixed material, in which a material of phosphor is mixed, and flux is burned in the air or a weak reducing atmosphere. In a second burning step, the mixture is burned in a reducing atmosphere. The weak reducing atmosphere refers to a reducing atmosphere with low effect including at least a necessary amount of oxygen to form a desired phosphor from a mixed material in the reaction process. The first burning process is performed in this weak reducing atmosphere until desired structure formation of the phosphor is completed, thus, it is possible to prevent a phosphor from turning to black, and light-absorption efficiency from reducing. The reducing atmosphere in the second burning process refers to a reducing atmosphere with high effect stronger than the weak reducing atmosphere. In the case of two steps for burning as discussed above, a phosphor with high absorption efficiency of excitation wavelength is obtained. Accordingly, when a light emitting device is formed by using the phosphor formed as discussed above, the amount of phosphor necessary for obtaining desired color tone can be reduced. Therefore, it is possible to provide a light emitting device with high light-outgoing efficiency.

Two or more kinds of aluminum garnet group phosphors activated by cerium with different compositions may be mixed or be independently located for use. In the case where the phosphors are independently located, it is preferable that they are located in the order from a light emitting element of a phosphor, which absorbs the light and emits luminescent radiation in the shorter wavelength side, and a phosphor, which absorbs the light and emits luminescent radiation in the wavelength side longer than that. This allows them to efficiently absorb the light and emits luminescent radiation.

The combination of an aluminum garnet group phosphor, typically such as an yttrium-aluminum-garnet phosphor and a lutetium-aluminum-garnet group phosphor, and a phosphor capable of emitting luminescent radiation of red group light, particularly, a nitride phosphor, can be used as the phosphor used in this embodiment. These YAG group phosphor and nitride phosphor can be mixed and included in the light conversion member, or may be separately included in a plurality of layers which compose the light conversion member. Hereinafter, each phosphor will be described.

<Lutetium-Aluminum-Garnet Group Phosphor>

The lutetium-aluminum-garnet group phosphor is a phosphor represented by the general formula $(Lu_{1-a-b}R_aM_b)_3(Al_{1-c}Ga_c)_5O_{12}$ (where R represents at least one element of rare earth elements necessary to include Ce; M is at least one element selected the group consisting of Sc, Y, La and Ga; and $0.0001 \leq a \leq 0.5$, $0 \leq b \leq 0.5$, $0.0001 \leq a+b<1$, $0 \leq c \leq 0.8$). For example, the lutetium-aluminum-garnet group phosphor can be phosphors represented by the composition formulas $(Lu_{0.99}Ce_{0.01})_3Al_5O_{12}$, $(Lu_{0.90}Ce_{0.10})_3Al_5O_{12}$, and $(Lu_{0.99}Ce_{0.01})_3(Al_{0.5}Ga_{0.5})_5O_{12}$.

The lutetium-aluminum-garnet group phosphor (hereinafter, occasionally referred to as a "LAG group phosphor") can be produced as follows. A lutetium compound, a compound of rare earth element R, a compound of rare earth element M, an aluminum compound, and a gallium compound are used as phosphor materials. The compounds are measured so as to satisfy the ratio of the aforementioned general formula, respectively. Subsequently, these phosphor materials are mixed, or mixed additionally with a flux to obtain a material mixture. This material mixture is filled in a crucible, and is burned at a temperature 1100 to 1650° C. in a reducing atmosphere. After cooled, it is dispersed, thus, the phosphor according to the present invention represented by the aforementioned general formula is obtained.

An oxide or a compound such as carbonate and hydroxide, which becomes into an oxide by thermal decomposition, is preferably used as a phosphor material. A coprecipitated material, which contains all of, or some of metallic elements composing the phosphor, can be used as a phosphor material. For example, the coprecipitated material can be obtained by adding an aqueous solution of alkali, carbonate, or the like, to an aqueous solution containing these elements, but it may be used after drying or thermal decomposition. Fluoride, borate, or the like, is preferably used as the flux. It is added within the range 0.01 to 1.0 by weight relative to 100 of the phosphor material by weight. It is preferable that the burning is performed in a reducing atmosphere where cerium as an activation agent is not oxidized. It is more preferable that the burning is performed in a mixed-gas atmosphere of hydrogen and nitrogen with a hydrogen concentration of not more than 3.0% by volume. It is preferable that the burning is performed at a temperature of 1200 to 1600° C. to obtain a phosphor with a target center particle size. A temperature of 1300 to 1500° C. is more preferable.

In the aforementioned general formula, R is an activation agent, and is at least one element of rare earth elements necessary to include Ce. Specifically, the rare earth elements are Ce, La, Pr, Nd, Sm, Eu, Gd, Tb, Dy, Ho, Er, Tm, Yb, and Lr. R can includes only Ce, but, may includes Ce and at least one element of rare earth elements other than Ce. The reason is that the rare earth elements other than Ce serve as coactivation agents. R preferably includes not less than 70 mol % of Ce relative to the total amount of R. The value a (the amount of R) is preferably $0.0001 \leq a \leq 0.5$. If the value a is less than 0.0001, the luminance decreases. On the other hand, the value a is more than 0.5, the luminance decreases due to concentration quenching. It is more preferable $0.001 \leq a \leq 0.4$, and most preferably $0.005 \leq a \leq 0.2$. The value b (the amount of M) is preferably $0 \leq b \leq 0.5$, more preferably $0 \leq b \leq 0.4$, and most preferably $0 \leq b \leq 0.3$. For example, in the case M is Y, if the value b is more than 0.5, the luminance decreases in long wavelength ultraviolet rays to short wavelength visible light, particularly in 360 to 410 nm. The value c (the amount of Ga) is preferably $0 \leq c \leq 0.8$, more preferably $0 \leq c \leq 0.5$, and most preferably $0 \leq c \leq 0.3$. If the value c is more than, the light-emission wavelength shifts toward short wavelength side, and the luminance decreases.

It is preferable that the center particle size of LAG group phosphor is within a range 1 to 100 μm, more preferably within a range 5 to 50 μm, and most preferably within a range 5 to 15 μm. A phosphor with center particle size of less than 1 μm tends to form aggregate. The phosphor with the particle size within a range 5 to 10 μm has a high light absorption coefficient, and a high conversion efficiency, and aids formation of the light conversion member. The phosphor having the particle size with excellent optical features is contained, thus, the mass-producibility of light emitting device is improved. It is preferable that the content of the phosphor with the above center particle size is high. It is preferable that its content is 20 to 50%. Employing the phosphor with less variation of the particle size can further reduce variation of the color. Accordingly, the light emitting device with an excellent color tone can be provided.

Since the lutetium-aluminum-garnet group phosphor is efficiently excited by ultraviolet rays or visible light of a wavelength range between 300 nm and 550 nm and emits luminescent radiation, it can be effectively used as the phosphor contained in the light conversion member. In addition, in the case where two or more kinds of LAG group phosphors with different composition formulas are employed, or the LAG group phosphor is employed together with other kind of phosphor, the color of light emission of the light emitting device can be varied. A conventional light emitting device mixes blue range light emitted by a semiconductor light emitting element with yellow range luminescent radiation by a phosphor that absorbs the emitted light, and emits whitish mixed light. Accordingly, since light from the light emitting element partially passes for utilization, this type of apparatuses has advantages that can simplify its structure and easily improves its output. On the other hand, since the above light emitting device emits light consisting of mixed two colors, its color rendering is not sufficient. Therefore, improvement is required. The light emitting device that emits white range mixed light by employing the LAG group phosphor can improve color rendering as compared with such a conventional light emitting device. Additionally, since the LAG group phosphor has excellent temperature characteristics as compared with the YAG group phosphor, it is possible to provide a light emitting device that less deteriorates and has less color difference.

<Nitride Group Phosphor>

The phosphor used in the present invention can be a nitride group phosphor that contains N, at least one element selected from the group consisting of Be, Mg, Ca, Sr, Ba and Zn, and at least one element selected from the group consisting of C, Si, Ge, Sn, Ti, Zr and Hf, and is activated by at least one element selected from the group consisting rare-earth elements. In the present invention, the nitride group phosphor refers to a phosphor that absorbs visible light and ultraviolet rays emitted from an LED chip, and luminescent radiation by the YAG group phosphor, and thus is excited and emits luminescent radiation. For example, the following examples can be given: $Sr_2Si_5N_8$:Eu, Pr; $Ba_2Si_5N_8$:Eu, Pr; $Mg_2Si_5N_8$:Eu, Pr; $Zn_2Si_5N_8$:Eu, Pr; $SrSi_7N_{10}$:Eu, Pr; $BaSi_7N_{10}$:Eu, Ce; $MgSi_7N_{10}$:Eu, Ce; $ZnSi_7N_{10}$:Eu, Ce; $Sr_2Ge_5N_8$:Eu, Ce; $Ba_2Ge_5N_8$:Eu, Pr; $Mg_2Ge_5N_8$:Eu, Pr; $Zn_2Ge_5N_8$:Eu, Pr; $SrGe_7N_{10}$:Eu, Ce; $BaGe_7N_{10}$:Eu, Pr; $MgGe_7N_{10}$:Eu, Pr; $ZnGe_7N_{10}$:Eu, Ce; $Sr_{1.8}Ca_{0.2}Si_5N_8$:Eu, Pr; $Ba_{1.8}Ca_{0.2}Si_5N_8$:Eu, Ce; $Mg_{1.8}Ca_{0.2}Si_5N_8$:Eu, Pr; $Zn_{1.8}Ca_{0.2}Si_5N_8$:Eu, Ce; $Sr_{0.8}Ca_{0.2}Si_7N_{10}$:Eu, La; $Ba_{0.8}Ca_{0.2}Si_7N_{10}$:Eu, La; $Mg_{0.8}Ca_{0.2}Si_7N_{10}$:Eu, Nd; $Zn_{0.8}Ca_{0.2}Si_7N_{10}$:Eu, Nd; $Sr_{0.8}Ca_{0.2}Ge_7N_{10}$:Eu, Tb; $Ba_{0.8}Ca_{0.2}Ge_7N_{10}$:Eu, Tb; $Mg_{0.8}Ca_{0.2}Ge_7N_{10}$:Eu, Pr; $Zn_{0.8}Ca_{0.2}Ge_7N_{10}$:Eu, Pr; $Sr_{0.8}Ca_{0.2}Si_6GeN_{10}$:Eu, Pr; $Ba_{0.8}Ca_{0.2}Si_6GeN_{10}$:Eu, Pr; $Mg_{0.8}Ca_{0.2}Si_6GeN_{10}$:Eu, Y; $Zn_{0.8}Ca_{0.2}Si_6GeN_{10}$:Eu, Y; $Sr_2Si_5N_8$:Pr; $Ba_2Si_5N_8$:Pr; $Sr_2Si_5N_8$:Tb; $BaGe_7N_{10}$:Ce; or the like. However, the present invention is not limited to these examples. It is preferable that at least one element selected from the group consisting of Y, La, Ce, Pr, Nd, Gd, Tb, Dy, Ho, Er, and Lu is included as the rare earth element contained in the nitride phosphor. But, R, Sc, Sm, Tm, or Yb may be included. These rare-earth elements are mixed in the material as single substance, oxide, imide, amide, or other states. When Mn is employed, the particle size can be large. Accordingly, it is possible to improve the luminance.

Particularly, this phosphor can be Mn-added Sr—Ca—Si—N:Eu; Ca—Si—N:Eu; Sr—Si—N:Eu; Sr—Ca—Si—O—N:Eu; Ca—Si—O—N:Eu; and Sr—Si—O—N:Eu group silicon nitride. The basic component elements of this phosphor is represented by general formulas $L_XSi_YN_{(2/3X+4/3Y)}$:Eu or $L_XSi_YO_ZN_{(2/3X+4/3Y-2/3Z)}$:Eu (where L represents Sr, Ca, or Sr and Ca). It is preferable that X and Y in the general formulas are X=2, Y=5, or X=1, Y=7, however, arbitrary values can be used. As concrete basic component elements, it is preferable that fluorescent materials represented in Mn-added $(Sr_XCa_{1-X})_2Si_5N_8$:Eu; $Sr_2Si_5N_8$:Eu; $Ca_2Si_5N_8$:Eu; $Sr_XCa_{1-X}Si_7N_{10}$:Eu; $SrSi_7N_{10}$:Eu; and $CaSi_7N_{10}$:Eu are employed. Here, the fluorescent material may include at least one element selected from the group consisting of Mg, Sr, Ca, Ba, Zn, B, Al, Cu, Mn, Cr, and Ni. L is any element of Sr, Ca, Sr, and Ca. The composition ratio of Sr and Ca can be varied, if desired. Employing Si in composition of the fluorescent material can provide the low cost fluorescent material with preferable crystallinity.

In this phosphor, $Eu^{2+}$ is used as an activation agent for an alkaline-earth-metal group silicon nitride as a base material. Added Mn accelerates diffusion of $Eu^{2+}$, and improves light-emitting efficiency such as light-emission luminance, energy efficiency, or quantum efficiency. Mn is included in the material, or is added in the process as Mn alone or Mn compounds, then is burned with the material.

The phosphor contains at least one element selected from the group consisting of Mg, Ga, In, Li, Na, K, Re, Mo, Fe, Sr, Ca, Ba, Zn, B, Al, Cu, Mn, Cr, O, and Ni in the basic component elements, or together with the basic component elements. These elements have the effect increasing the particle size, or improve light-emitting luminance. In addition, B, Al, Mg, Cr, and Ni have the effect reducing persistence.

This type pf nitride group phosphor absorbs a part of light emitted by the light emitting element, and emits luminescent radiation of a range between yellow and red. The nitride group phosphor is used together with the YAG group phosphor, thus, light emitted by the light emitting element is mixed with luminescent radiation of a range between yellow and red by the nitride group phosphor. Accordingly, a light emitting device that emits warm white range mixed light is provided. It is preferable that the aluminum garnet group phosphor is contained additionally to the nitride phosphor if other phosphor is added thereto. Including the aluminum garnet group phosphor can adjust desired chromaticity. For example, the yttrium aluminum oxide phosphor material activated with cerium can absorb a part of light from the light emitting element, and emit luminescent radiation of yellow range. In this case, white range light can be radiated by mixing light emitted by the light emitting element, and yellow light of the yttrium aluminum oxide phosphor material. Accordingly, in the case where the yttrium aluminum oxide phosphor material is mixed with a phosphor that emits red luminescent radiation in the transparent light conversion member, the mixed luminescent radiation and blue light emitted by the light emitting element or blue light converted by a phosphor are combined, thus, it is possible to a light emitting device that emit white range light. Particularly, it is preferable that a white range light emitting device that has the chromaticity is located on the blackbody line in the chromaticity diagram. In order to provide a light emitting device with a desired color temperature, the amounts of the yttrium aluminum oxide phosphor material and the phosphor that emits red luminescent radiation can be changed if necessary. Particularly, this light emitting device that white range mixed light is aimed at improving the special color rendering index R9. In a conventional white range light emitting device that is composed of the combination of a blue light emitting element and an yttrium aluminum oxide phosphor material activated by cerium, the special color rendering index R9 is nearly zero in the periphery of the color-temperature Tcp=4600 K, and the reddish component is insufficient. Accordingly, there was a problem to be solved that the special color rendering index R9 was improved. On the other hand, in the present invention, the phosphor that emits red luminescent radiation is used together with the yttrium aluminum oxide phosphor material, thus, the special color rendering index R9 can be increased to about 40 in the periphery of the color-temperature Tcp=4600 K.

A process for producing the phosphor $((Sr_XCa_{1-X})_2Si_5N_8$:Eu) according to the present invention is now described as follows. However, the present invention is not limited to this process. The aforementioned phosphor contains Mn, and O.

Although it is preferable to use materials of Sr and Ca as a single material, compounds, such as an imido compound and an amide compound, can be used. The materials of Sr and Ca may contain B, Al, Cu, Mg, Mn, MnO, $Mn_2O_3$, $Al_2O_3$, and so on. The materials of Sr and Ca are pulverized in an argon atmosphere in a glove box. It is preferable that Sr and Ca obtained by pulverization have the average particle size of a range between 0.1 μm and 15 μm, but they are not limited to this range. In order to further improve a mixture state, at least one of metal Ca, metal Sr, and metal Eu may be alloyed. After nitiriding and pulverization, it can be used as a material.

Although it is preferable to use the material of Si as a single material, compounds, such as a nitride compound, an imido compound and an amide compound, can be used. $Si_3N_4$, $Si(NH_2)_2$, $Mg_2Si$, and so on, can be given as the examples. It is preferable that the purity of the material of Sr is 3N or more, but the martial may contain a compound such as $Al_2O_3$, Mg, metal boride ($CO_3B$, $Ni_3B$, and CrB), manganese oxide, $H_3BO_3$, $B_2O_3$, $Cu_2O$, and CuO. Si is pulverized in an argon atmosphere or nitrogen atmosphere, in a glove box, similarly to the materials of Sr and Ca. It is preferable that the average particle size of Si compound is about 0.1 μm to 15 μm.

Subsequently, Sr and Ca are nitrided in a nitrogen atmosphere. As for Sr and Ca, they may be mixed and nitrided, or they may be nitrided separately. Thus, nitrides of Sr and Ca can be obtained. In addition, the material Si is nitrided in a nitrogen atmosphere. Thus, silicon nitride can be obtained.

The nitride of Sr, Ca, or Sr—Ca is pulverized. The nitride of Sr and Ca, or Sr—Ca nitride is pulverized in an argon atmosphere or a nitrogen atmosphere, in a glove box. The nitride of Si is pulverized similarly. In addition, the compound of Eu, $Eu_2O_3$ is also pulverized similarly. The europium oxide is employed as the compound of Eu, however metal europium, an europium nitride, or the like, can be employed. Additionally, an imide compound, an amide compound, or the like, can be employed as the material of Z. It is preferable that the europium oxide has high purity. However, a europium oxide available on the market also can be employed. It is preferable the nitride of alkaline earth metal, the silicon nitride, and the europium oxide have the average particle size about 0.1 μm to 15 μm, after pulverization.

The above materials may contain at least one element selected the group consisting of Mg, Sr, Ca, Ba, Zn, B, Al, Cu, Mn, Cr, O, and Ni. In addition, an adjusted content of the above element such as Mg, Zn, and B may be mixed in the following processes. These elements can be added as single materials to the material, but they are normally added in a compound form. $H_3BO_3$, $Cu_2O_3$, $MgCl_2$, $MgO.CaO$, $Al_2O_3$, metal boride (CrB, $Mg_3B_2$, $AlB_2$, and MnB), $B_2O_3$, $Cu_2O$, and CuO can be given as examples of the this type of compound.

After the above pulverization, the nitride of Sr, Ca, and Sr—Cr, the nitride of Si, and the compound of Eu, $Eu_2O_3$ are mixed, and then Mn is added thereto. Since the mixture of them tends to be oxidized, they are mixed in an Ar atmosphere or a nitrogen atmosphere in a glove box.

Finally, the mixture of the nitride of Sr, Ca, and Sr—Cr, the nitride of Si, and the compound of Eu, $Eu_2O_3$ is burned in an ammonia atmosphere. Burning them can provide the phosphor represented by the formula $(Sr_xCa_{1-x})_2Si_5N_8$:Eu with Mn added thereto. In addition, the composition ratio of materials can be changed so as to obtain composition of a target phosphor.

A tubular furnace, a small furnace, a high-frequency furnace, a metal furnace, and so on, can be used for burning. The burning is performed at burning temperature in the range 1200 to 1700° C., however it is preferable that the burning temperature is 1400 to 1700° C. It is preferable to use single-stage burning where burning is performed while gradually increasing the temperature from 1200 to 1500° C. for several hours. However, two-stage burning (multi-stage burning) may be used. In the two-stage burning, burning in a first stage is performed from 800 to 1000° C., and burning in a second stage is performed while gradually increasing the temperature from 1200 to 1500° C. It is preferable that the materials of the phosphor are burned in a crucible or a boat of boron nitride (BN) material. Instead of the crucible of a boron nitride material, a crucible of alumina ($Al_2O_3$) also can be used.

The target phosphor can be obtained by the aforementioned producing method. In the embodiment of the present invention, the nitride group phosphor is particularly used as the phosphor that emits reddish luminescent radiation. However, in this embodiment of the present invention, the light-emitting apparatus can have the above YAG group phosphor and the phosphor capable emitting red range luminescent radiation. This type of phosphor capable of emitting red group luminescent radiation is a phosphor that is excited by the light with a wavelength 400 to 600 nm and emits luminescent radiation. For example, $Y_2O_2S$:Eu, $La_2O_2S$:Eu, CaS:Eu, SrS:Eu, ZnS:Mn, ZnCdS:Ag, Al, ZnCdS:Cu, Al, and so on, can be given as examples of the phosphor. Using the phosphor capable of emitting red range luminescent radiation together with the YAG group phosphor can improve the color rendering of light emitting device.

As for the aluminum garnet group phosphor, and the phosphor capable of emitting luminescent radiation of red group light, typically such as a nitride group phosphor, that are formed as mentioned above, a light conversion member consisting of one layer in the periphery of the light emitting element may includes two or more kinds of the phosphors, or a light conversion member consisting of two layers may include one or two kind(s) in each layer. In this construction, mixed light can be obtained by color mixture of light from different kinds of phosphors. In this case, in order to provide more preferable color mixture of light emitted from each phosphor material, and to reduce color unevenness, it is preferable that the respective average particle sizes and shapes of phosphors are similar. In consideration that the nitride group phosphor absorbs a part of light with a wavelength converted by the YAG phosphor, the light conversion member is preferably formed such that the nitride group phosphor is located in a position closer to the light emitting element relative to the YAG phosphor. In this construction, the nitride group phosphor does not absorb a part of light with a wavelength converted by the YAG phosphor. Accordingly, it is possible to improve the color rendering of mixed light as compared with the case where the YAG group phosphor and the nitride group phosphor are mixed and contained.

<Oxynitride Group Phosphor>

An oxynitride phosphor represented by the following general formula can be contained additionally to the aforementioned phosphor materials if other phosphor is added to the phosphor material according to the present invention.

$$L_xM_yO_zN_{((2/3)x+(4/3)y-(2/3)z)}:R$$

where L represents at least one element selected from the group consisting of Be, Mg, Ca, Sr, Ba and Zn, and M represents at least one element selected from the group consisting of C, Si, Ge, Sn, Ti, Zr and Hf. In addition, N is nitrogen, O is oxygen, and R is a rare earth element. x, y and z satisfy the following values.

x=2, 4.5≦y≦6 and 0.01≦z≦1.5,
or x=1, 6.5≦y≦7.5 and 0.01≦z≦1.5,
or x=1, 1.5≦y≦2.5 and 1.5≦z≦2.5

A producing method of the oxynitride phosphor is now described. However, needless to say, the present invention is not limited to this producing method. First, nitride of L, nitride and oxide of M, and oxide of rare earth element are mixed as a material so as to achieve a prescribed composition ratio. The composition ratio of materials can be changed so as to obtain composition of a target phosphor.

Subsequently, the aforementioned material of mixture is placed in a crucible, and is burned. A tubular furnace, a small furnace, a high-frequency furnace, a metal furnace, and so on, can be used for burning. The burning is performed at burning temperature in the range 1200 to 1700° C., however it is preferable that the burning temperature is 1400 to 1700° C. However, the burning temperature is not limited to these ranges. It is preferable that the materials of the phosphor are burned in a crucible or a boat of boron nitride (BN) material. Instead of the crucible of a boron nitride material, a crucible of alumina ($Al_2O_3$) also can be used. In addition, the burning is performed preferably in a reducing atmosphere. A nitrogen atmosphere, a nitrogen-hydrogen atmosphere, an ammonia atmosphere, and an inert gas atmosphere such as argon can be given as examples of the reducing atmosphere. The target oxynitride phosphor can be obtained by the aforementioned producing method.

<Alkaline-Earth Metal Silicate Phosphor>

The light emitting device according to this embodiment can include an alkaline-earth metal silicate phosphor activated by europium as a phosphor that absorbs a part of light emitted by the light emitting element and emits luminescent radiation of wavelength different from the absorbed light. In the case where the light emitting device includes the alkaline-earth metal silicate phosphor, the light emitting device can emit warm mixed light by using light of the blue range as excitation light. It is preferable that the alkaline-earth metal silicate phosphor is an alkaline-earth metal orthosilicate phosphor represented by the following general formula.

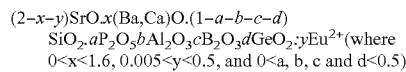

$(2-x-y)SrO \cdot x(Ba,Ca)O \cdot (1-a-b-c-d)$
$SiO_2 \cdot aP_2O_5 bAl_2O_3 cB_2O_3 dGeO_2 : yEu^{2+}$ (where $0 < x < 1.6$, $0.005 < y < 0.5$, and $0 < a, b, c$ and $d < 0.5$)

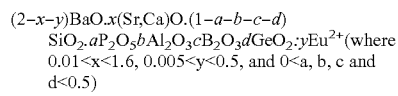

$(2-x-y)BaO \cdot x(Sr,Ca)O \cdot (1-a-b-c-d)$
$SiO_2 \cdot aP_2O_5 bAl_2O_3 cB_2O_3 dGeO_2 : yEu^{2+}$ (where $0.01 < x < 1.6$, $0.005 < y < 0.5$, and $0 < a, b, c$ and $d < 0.5$)

In this case, it is preferable that at least one of the values a, b, c and d is more than 0.01.

The light emitting device according to the present invention can include an alkaline-earth metal aluminate phosphor activated by europium and/or manganese, $Y(V, P, Si)O_4:Eu$, and an alkaline-earth metal-magnesium-disilicate phosphor represented by the following formula as a phosphor of alkali-earth metal salt phosphor in addition to the aforementioned alkaline-earth metal silicate phosphor.

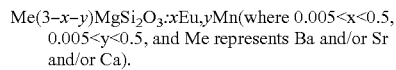

$Me(3-x-y)MgSi_2O_8:xEu,yMn$ (where $0.005 < x < 0.5$, $0.005 < y < 0.5$, and Me represents Ba and/or Sr and/or Ca).

A producing method of the phosphor of alkaline-earth metal silicate phosphor according to this embodiment is now described.

In production of the alkaline-earth metal silicate phosphor, depending on a selected composition, stoichiometric amounts of alkaline-earth metal carbonate, silicon dioxide and europium oxide are tightly mixed, and they are converted into a desired phosphor at temperatures of 1100° C. and 1400° C. in a reducing atmosphere by solid reaction typically used in production of a phosphor. In this case, less than 0.2 mol of ammonium chloride or other chloride is preferably added. In addition, germanium, boron, aluminum, and phosphorus can be substituted for a part of silicon, or manganese can be substituted for a part of europium, if necessary.

The aforementioned phosphors, that is, one or combination of an alkaline-earth metal aluminate phosphor activated by europium and/or manganese, $Y(V, P, Si)O_4:Eu$, and $Y_2O_2S:$ $Eu^{3+}$ can achieve light-emission color of a desired color temperature and high color reproduction characteristics.

<Other Phosphor>

In this embodiment, a phosphor that is excited by light from ultraviolet to visible range and emits luminescent radiation can be used. Specifically, the following phosphors can be given as examples of the phosphor.

(1) an alkaline-earth halogen apatite phosphor activated by Eu, Mn, or Eu and Mn, for example, $M_5(PO_4)_3(Cl, Br):Eu$ (where M represents at least one element selected from the group consisting of Sr, Ca, Ba, and Mg), and $Ca_{10}(PO_4)_6ClBr:Mn, Eu$, and so on (2) an alkaline-earth metal aluminate phosphor activated by Eu, Mn, or Eu and Mn, for example, $BaMg_2Al_{16}O_{27}:Eu$; $BaMg_2Al_{16}O_{27}:Eu, Mn$; $Sr_4Al_{14}O_{25}:Eu$; $SrAl_2O_4:Eu$; $CaAl_2O_4:Eu$; $BaMgAl_{10}O_{17}:Eu$; $BaMgAl_{10}O_{17}:Eu, Mn$; and so on (3) an rare-earth oxide sulfide activated by Eu, for example, $La_2O_2S:Eu$, $Y_2O_2S:Eu$, $Gd_2O_2S:Eu$, and so on (4) $(Zn, Cd)S:Cu$; $Zn_2GeO_4:Mn$; $3.5MgO \cdot 0.5MgF_2 \cdot GeO_2:Mn$; $Mg_6As_2O_{11}:Mn$; $(Mg, Ca, Sr, Ba)Ga_2S_4:Eu$; $Ca_{10}(PO_4)_6FCl:Sb, Mn$ (Diffusion Agent)

The light conversion member according to this embodiment may contain a diffusion agent in addition to the aforementioned phosphor material. Furthermore, a transparent dissipation member or a later-described transparent member 303 may contain a diffusion agent. Specifically, barium titanate, titanium oxide, aluminum oxide, silicon oxide, and mixture of them can be preferably used as the diffusion agents. In this case, it is possible to provide a light emitting device with excellent characteristics of directivity.

In this specification, the diffusion agent refers to a material that has a center particle size not less than 1 nm to less than 5 μm. The diffusion agent of not less than 1 nm to less than 5 μm scatters light from the phosphor material, and thus suppresses color unevenness that tends to appear in the case where a phosphor material with a large particle size. For this reason, this type of diffusion agent is preferably used. A diffusion agent of not less than 1 nm to less than 1 μm has a small interference effect on the wavelength of light from the light emitting element, but hand can increase viscosity of resin without reduction of luminous intensity. Accordingly, in the case where resin containing the phosphor material and so on is dropped on a target location to form the light conversion member, the phosphor material can be uniformly dispersed in the resin within a syringe, and kept in this state. Therefore, even in the case where a phosphor material with a large particle size that is relatively difficult for handling, it is possible to produce the light conversion member at high yield. As mentioned above, diffusion agents has different effects depending on their particle size range, thus, diffusion agents are used by selecting or combining them depending on the purpose of use.

(Filler)

The light conversion member according to this embodiment may contain filler in addition to the phosphor material. Furthermore, the transparent dissipation member or the transparent member 303 may contain filler. In this case, it is possible to improve thermal shock resistance and heat dissipation characteristics of the members.

In this specification, specifically, the filler is formed of a material similar to the diffusion agent, but has a center particle size dissimilar to the diffusion agent. The filler refers to a material that has a center particle size not less than 5 μm to not more than 100 μm. In the case where a transparent resin that is a material of the light conversion member contains the filler with a particle size of this range, not only chromaticity unevenness of the light emitting device is improved by light dispersion, but also heat conductivity characteristics and thermal shock resistance of the transparent resin are improved. Accordingly, in the case where the light conversion member contains the filler in addition to the phosphor material, it is possible to improve heat dissipation characteristics of the light conversion member. Additionally, the transparent resin can be adjusted so as to have constant flowability for a long time, and the light conversion member can be formed in a desired location. Accordingly, it is possible to mass-produce the light emitting device at high yield. It is preferable that mixture ratio of the phosphor material, the filler, and resin as the binding agent is suitably adjusted to improve thermal shock resistance and heat dissipation characteristics of the light conversion member.

The filler preferably has a particle size and/or a shape similar to the phosphor material. In this specification, the similar particle size refers to a center particle with difference of less than 20% between particles. The similar shape refers a shape having a degree of circularity ((a degree of circularity)=(the perimeter of a perfect circle that has an area equal to a projected area of a particle) divided by (the perimeter of a projected shape of the particle)) representing a degree of similarity to a perfect circle with difference of less than 20% between particles. In the case where the filler is used, the filler interacts with the phosphor material, thus, it is possible to disperse the phosphor material well in resin and to suppress color unevenness.

For example, the phosphor material and the filler can have a center particle of 15 μm to 50 μm, preferably 20 μm to 50 μm. This adjustment of particle size can space particles at preferable interval between them. Accordingly, light-outgoing paths can be adequately provided. Therefore, it is possible to suppress reduction of luminous intensity due to mixture of filler, and to improve directivity characteristics.

Second Embodiment

A light emitting device according to a second embodiment has a heat dissipation member having a flow path of a refrigerant includes a first heat dissipation member that has a first flow path in a side where the light emitting element is mounted, and a second heat dissipation member that has a second flow path in a side where light from the light emitting element is incident. The second heat dissipation member includes the light conversion member, in the construction of the light emitting device according to the first embodiment. That is, the light emitting device according to the present invention comprises a water-cooling heat dissipation member that suppress heat conducted from the light emitting device, and the light conversion member containing the phosphor that is provided thereon. Accordingly, since self-heat generation of the phosphor can be suppressed, and deterioration of the phosphor can be prevented, the output of light emitting device does not deteriorate. Therefore, high power light, for example white group light, can be emitted. The other construction is similar to the first embodiment.

Specifically, the light emitting device according to this embodiment has the first heat dissipation member that aids heat dissipation from the light emitting element, and the second heat dissipation member that aids heat dissipation from the light conversion member. The light conversion member is provided in a region where light from the light emitting element is incident in the second heat dissipation member. The second heat dissipation member has the second flow path in a side where the light conversion member that is provided. The second flow path includes the refrigerant that aids heat dissipation from the light conversion member. Accordingly, self-heat generation of the phosphor that is exposed to high power and high energy excitation light can be suppressed. The first heat dissipation member has a flow path of the refrigerant similarly to the second heat dissipation member whereby aiding heat dissipation from the light emitting element that emits high power light. Accordingly, heat dissipation characteristics are improved in terms of the whole light emitting device. Therefore it is possible to provide a light emitting device that radiates high power light.

In addition, the flow path in the heat dissipation member according to this embodiment preferably includes a third flow path that connects the first flow path to the second flow path. The light emitting device has a pair of inlet and outlet commonly for first and second flow paths, thus, the light emitting element and the light conversion member can be cooled by a single system. Accordingly, the light emitting device can be small as compared with the case where a light emitting element and a light conversion member are cooled by separated systems. In addition, it is possible to simplify a cooling mechanism of the light emitting device.

The light emitting device according to this embodiment has the first heat dissipation member that has the first flow path of the refrigerant in a side where the light emitting element is mounted, an electrically insulating member, a supporting substrate, and the second heat dissipation member that has the second flow path of the refrigerant in a side where the light conversion member is provided, which are at least laminated. In this construction, it is possible to easily provide the light emitting device according to the present invention.

The inlet or the outlet is formed in the heat dissipation member. The insulating member and the supporting substrate have a through hole that partially forms the third flow path. Accordingly, the refrigerant liquid can be admitted to and ejected from a side where the light emitting device is mounted. Therefore, a device for supplying the refrigerant to the light emitting device, or the like, does not affect optical characteristics of the light emitting device.

A conductive member that contains at least one element selected the group consisting of Au, Ag, and Al is coated on at least one of main surfaces of the insulating member. In addition, one electrode of the light emitting element is electrically connected to the conductive member that is coated on the at least one of main surfaces of the insulating member via a conductive wire and the conductive member, another electrode is electrically connected to the first heat dissipation member. That is, the supporting substrate and the first heat dissipation member have polarities different from each other. A pair of positive and negative electrodes of the light emitting element are electrically connected to the supporting substrate and the first heat dissipation member. In this construction, it is possible to easily supply electric power to the light emitting element. The components according to this embodiment will be described.

The components of the light emitting device according to the second embodiment are now described.

(Heat Dissipation Member)

The heat dissipation member in the light emitting device according to this embodiment has at least the first heat dissipation member that has the first flow path in a side where the light emitting element is mounted, and the second heat dissipation member that has the second flow path in a side where light from the light emitting element is incident. The light emitting element according to this embodiment is mounted on the first heat dissipation portion. However, needless to say, the present invention is not limited to this arrangement. For example, other member with high heat conductivity, specifically a submount where the light emitting element is mounted in a flip chip mounting manner may be provided between the light emitting element and the first heat dissipation member as an auxiliary element. Hereinafter, the first heat dissipation member and the second heat dissipation member are described in more detail.

The first heat dissipation member according to this embodiment refers to a member that has the flow path for cooling the light emitting element, is provided with the light emitting element directly or through a conductive adhesive agent thereon, and conducts heat generated from the light emitting element externally of the light emitting device. In addition, the second heat dissipation member according to this embodiment refers to a member that has the flow path for cooling the phosphor, is provided with the light conversion member containing the phosphor thereon, and conducts heat generated from the phosphor externally of the light conversion member. In this case, the second heat dissipation member is formed of a material that can pass at least light from the light emitting element, or a material that can pass light from both the light emitting element and the light conversion member. Thus, the light conversion member is provided on at least one of a main surface in a side where light is observed on the second heat dissipation member, and a main surface in a side where light from the light emitting element is incident. Although the light conversion member is connected directly to the second heat dissipation member, the light conversion member is not limited to this form. Needless to say, the light conversion member may be mounted to the second heat dissipation member so as to sandwich a transparent member other than them between them. In addition, the shape of the light conversion member in a side where light is observed can have a lens shape in consideration of the optical characteristics of light from the light emitting device. The heat dissipation member may have a transparent part that contains the phosphor to serve as the light conversion member. Moreover, the flow path of the refrigerant for cooling the phosphor may be formed inside the light conversion member.

Figure 7:
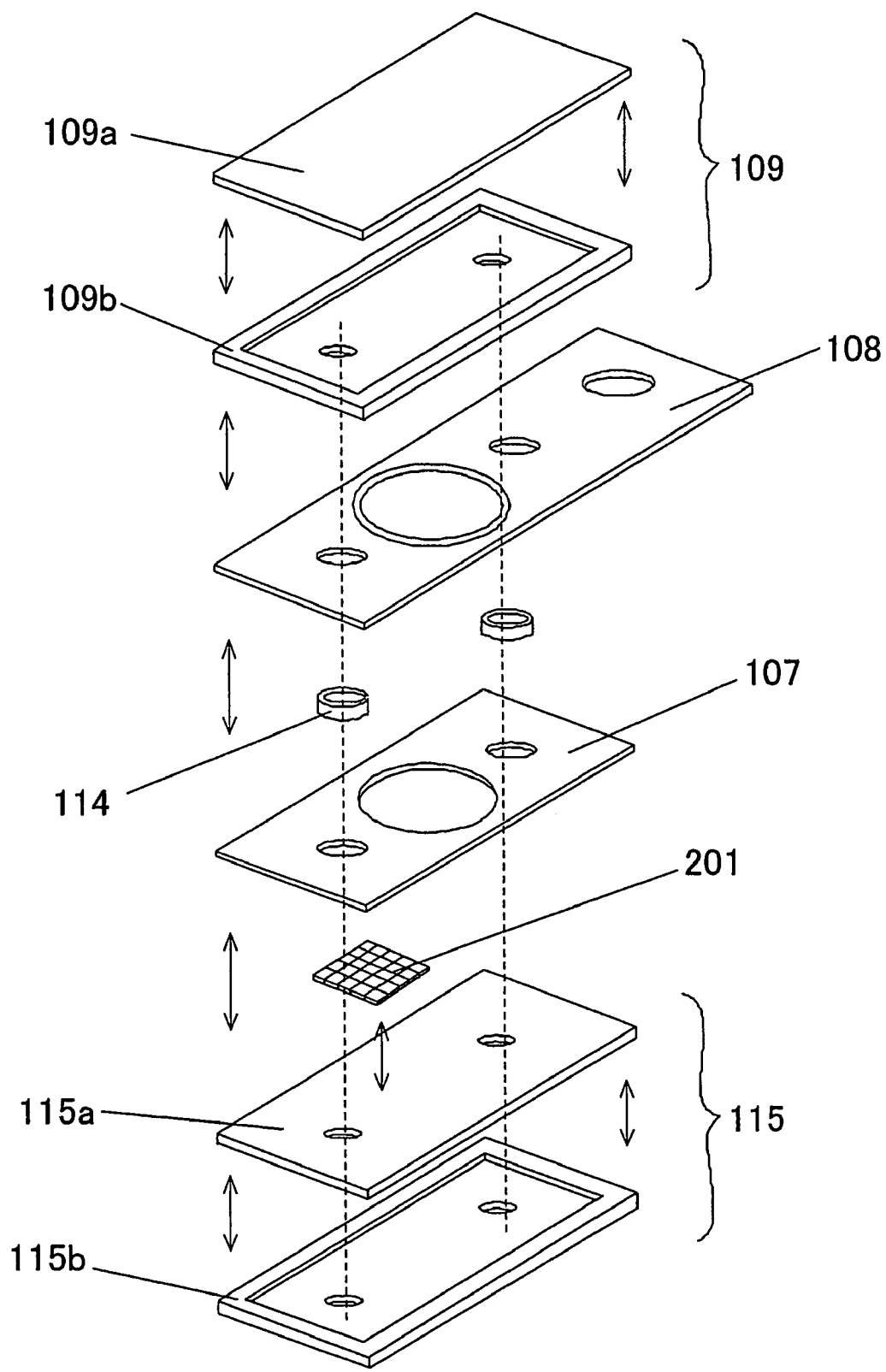
FIG. 7 is a perspective view schematically showing components of a light emitting device according to one embodiment of the present invention.
Figure 10:
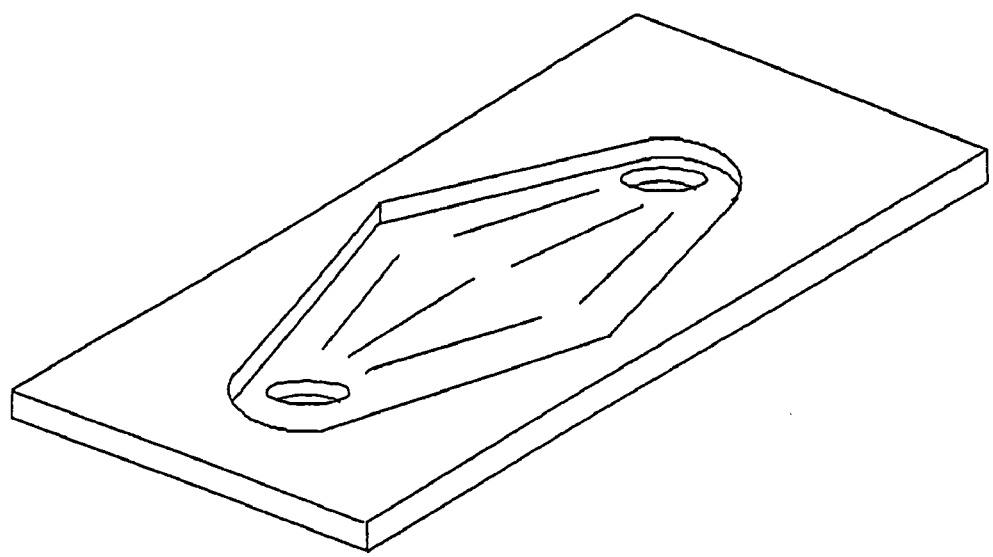
FIG. 10 is a perspective view schematically showing a component according to one embodiment of the present invention.

In this embodiment, the flow path of the refrigerant is applicable to a path closed or opened externally of the light emitting device. As one example of the heat dissipation member having an opened flow path, the heat dissipation member can have a flat plate that is made of a metal, such as copper and aluminum, and is provided with a flow path for passing the refrigerant therethrough. In the case where the heat dissipation member has a transparent part as the second heat dissipation member, a transparent resin, a quartz material, or the like, is selected as a material of the transparent part. In addition, in order to circulate the refrigerant through the heat dissipation, the heat dissipation member has at least one pair of an inlet and an outlet on its outer wall surface. As shown in FIG. 7, each of heat dissipation members 115 and 109 can have a plurality of plate-shaped members at least one of which has a groove or asperities, and through holes as the inlet and outlet. For example, the heat dissipation members have second plate-shaped members 115b and 109b that have grooves or recessed shapes and through holes as the inlets and outlets, and first plate-shaped members 115a and 109a. Surfaces of the first plate-shaped members 115a and 109a and second plate-shaped members 115b and 109b that are opposed to each other are bonded, thus, the flow path of the heat dissipation member can be formed. Needless to say, in this embodiment, the shape of the heat dissipation is not limited to the illustrated shape in FIG. 7. In the first plate-shaped members 115b and 109b as portions of the heat dissipation member, for example, a recessed portion is formed so as to be gradually wider and then narrower from the location where one of openings (inlet or outlet) is formed to other opening as shown in FIG. 10. This allows the refrigerant to smoothly circulate through the flow path. Additionally, it is preferable that small grooves or asperities are formed on an inner wall surface of the recessed portion. This increases the contact area between the refrigerant and the heat dissipation member, and thus can improve a heat dissipation effect for the light emitting device.

As one example of the heat dissipation member having a closed flow path, the heat dissipation member can have a heat pipe that is made of a metal, such as copper and aluminum, and is provided with the refrigerant sealed therein. Particularly, in another embodiment, a heat pipe is a metal tube that is made of a metal, such as copper and aluminum, in which a hydraulic fluid for conveying heat, such as water, CFCs, alternative CFCs and Fluorinert, is sealed, for example. In this case, the hydraulic fluid is heated and evaporated in a heat input part (high temperature part), and the evaporated liquid moves and then liquefied in a heat dissipation part (lower temperature side). The liquefied hydraulic fluid is moved back to the heat input portion by capillary phenomenon, thus this cycle is repeated. Accordingly, a heat conveying member with high heat conductivity can be provided.

Figure 9:
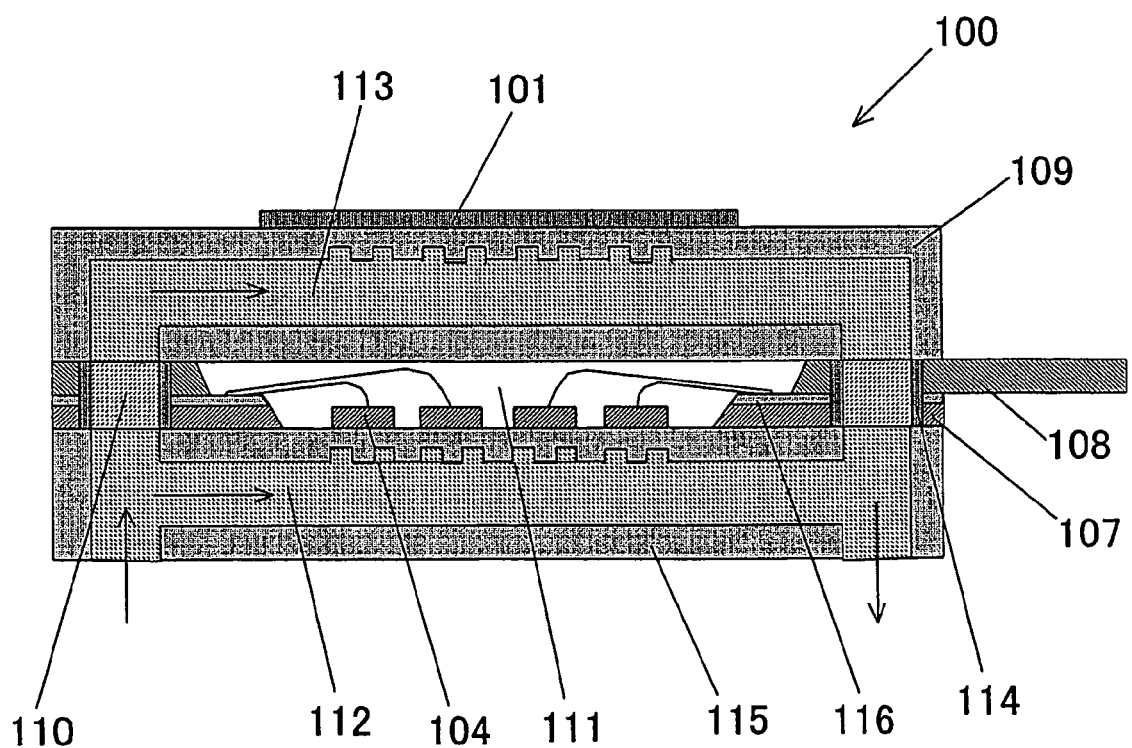
FIG. 9 is a cross-sectional view schematically showing a light emitting device according to one embodiment of the present invention.

The heat dissipation member can have various types of shapes and sizes in consideration of a heat dissipation direction and a heat dissipation effect. For example, asperities are formed on the inner wall surface of the first flow path that is opposed to a backside surface of the light emitting element as shown in FIG. 9. This increases the contact area between the aforementioned inner wall surface and the refrigerant as compared with the case where asperities are not formed, and thus can improve the heat dissipation characteristics from the light emitting element. In addition, asperities are formed on the inner wall surface of the second flow path that is opposed to the light conversion member. This increases the contact area between the aforementioned inner wall surface and the refrigerant as compared with the case where asperities are not formed, and thus can improve the heat dissipation characteristics from the light conversion material. In the light emitting device has the third flow path connecting the first flow path to the second flow path such that the first and second flow paths extending in parallel, the inner wall surfaces of the first and second flow paths preferably have the same shape. In this case, the pressure of the refrigerant can be uniform inside the light emitting device. Therefore, it is possible to provide a high reliable light emitting device.

In the first heat dissipation member formed in a plate shape, it is preferable that the minimum distance d (mm) between its surface on which the light emitting element is mounted and the inner wall surface of the first flow path satisfies the following Equation.

$$0.05 < d < (C/800) \qquad \text{(Equation 1)}$$

where C is the thermal conductivity in W/mK of a plate-shaped member that composes the heat dissipation member.

For example, in the case where the first heat dissipation member is formed of oxygen-free copper, it is preferable that d (mm) is set within the following range.

$$0.05 < d < 0.5 \qquad \text{(Equation 2)}$$

Additionally, in the case where the first heat dissipation member is formed of ceramics, such as alumina and aluminum nitride, it is preferable that d (mm) is set within the following range.

$$0.05 < d < 0.25 \quad \text{(Equation 3)}$$

If the value of d is lager than the upper limit, the thermal resistance of the heat dissipation member becomes too large. In this case, thermal interference between the light emitting elements adjacent to each other becomes remarkable. Accordingly, the light emitting elements cannot be mounted at high density. If the value of d is smaller than the lower limit, the plate-shaped member cannot be easily processed.

(Supporting Substrate)

The supporting substrate refers to a member that supplies electric power to the light emitting element, and serves as a support member for supporting other components to achieve sufficient mechanical strength of the light emitting device. The supporting substrate can have various sizes in consideration of heat dissipation characteristics, the output of light emitting device and so on, and have various shapes in consideration of the shape of light emitting device. In addition, in order to control distribution of light, a reflector may be provided on a part of the supporting substrate.

Figure 6:
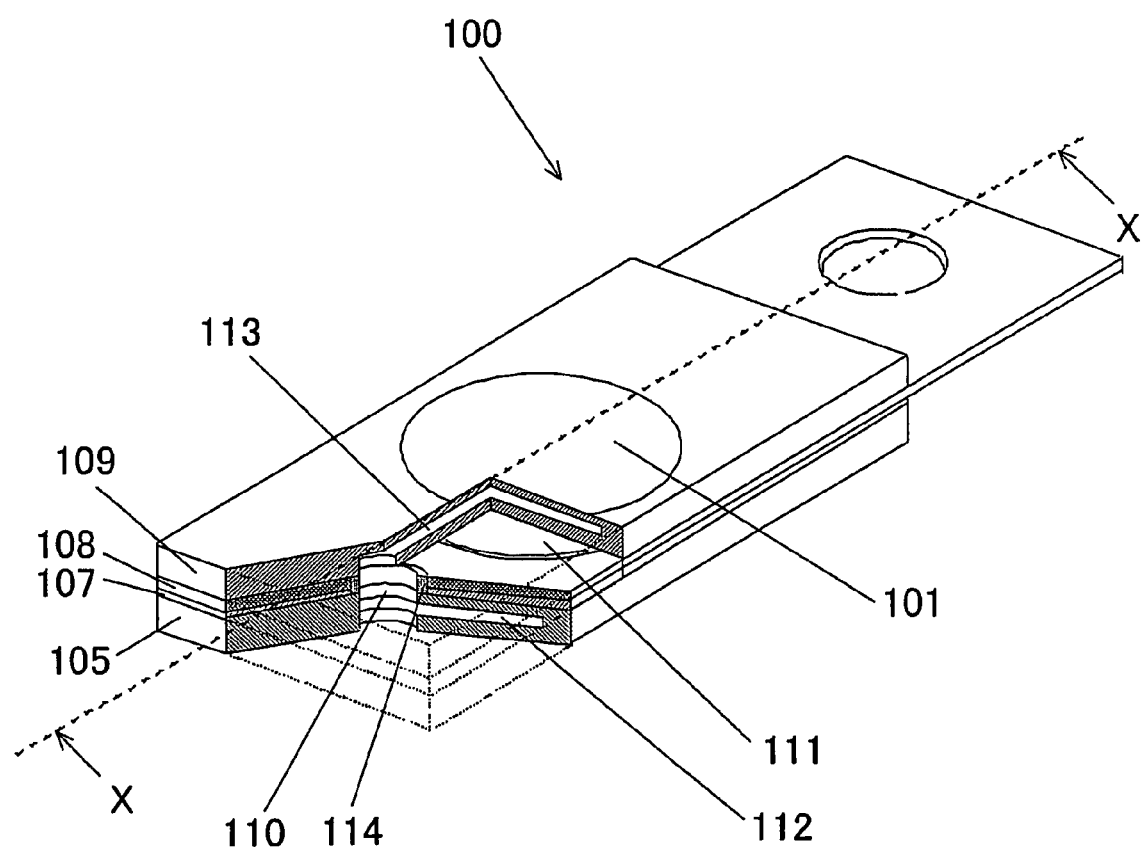
FIG. 6 is a schematic perspective view of a light emitting device according to one embodiment of the present invention, with parts of the light emitting device is broken away for the purpose of illustration.

The supporting substrate can have an extended portion that extends externally of the light emitting device as shown in FIG. 6. The extended portion can be provided with a through hole for securing the light emitting device 100 to an external mount substrate, or a refrigerant supply device such as a water stream pump, for example. In addition, as shown in FIG. 7, the supporting substrate may have a tapered through hole with inclined walls that reflect light from the light emitting element in the direction where the light is observed. The inner walls of the through hole are opposed to the light emitting element mounted in the first heat dissipation member. In addition, a reflector layer may be formed on the inclined walls for excellent reflection of the light from the light emitting element. In order to efficiently dissipate heat conducted from the light emitting element toward the heat dissipation member side, the supporting substrate preferably has high heat conductivity. Ceramics, copper, aluminum, and a phosphor bronze plate can be given to employ each of them alone as examples of materials with high heat conductivity. In addition, it is preferably used with silver or palladium that is coated on its surface, or with metal plating such as silver and gold, solder plating or the like that is performed on its surface.

(Insulating Member)

The insulating member according to this embodiment refers to a member that is provided between the first heat dissipation member and the supporting substrate so as to insulate them from each other. The insulating member is provided with metal, such as Au, Ag and Al, coated on its surface(s) that is/are opposed to the conductive supporting substrate and/or the first heat dissipation member. Wiring for supplying electric power to the light emitting element is configured of the metal coated on the surface that is opposed to the supporting substrate. The metal coated on the surface that is opposed to the first heat dissipation member becomes a layer that bonds the first heat dissipation member and the insulating member together.

The insulating member has a shape corresponding to the first heat dissipation member and the supporting substrate, for example, a plate shape as shown in FIGS. 6 and 7. The insulating member is made of an electrically insulating material, such as resin, alumina, and aluminum nitride. It is preferable that metal containing at least one element selected from the group consisting of Au, Ag and Al is formed on at least one of surfaces of the insulating member that are opposed to the first heat dissipation member and the supporting substrate. Accordingly, it is possible to easily provide electrical connection to the light emitting element. Alternatively, wiring can be performed to bond a wire for supplying electric power to the light emitting element. In addition, as shown in FIG. 7, the supporting substrate may have a tapered through hole. Inner walls of the through hole are opposed to the light emitting element mounted in the first heat dissipation member. In addition, a reflector layer may be formed on the inclined walls for excellent reflection of the light from the light emitting element. A pair of through holes corresponding to the openings that communicate with the flow path of the heat dissipation portion can be formed on the aforementioned supporting substrate and insulating member so as to form the third flow path. In addition, O-rings are preferably provided in respective parts of the through holes where the first, second and third flow paths are connected to each other in order to prevent leakage of the refrigerant. The O-rings are preferably made of a material such as silicone resin.

Third Embodiment

A light emitting device of a third embodiment of the present invention comprises a heat dissipation member that is formed of two plate-shaped members that form a flow path for flowing cooling fluid between them, and a plurality of light emitting elements that are mounted to be two-dimensionally arranged on a main surface of the heat dissipation member, wherein a plurality of protruding portions are formed in the surface of the plate-shaped member inside the flow path, and at least some of the plurality of protruding portions are formed such that their centers are located between the light emitting elements and a substantially central part of the light emitting element. The other construction is similar to the first embodiment unless otherwise noted.

A heat dissipation member according to the third embodiment is now described.

(Heat Dissipation Member)

The heat dissipation member (hereinafter, occasionally referred to as a "heat sink") according to the present invention is a heat sink comprising a laminated-plate-shaped member that has a first plate-shaped member with a first surface thermally connected to a heat generating element and a second plate-shaped member connected to a second surface of the first plate-shaped member, and is provided with an inlet for admission of a fluid and an outlet communicating with the inlet for ejection of the fluid, wherein asperities are formed on the second surface of the first plate-shaped member.

Since the asperities are formed on the second surface of the first plate-shaped member, it is possible to increase the surface area where the fluid flows in the same region. That is, protruding parts of the asperities that are formed on the second surface of the first plate-shaped member play a role like a heat dissipation fin. Since the fluid flows in a surface with stepped parts, it flows not only straightly but variably in its flowing direction and flowing velocity. Accordingly, it is possible to efficiently cool heat from the heat generating element. In addition, even in the case where the diameter of the inlet is small in order to make the heat sink thin or small, the light emitting device has a sufficient cooling effect.

In this case, the connection between the first plate-shaped member and the heat generating element is not limited to direct contact between them, but includes thermal connection between them. In other words, the construction is not limited as long as a thermal conductive path is formed between the first plate-shaped member and the heat generating element. For example, one layer of or a plurality of layers of a eutectic material may be interposed between them. The fluid refers to a cooling medium such as pure water and low melting-point liquid.

In the heat sink according to the present invention, the asperities are preferably formed in a region that is opposed to a connection region of the heat generating element. In this case, it is possible to increase a heat dissipation area in contact with the fluid to twice or more, and to reduce heat density (density of heat flow) in the second surface. Accordingly, efficient cooling can be achieved.

In the heat sink according to the present invention, the asperities that are formed on the second surface of the first plate-shaped member preferably have the height of the stepped part of not less than 10 μm to not more than 500 μm. The asperity arrangement is formed together with formation of water path on the plate-shaped member by chemical etching, and so on. Its height is preferably set to not less than 10 μm in terms of precision of processing. In addition, since the flow amount depends on the amount of cut-away part by etching, if the above range exceeds 500 μm, a fluid that does not serve for cooling exists. Additionally, in this case, since an excess fluid is circulated, this causes over pressure, and less efficiency. For this reason, the height is preferably set to not more than 500 μm.

The asperities more preferably have the height of the stepped part of not less than 100 μm to not more than 300 μm. In the case where the height of the stepped part is set to the above range, it is possible to more efficiently cool the heat sink.

Furthermore, the heat sink according to the present invention is a heat sink comprising a laminated-plate-shaped member that has the first plate-shaped member with the first surface thermally connected to the heat generating element and the second plate-shaped member connected to the second surface of the first plate-shaped member, and is provided with the inlet for admission of the fluid and the outlet communicating with the inlet for ejection of the fluid, wherein the first plate-shaped member has a surface area (b) of the second surface that is opposed to a contact region of the heat generating element is larger than a contact area (a) of the heat generating element in the first surface. The inventors observed, in thermal conduction where heat is dissipated from the heat surface, the temperature distribution of thermal conduction of heat that is dissipated from the heat generating element was conveyed in the heat sink toward the second surface of the first plate-shaped member while spreading at 45° relative to the thickness direction. For this reason, in the case where surface emission type light emitting devices, and so on, as the heat generating elements are mounted at high density, heat generated by the heat generating elements adjacent to each other is overlapped during conveyed in the thickness direction. This causes thermal interference and a large amount of heat is locally produced. As a result, in the case where surface emission type light emitting devices, and so on, as the heat generating elements are mounted at high density, available electric power applied to each of the surface emission type light emitting devices is limited to low power. However, according to the present invention, in the case where semiconductor devices are mounted at high density as mentioned above, the heat dissipation surface of the aforementioned construction is provided, it is possible to remarkably increase available electric power applied thereto. The applied electric power refers to the product of a current and a voltage that are applied the semiconductor devices such as surface emission type light emitting devices. The heat density refers to a value obtained by dividing the applied electric power by a projected area of the device. According to the present invention, for example, 2 W/mm or more of applied electric power is available. In addition, high-density mount refers to a mount form where three or more of heat generating elements are mounted such that the heat generating elements are spaced from each other at an interval smaller than the width of the heat generating element.

In the heat sink according to the present invention, it is preferable that the ratio between the contact area (a) of the heat generating element in the first surface and the surface area (b) of the second surface that is opposed to the contact region of the heat generating element is 0.2≦(a/b)<1. It is more preferable that the above range is 0.2≦(a/b)<0.5. If the surface area (b) of the second surface is five times or more the contact area (a) of the heat generating element in the first surface, considerable precision of processing is required. In the case of the above range, it is possible to further improve cooling efficiency.

It is preferable that the first surface of the first plate-shaped member is connected to the heat generating element so as to sandwich a eutectic material between them. In this case, it is possible to attach the heat generating element to the plate-shaped member at a low temperature without thermal damage to the heat generating element. In addition, it is possible to remain micromachining on the plate-shaped member, to make the light emitting device thin additionally to suppress thermal deformation, and to reduce thermal resistance.

It is preferable that the second surface of the first plate-shaped member is connected to the second plate-shaped member so as to also sandwich a eutectic material between them. A eutectic material is employed as an adhesive agent that attaches the plate-shaped members, thus, it is possible to the plate-shaped members at a relatively low temperature. It is possible to remain micromachining on the plate-shaped member, to make the light emitting device thin, and to reduce thermal resistance.

In addition, the semiconductor apparatus according to the present invention is a semiconductor apparatus comprising the aforementioned heat sink and the heat generating element formed of a semiconductor. The heat sink is employed, thus, it is possible to prevent thermal deterioration of device characteristics of the heat generating element. Therefore, it is possible to provide a semiconductor apparatus with excellent reliability.

It is preferable that the first surface of the first plate-shaped member is provided with one or more of the semiconductor device according to the present invention mounted thereon. The asperities that are formed on the second surface of the first plate-shaped member reduce heat density in the second surface. Accordingly, deterioration of light output due to self-heat generation of the heat generating element, thus, it is possible to mount a plurality of heat generating elements at high density.

In addition, in the light emitting device according to the present invention, it is preferable that the heat generating element is a semiconductor light emitting element. Since heat characteristics of a semiconductor light emitting element is sensitive to heat, it remarkably deteriorates due to heat. Particularly, a semiconductor laser (LD) and an LED generate a large amount of heat. In the present invention, the heat sink is provided, it is possible to mount the heat generating elements at high density, and to achieve high output. Additionally, since a nitride semiconductor light emitting element generates a large amount of heat among semiconductor light emitting elements, it is effective to provide the heat sink according to the present invention for such a nitride semiconductor light emitting element.

In the heat sink according to the present invention, in a process of attaching the plate-shaped members to each other, an adhesive member is formed on a surface of one of the plate-shaped members, and a metal layer is formed on an attachment surface of the other plate-shaped member, thus, they can be attached to each other. Not only the adhesive member but also the metal layer is formed, thus, wettability of the adhesive member is improved. Accordingly, it is possible improve bonding characteristics of the plate-shaped members that are bonded with each other. Therefore, it is possible further improve reliability of leakage of a cooling agent, and so on.

In the heat sink according to the present invention, the eutectic material is an adhesive material that contains at least one material selected from the group consisting of AuSn, AuSi, SnAgBi, SnAgCu, SnAgBiCu, SnCu, SnBi, PbSn, and In. In terms of wettability and bonding characteristics, the above adhesive material are preferable. As for a method for producing a heat sink according to the present invention, it is preferable that an attachment temperature of the eutectic material is not more than 500° C. The heat sink is produced at the above temperature range, thus, thermal deformation is remarkably improved.

In this construction of the present invention, for example, 10 or more of LEDs of a nitride semiconductor can be mounted on the heat sink at high density. In addition, it is possible provide a watt-class light source that continuously emits in the CW driving condition. Further, the heat sink according to the present invention is provided with one or more of high-power surface emission type semiconductor lasers mounted thereon, thus, even in the case of nitride semiconductor lasers that generate a large amount of heat, it is possible to provide a small size watt-class light source that continuously emits in the CW driving condition. Additionally, the heat sink according to the present invention can be provided with a plurality of watt-class light sources with one or more of semiconductor light emitting elements. Therefore, it is possible to provide a higher-power light source.

Particularly, the heat dissipation member according to the present invention is effective for a surface emission type semiconductor laser and a high brightness LED. However, it can be used as a heat dissipation member applicable to any semiconductor devices that generate heat.

In addition, it is preferable that the heat generating element is a semiconductor element that has a first conductivity type layer and a second conductivity type layer. In the case where a first conductivity type is an n type, a second conductivity type is a p type, and vice versa. In this embodiment, the first conductivity type layer is electrically connected to the heat sink, and the second conductivity type layer is electrically connected to a metal member that is formed above the heat sink so as sandwich an insulating layer between them.

The following describes an embodiment of the present invention with reference to the drawings.

Figure 11:
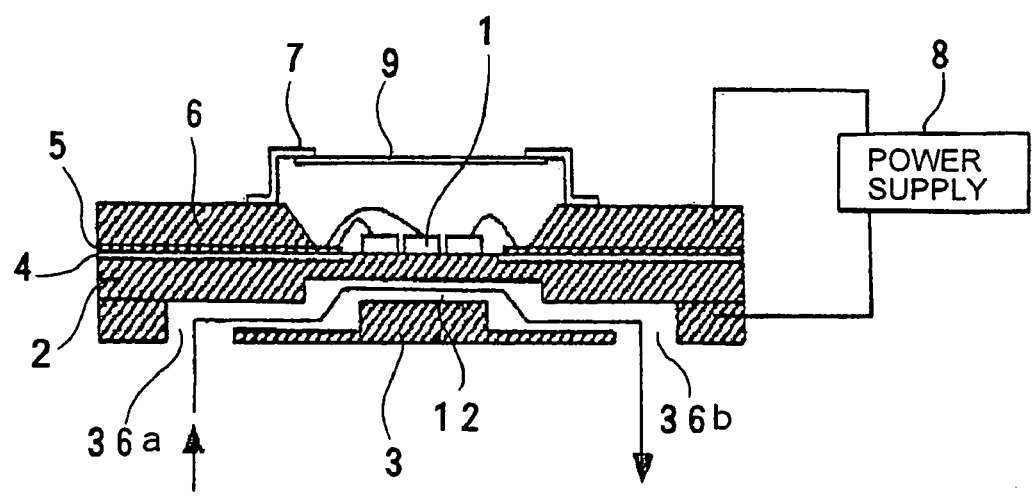
FIG. 11 is a cross-sectional view schematically showing the structure of a semiconductor apparatus according to the present invention.

FIG. 11 is a cross-sectional view schematically showing the structure of a semiconductor apparatus that has the heat sink according to the present invention. The semiconductor apparatus of FIG. 11 has the heat sink composed of a first plate-shaped member 2 and a second plate-shaped member 3. LED chips 1 as heat generating elements are mounted on the first plate-shaped member 2. The flow path 12 where a cooling fluid flows is formed between the first plate-shaped member 2 and the second plate-shaped member 3. The second plate-shaped member 3 has an inlet 36a and an outlet 36b of the fluid. The insulating member 4 is formed on the upper surface of the first plate-shaped member 2 except for a region for mounting the LED chips 1. A metal member 5 is formed on the insulating member 4. The first plate-shaped member 2 is electrically insulated from the metal member 5 by the insulating member 4. As for the LED chips 1 as the heat generating elements, their n-side electrodes forms on their upper surfaces are connected to the metal member 5 through wires. P-side electrodes of the LED chips 1 are formed on the bottom surfaces, and are connected to the first plate-shaped member 2. A metal cap weld member 6 is additionally formed on and is electrically connect to the metal member 5. The first plate-shaped member 2 and the second plate-shaped member 3 are also electrically connected to each other. A power supply 8 is connected to the cap weld member 6 and the second plate-shaped member 3. As for an electric connection path, the first plate-shaped member 2 and the metal member 5 are connected to each other via the heat generating elements 1. That is, the second plate-shaped member 3 and the first plate-shaped member 2 serve as leads that apply an electric current to the p-side electrodes of the LED chips 1, while the metal cap weld member 6 and the metal member 5 serve as leads that apply an electric current to the n-side electrodes of the LED chips 1. A cap 7 as a cover for protection of the LED chips 1 is formed on the cap weld member 6 located on the metal member 5. A window portion is formed in the cap 7 such that light emitted by the LED chips 1 can be observed, and is provided with a transparent window member 9 inserted therein.

Figure 12:
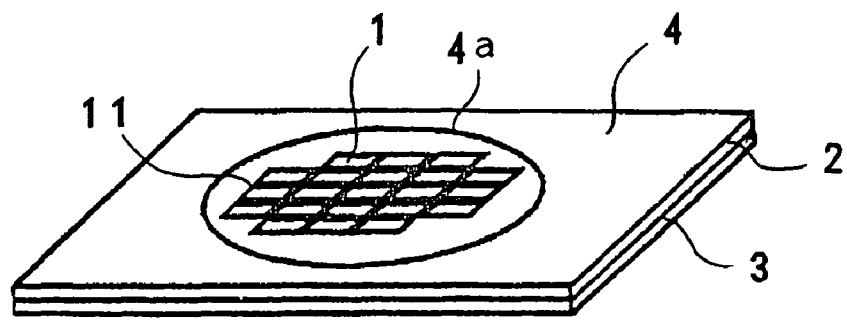
FIG. 12 is a perspective view schematically showing the structure of the semiconductor apparatus according to the present invention, with a metal cap and so on removed for the purpose of illustration.

FIG. 12 is a perspective view schematically showing the structure of the semiconductor apparatus shown in FIG. 11. The metal member 5, the cap weld member 6 and the cap 7 are omitted for the sake of brevity. As shown in FIG. 12, the insulating member 4 that has a circular window portion is formed on the first plate-shaped member 2. The first plate-shaped member 2 is exposed in the circular window portion 4a. The LED chips 1 are mounted inside the circular window portion 4a. A plurality of (in FIG. 12, twenty-one of) the LED chips 1 are arranged in a square matrix shape. The square matrix shape refers to an arrangement where the LED chips 1 are arranged in locations defined by lines that forms a grid shape, but is not limited to an arrangement where the whole shape of the LED chips 1 forms a rectangle. According to the present invention, since a water-cooling system discussed below can achieve high cooling efficiency, the LED chips 1 as heat generating elements can be spaced at a small interval 11 from each other to mount them at high density.

Figure 13:
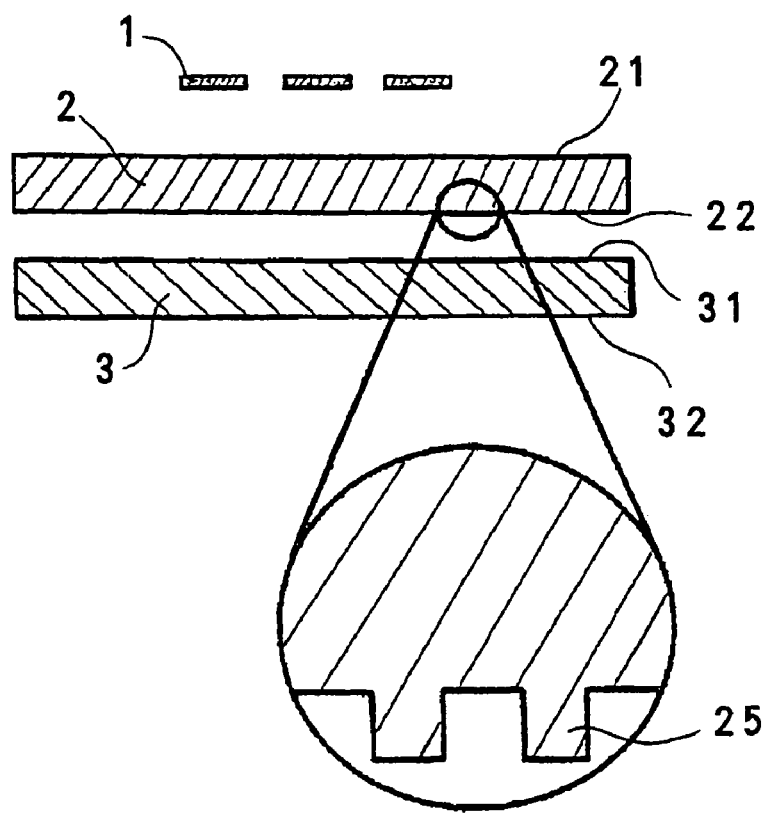
FIG. 13 is a cross-sectional view schematically showing the structure of a heat sink according to the present invention.

FIG. 13 is a cross-sectional view schematically showing the structure of the heat sink of the semiconductor apparatus according to this embodiment. For ease of explanation, this Figure shows components, with being separated from each other. The heat sink is composed of the first plate-shaped member 2 and the second plate-shaped member 3. The first plate-shaped member 2 has a first surface 21 and a second surface 22. The second plate-shaped member 3 has a first surface 31 and a second surface 32. The LED chips 1 as the heat generating elements are mounted on the first surface 21 of the first plate-shaped member 2. The second surface 22 of the first plate-shaped member 2 and the first surface 31 of the second plate-shaped member 3 are opposed to each other. A portion that is interposed between the two surfaces serves as a flow path where the cooling fluid flows. As shown in an enlarged partial view of FIG. 13, a plurality of protruding portions 25 are formed on the second surface 22 of the first plate-shaped member 2. The protruding portions 25 increase the contact area between the cooling fluid and the first plate-shaped member 2. Accordingly, it is possible to efficiently dissipate heat conducted from the LED chips 1 to the first plate-shaped member 2. In addition, the protruding portions 25 that are formed on the first plate-shaped member 2 serve to vary the flowing direction and flowing velocity of the cooling fluid. Accordingly, it is possible to improve heat dissipation efficiency. The plate-shaped member that composes the heat sink is preferably formed of a high thermal conductive material. It is preferable that the plate-shaped member is formed of a copper group thin material that is made of copper (Cu) as a base material. It is most preferable that the plate-shaped member is formed of oxygen-free copper. As discussed later, in the case where the plate-shaped members are bonded with each other with a eutectic material, this provides a high degree of flexibility in selection of material of the plate-shaped members. Particularly, in the case where metal materials containing Au coat the whole attachment surface of each of the plate-shaped members, when at least one of the metal materials containing Au is a eutectic material with low melting point (for example, melting point of 500° C. or less), it is not necessary to take in consideration of corrosion resistance against cooling fluid. This provides a higher degree of flexibility in selection of material of the plate-shaped members. As a result, it is possible to employ a material with a coefficient of thermal expansion substantially equal to a substrate material of the semiconductor element that is mounted on the plate-shaped member (particularly, the first plate-shaped member) as a material thereof. Accordingly, it is possible to reduce strain that is applied to the semiconductor element when the semiconductor element is mounted. For example, in the case where the semiconductor element is formed on a supporting substrate formed of CuW, and so on, the first plate-shaped member is formed of the same CuW. In this case, a metal material containing Au (Au, AuSn, AuSi, or a material with laminated layers of them) coats the attachment surface (=the second surface).

The protruding portions 25 are formed on the second surface 22 of the first plate-shaped member 2, thus, the asperity pattern is formed. In this embodiment, the protruding portion 25 that has a circle shape as viewed in a plan view (i.e., cylindrical shape) is illustrated. However, the asperity pattern can be formed in a streak shape, a rectangular shape, a stripe shape, a grid shape, and so on. The asperities that are formed on the second surface 22 of the first plate-shaped member 2 preferably have the height of a stepped part of not less than 100 μm to not more than 500 μm, more preferably not less than 100 μm to not more than 300 μm.

In the heat sink according to the present invention, it is preferable that the ratio between a contact area (a) of the heat generating element in the first surface of the first plate-shaped member and the surface area (b) of the second surface that is opposed to the contact region of the heat generating element is $0.2 \leq (a/b) < 1$, more preferably $0.2 \leq (a/b) < 0.5$. In order to satisfy this requirement, asperities can be formed on the second surface 22 of the first plate-shaped member 2. The LED chips 1 as heat generating elements have a chip size of about 100 μm to 10 mm square. In the case where asperities are formed on the second surface that is opposed to the first surface on which a plurality of heat generating elements 1 as such are mounted, recessed parts and/or protruding parts that are formed on the second surface preferably have a size with a width of not less than 10 μm to not more than 1000 μm.

Figure 14:
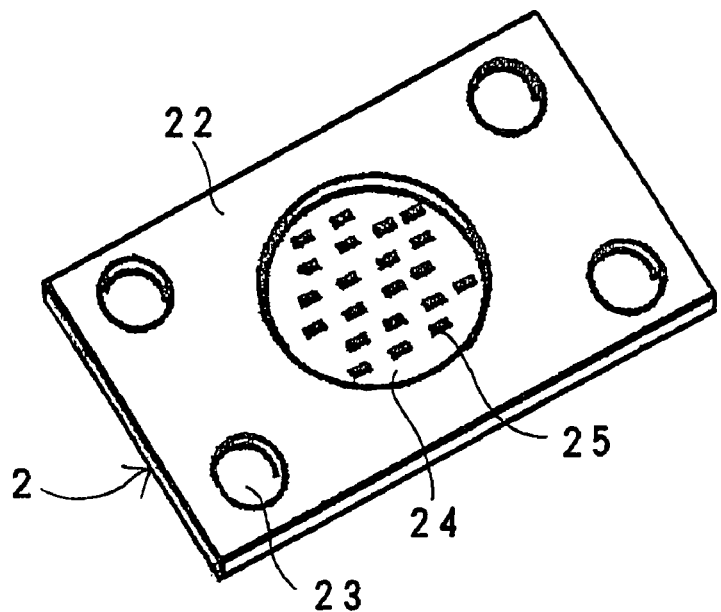
FIGS. 14(a) to (c) are a perspective view, a plan view, and a cross-sectional view schematically showing a first plate-shaped member according to one example of the present invention, respectively.
Figure 14:
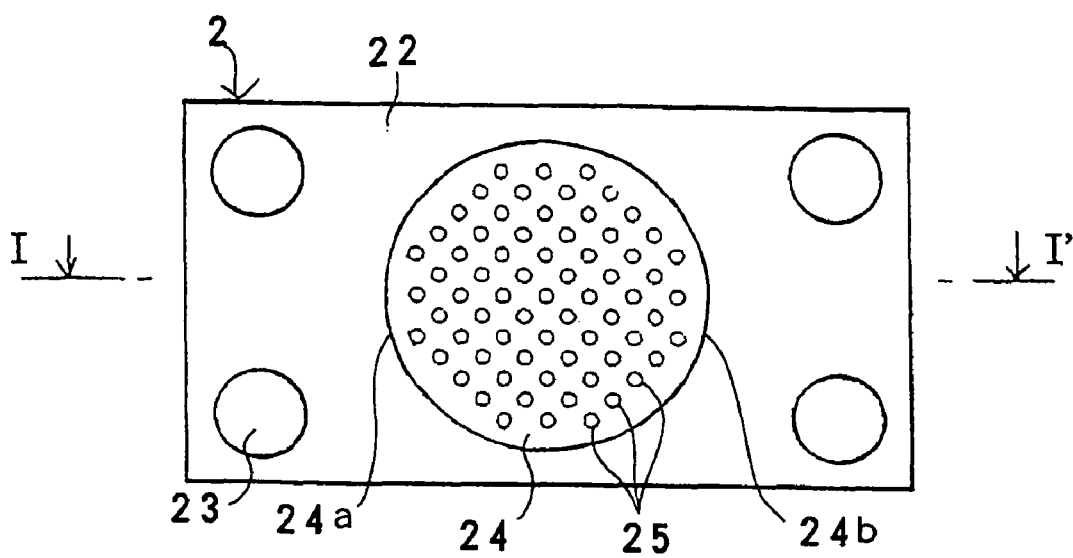
Figure 14:
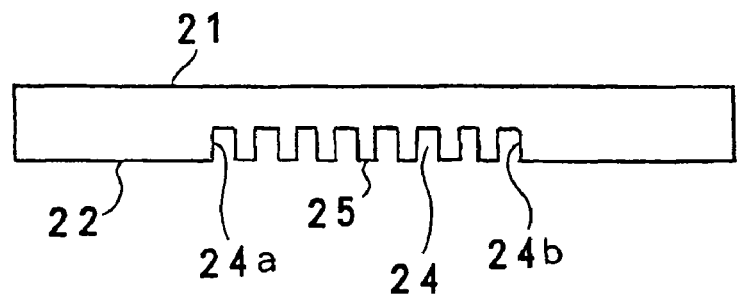
Figure 15:
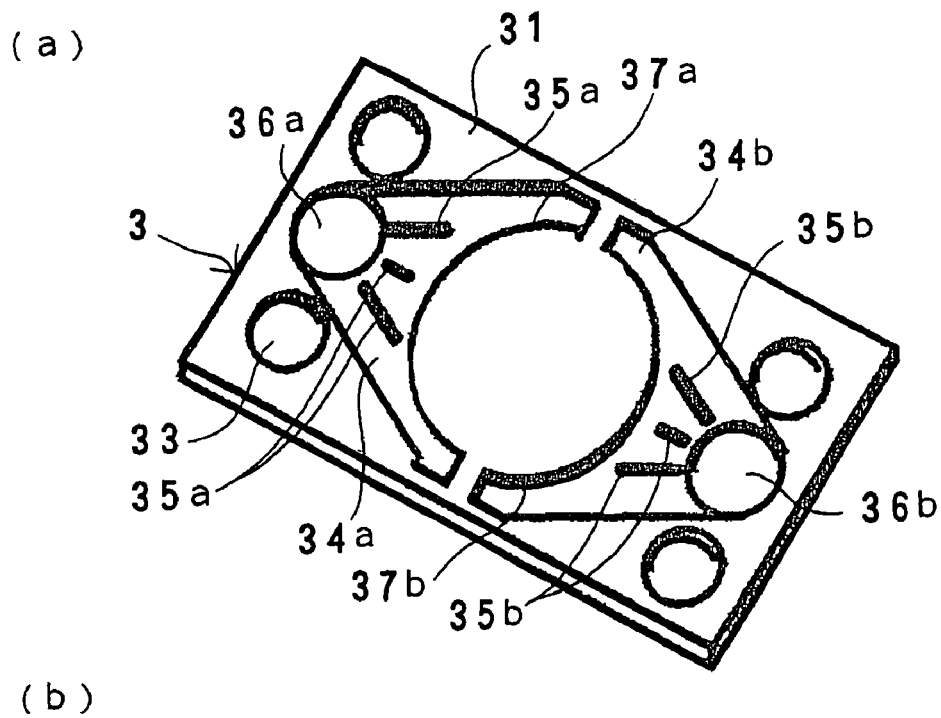
FIGS. 15(a) to (c) are a perspective view, a plan view, and a cross-sectional view schematically showing a second plate-shaped member according to one example of the present invention, respectively.
Figure 15:
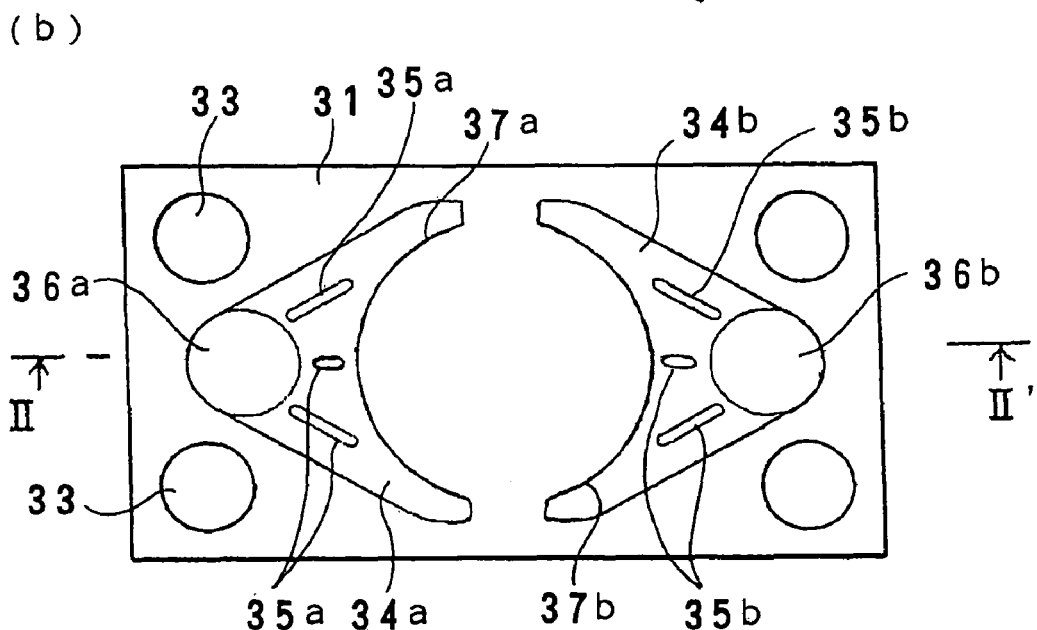
Figure 15:
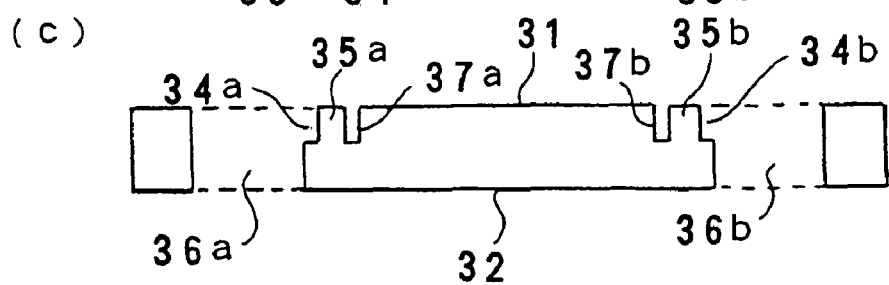
Figure 16:
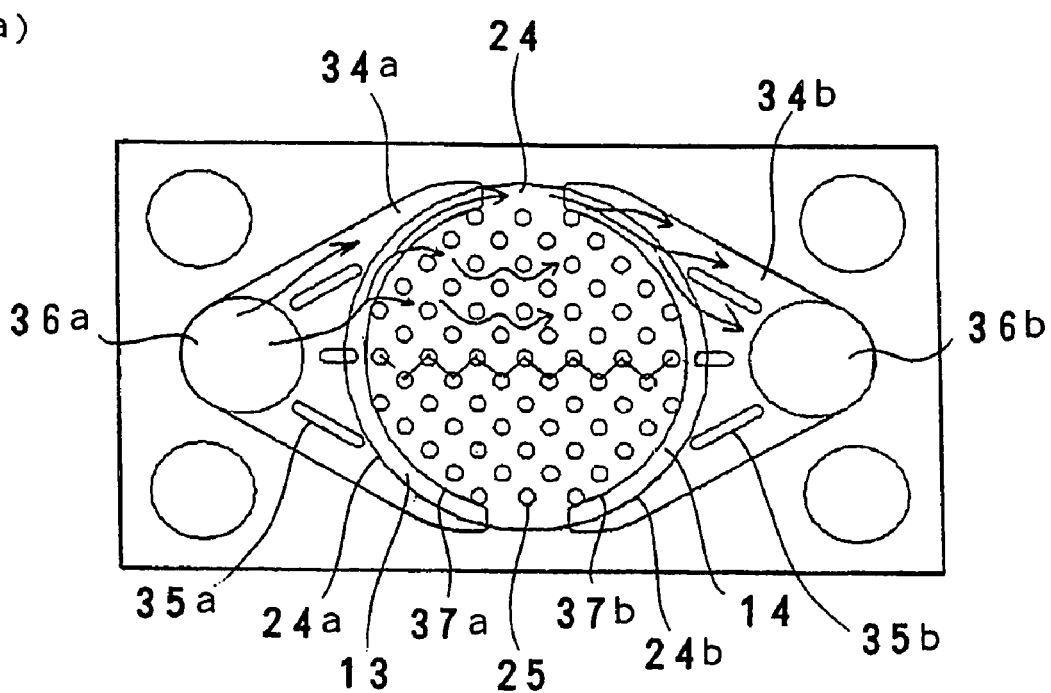
FIGS. 16(a) and (b) are a plan view, and a cross-sectional views showing the plate-shaped members combined with each other shown in FIGS. 4 and 5.
Figure 16:
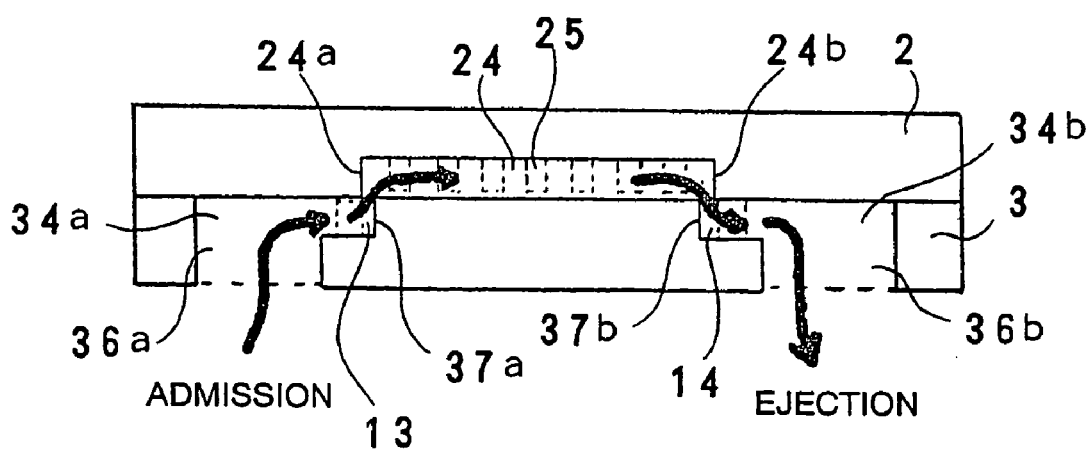

The first plate-shaped member 2 and the second plate-shaped member 3 according to a preferred form will be described with reference to FIGS. 4 to 6. FIGS. 14(*a*) to (*c*) show the first plate-shaped member 2 according to the preferred form. FIGS. 15(*a*) to (*c*) show the second plate-shaped member 3 according to the preferred form. FIGS. 16(*a*) and (*b*) show the plate-shaped members combined with each other shown in FIGS. 14 and 15.

The first plate-shaped member 2 according to the preferred form is now described. As shown in FIGS. 14(*a*) to (*c*), a circular recessed section 24 that forms the flow path of the cooling fluid is formed in a substantially central part of the second surface 22 of the first plate-shaped member 2. In this embodiment, the depth of the circular recessed section 24 equals to the height of the flow path where the cooling fluid flows. It is preferable that the depth of the circular recessed section 24 is not less than 10 μm and not more than 500 μm, and more preferably 100 μm and 300 μm. The reason is that, if the height of the flow path is too low, processing is difficult, and additionally the resistance of cooling water that flows in the flow path increases. On the other hand, if the height of the flow path is too high, the cooling fluid flows even in a location that is distant from the bottom surface of the recessed section 24 as a heat dissipation surface. This causes excess circulation of a fluid that serves for cooling.

The protruding portions 25 as a heat dissipation fin are regularly arranged in the bottom surface of the circular recessed section 24. Each of protruding portions 25 preferably has a height that equals to the depth of the circular recessed section 24 or less. In this embodiment, the height of the protruding portion 25 equals to the depth of the circular recessed section 24 (=height of the flow path). In this case, when the first plate-shaped member 2 and the second plate-shaped member 3 are attached to each other, the protruding portions 25 serve as supports, thus, mechanical strength of the heat sink is improved. In this construction, the upper surfaces of the protruding portions 25 can be bonded with the surface of the second plate-shaped member 3. This bonding can increase a bonded area between the first plate-shaped member 2 and the second plate-shaped member 3. Accordingly, mechanical strength of the heat sink is further improved. On the other hand, in the case where the height of the protruding portion 25 is smaller than the depth of the circular recessed section 24 (=height of the flow path), cooling fluid can be in contact with the upper surfaces of the protruding portions 25. Accordingly, heat dissipation efficiency is improved. In addition, the protruding portions 25 can be formed on the first surface 31 of the second plate-shaped member 3, and the upper surfaces of the protruding portions 25 can be attached to the second surface 22 of the first plate-shaped member 2. In this case, since the protruding portions 25 formed unitarily with the second surface 22 of the first plate-shaped member 2 in terms of thermal conduction and a mechanical structure, it can be considered that the protruding portions are formed on the second surface 22 of the first plate-shaped member 2. Screw holes 23 are formed at four corners of the first plate-shaped member 2.

The second plate-shaped member 3 according to the preferred form is now described. As shown in FIGS. 15(*a*) to (*c*), the second plate-shaped member 3 is provided with the inlet 36*a* as a through hole for admission of the fluid, and the outlet 36*b* as a through hole for ejection of the fluid that are formed therein. The second plate-shaped member has a fan-shaped recessed section 34*a* that extends from the inlet 36*a* toward the center part of the second plate-shaped member 3 substantially in a fan shape on the first surface 31. The fan-shaped recessed section 34*a* composes a guide portion that guides the cooling fluid from the inlet 36*a* to an inlet part of the flow path. The fan-shaped recessed section 34*a* has an arc-shaped periphery 37*a* that is located near the center part of the plate-shaped member. The arc-shaped periphery 37*a* and together with a periphery 24*a* of the circular recessed section 24 shown in FIG. 14 compose the inlet part of the flow path. A plurality of support pillars 35a are formed on the bottom of the fan-shaped recessed section 34a. The support pillars 35a are radially arranged along a direction that the fluid flows. The support pillars 35a have a height that their upper surfaces lie in the same plane as the first surface 31 and first surface 1 of the second plate-shaped member. Their upper surfaces serve as bounded surfaces when the first plate-shaped member 2 and the second plate-shaped member 3 are attached to each other. The support pillars 35a are formed as discussed above, thus, mechanical strength of the heat sink is improved, and additionally the cooling fluid tends to flow uniformly in the whole of flow path.

The outlet 36b has similar construction. That is, a fan-shaped recessed section 34b extends from the outlet 36b toward the center part of the plate-shaped member substantially in a fan shape. The fan-shaped recessed section 34b composes a guide portion that guides the cooling fluid from an outlet part of the flow path to the outlet 36b. The fan-shaped recessed section 34b has an arc-shaped periphery 37b that is located near the center part of the plate-shaped member. The arc-shaped periphery 37b and together with a periphery 24b of the circular recessed section 24 shown in FIG. 14 compose the outlet part of the flow path. A plurality of support pillars 35b are formed on the bottom of the fan-shaped recessed section 34b. In addition, screw holes 33 are formed at four corners of the second plate-shaped member 3, and are aligned with the screw holes 23 that are located at the four corners of the first plate-shaped member 2, thus, the plate-shaped members can be positioned.

FIGS. 16(a) and (b) show the combination of the first plate-shaped member 2 and the second plate-shaped member 3. As shown in FIGS. 16(a) and (b), the circular recessed section 24 that is formed in the second surface 22 of the first plate-shaped member 2 forms a circular cooling flow path between the second surface 22 of the first plate-shaped member 2 and the first surfaces 31 of the second plate-shaped member. An inlet part 13 of the circular cooling flow path is formed between the arc-shaped periphery 37a of the fan-shaped recessed section 34a that is formed in the second plate-shaped member 3, and the periphery 24a of the circular recessed section 24 of the first plate-shaped member 2. The inlet part 13 has an arc shape. Similarly, an outlet part 14 of the circular cooling flow path is formed between the arc-shaped periphery 37b of the fan-shaped recessed section 34b that is formed in the second plate-shaped member 3, and the periphery 24b of the circular recessed section 24 of the first plate-shaped member 2. The outlet part 14 has an arc shape. Need less to say, the arc-shaped periphery 37a or 37b is located in an inner side relative to the periphery 24a or 24b of the circular recessed section 24 of the first plate-shaped member 2. The fan-shaped recessed section 34a that is formed in the second plate-shaped member 3 forms a guide that guides the cooling fluid from the inlet 36a to the inlet part 13 of the flow path between the second plate-shaped member 3 and the second surfaces 32 of the first plate-shaped member. Similarly, the fan-shaped recessed section 34b that is formed in the second plate-shaped member 3 forms a guide that guides the cooling fluid from the outlet part 14 of the flow path to the outlet 36b between the second plate-shaped member 3 and the second surfaces 22 of the first plate-shaped member.

In the heat sink shown in FIG. 16, the cooling fluid flows as discussed below. First, the cooling fluid that is admitted from the inlet 36a flows toward the center part of the heat sink so as to extend along the guide formed by the fan-shaped recessed section 34a. When reaching the periphery 37 of the fan-shaped recessed section 34a, the cooling fluid flows into the inlet part 13 of the flow path defined by the periphery 37a of the fan-shaped recessed section 34a, and the periphery 24a of the circular recessed section 24. Since the inlet part 13 of the flow path has an arc shape, a part of flow directing toward the center part of the heat sink enters the flow path so as to extend around the periphery part of the heat sink. Accordingly, the cooling fluid tends to flow uniformly in the whole of flow path. Additionally, water pressure distribution of the cooling fluid tends to have contour lines that are perpendicular to the fluid flow. Therefore, it is possible to provide a cooling effect over the whole of flow path that flatly extends, and to suppress characteristic variations of the mounted LED chips 1 due to heat.

The fluid that enters from the inlet part 13 of the cooling flow path repeatedly goes around in an S-shape at the protruding portions 25, and directs toward the outlet part 14 of the flow path. That is, the protruding portions 25 are arranged apart from each other in a bended manner such that line segments that successively connect the protruding portions 25 closest to each other repeatedly change their direction. Accordingly, the fluid flows in the flow path such that the fluid that strikes the protruding portions 25 repeatedly goes around in an S-shape at the protruding portions 25 from a central inlet part 13 to a central outlet part 14. In other words, in the case the protruding portions 25 are regarded as a two-dimensional arrangement consisting of 1st column, 2nd column, . . . , and n-th column, the protruding portions 25 in the n-th column are arranged apart at an interval of a half pitch from the protruding portions 25 in the (n-1)-th column in the up-and-down direction. Thus, each protruding portion 25 is located at the center of a square that are defined by the four adjacent protruding portions 25. As discussed above, the protruding portions 25 are arranged such that the fluid repeatedly goes around in an S-shape at the protruding portions 25, thus, this aids heat exchange between the cooling fluid and the first plate-shaped member. Accordingly, a heat dissipation effect is further improved.

When the cooling fluid reaches the outlet part 14 of the flow path after flowing through the flow path, it is ejected from the outlet 36b through the guide formed by the fan-shaped recessed section 34b. In this case, since the outlet part 14 of the flow path has an arc shape, the fluid that flows from the periphery of the flow path flows out toward the center part of the outlet part so as to go along its arc. Accordingly, similarly to the aforementioned case, the cooling fluid tends to flow uniformly in the whole of flow path. Additionally, water pressure distribution of the cooling fluid tends to have contour lines that are perpendicular to the fluid flow. Therefore, it is possible to provide a heat dissipation effect over the whole of flow path that flatly extends, and to suppress characteristic variations of the mounted LED chips 1 due to heat. In addition, the shape of the flow path that is formed in the plate-shaped member is not limited to the shape shown in FIGS. 14 and 15.

Figure 17:
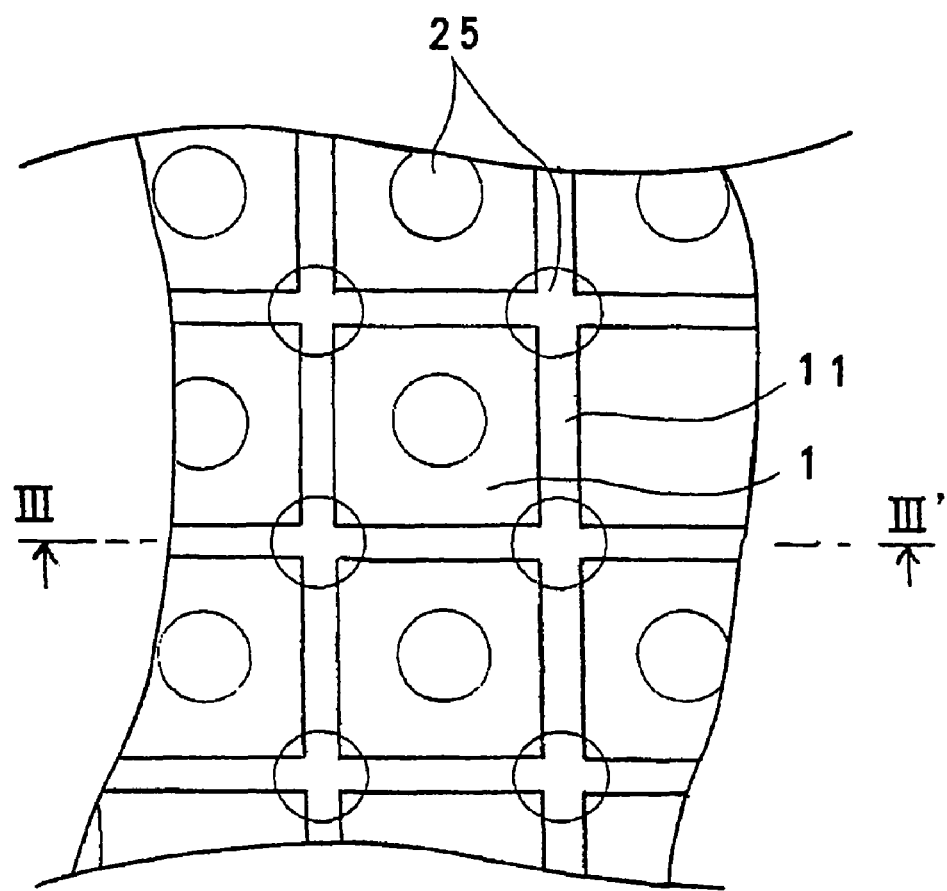
FIGS. 17(a) and (b) are a plan view, and a cross-sectional view schematically showing arrangement between a semiconductor element and a protruding portion inside a flow path.
Figure 17:
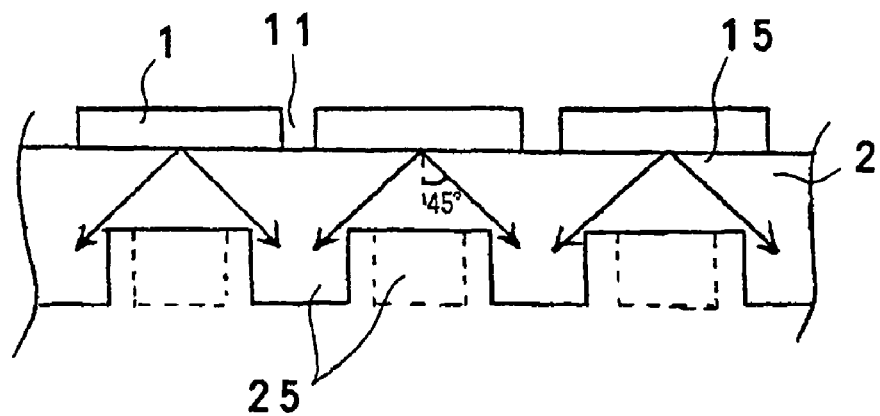

In this embodiment, it is preferable that the protruding portion 25 formed in the flow path is located at a particular position relative to the LED chip 1 as the heat generating element. FIGS. 17(a) and (b) schematically show an arrangement between the LED chip 1 and the protruding portion 25 in the case where the LED chips 1 are arranged in a square matrix shape. As mentioned above, in thermal transport where heat is dissipated from the heat surface, the heat from the heat generating element such as LED chip is conveyed in the heat while spreading at 45° relative to the thickness direction. That is, as shown in FIG. 16(b), the heat generated by the LED chip 1 transfers so as to spread at 45° when transferring in the plate-thickness direction in the first plate-shaped member 2. For this reason, in the case where chips are mounted at high density such that an interval between the chips is not larger than the chip width (more specifically, not more than a half the chip width) for example, heat generated by two LED chips adjacent to each other is overlapped during conveyed in the thickness direction of the first plate-shaped member. This causes thermal interference and relatively increases heat density in a location corresponding to the interval 11 between the LED chips. Accordingly, it is preferable that some of the plurality of the protruding portions 25 are formed in locations corresponding to the intervals 11 between the LED chips 1. The reason is that heat density in a part where the protruding portion 25 is formed can be reduced. That is, in the case where the protruding portion 25 is formed, since a surface area per unit of projected area of the first plate-shaped member 2 increases, heat density in a surface in contact with the cooling fluid (=the second surface 22 of the first plate-shaped member 2) can be reduced. Therefore, even in the case where semiconductor elements as heat generating elements such as LED chips are mounted at high density and cause mutual thermal interference, it is possible to suppress heat distribution and to provide high efficient cooling.

For similar reason, it is preferable that the protruding portion 25 is located in a location corresponding to the substantially center of each LED chip 1. The reason is that, generally, a semiconductor light emitting element such as LED chip largely generates heat in its central part. In this embodiment, as shown in FIG. 17(a), the protruding portions 25 are formed so as to be positioned at the center and four corners of the LED chip 1. The protruding portions 25 that are formed at the four corners of the LED chip 1 are positioned at the center of the interval 11 between the LED chips 1. That is, the protruding portion 25 that is formed at a corner of one LED chip 1 is formed so as to overlap three adjacent LED chips 1. The protruding portions 25 are positioned as discussed above, thus, the heat distribution produced inside the LED chips 1, and the heat distribution produced by heat interference between the LED chips 1 are suppressed. Accordingly, it is possible to efficiently dissipate heat. In addition, the LED chips 1 may be positioned at the centers of four edges of the rectangular LED chip 1 instead of the four corners of the rectangular LED chip 1. In this case, one protruding portion 25 overlaps two adjacent LED chips 1. Additionally, it is preferable that the center of protruding portion 25 is positioned on the interval 11 between the LED chips 1.

It is preferable that the plate-shaped members that compose the heat sink are attached to each other with a eutectic material. Attachment of the plate-shaped members to each other with a eutectic material provides excellent heat conductivity and electric conductivity from the first plate-shaped member 2 to the second plate-shaped member 3. Additionally, it is possible to provide high heat resistant bonding. Excellent heat conductivity between the first plate-shaped member 2 and the second plate-shaped member 3 provides an advantage in terms of construction of the heat sink with this combination. In addition, excellent electric conductivity between the first plate-shaped member 2 and the second plate-shaped member 3 provides an advantage in the case where the heat sink with this combination serves as a lead.

It is preferable that a eutectic material is formed the whole of attachment surface, i.e., the whole of the second surface 22 of the first plate-shaped member 2 and the whole of the first surface 31 of the second plate-shaped member 3. Accordingly, the eutectic material can protect the surface of the plate-shaped member from corrosion due to the fluid, and so on. For example, although copper, or the like, with high heat conductivity is a preferable material as a plate-shaped member, copper easily causes electrolytic corrosion due to the cooling water, or the like. Coating of high corrosion resistant eutectic material (e.g., an alloy containing Au) on the whole of attachment surface can provide high reliable heat sink. A eutectic material may coats the surface of one of plate-shaped members, and a metal layer may be formed on an attachment surface of the other plate-shaped member. The metal layer is formed on the plate-shaped member, and thus protects the surface of the plate-shaped member. Additionally, it is possible to easily provide connection between the metal layer and the eutectic material. It is preferable that the eutectic material is an adhesive material that contains at least one material selected from the group consisting of AuSn, AuSi, SnAgBi, SnAgCu, SnAgBiCu, SnCu, SnBi, PbSn, and In. The metal layer is not specifically limited as long as having wettability in a relationship of the eutectic material as a bonding material. An alloy containing Au (e.g., AuSn), and Au or a laminated-layer material containing Au can be given be give as preferable combination of the eutectic material, and the metal layer.

The heat sink according to present invention can be provided with two or more heat generating elements 1 mounted in an array shape thereon. Using the heat sink according to present invention provides sufficient heat dissipation even in the case where a plurality of heat generating elements are mounted. Additionally, it is possible to suppress the entry of cooling fluid, peel-off of the plate-shaped member due to the entry, and so on. The heat generating elements that are formed in an array shape on the same surface of the heat sink can be electrically connected to each other in parallel and/or in series.

In addition, it is preferable that the heat generating element is a semiconductor element that has a first conductivity type layer and a second conductivity type layer. In the case where a first conductivity type is an n type, a second conductivity type is a p type, and vice versa. In this embodiment, the first conductivity type layer is electrically connected to the heat sink, and the second conductivity type layer is electrically connected to a metal member that is formed above the heat sink so as sandwich an insulating layer between them.

The heat sink according to present invention can be provided with two or more heat generating elements 1 mounted in an array shape thereon. Using the heat sink according to present invention provides sufficient heat dissipation even in the case where a plurality of heat generating elements are mounted. Additionally, it is possible to suppress the entry of a cooling material, peel-off of the plate-shaped member due to the entry, and so on. The heat generating elements that are formed in an array shape on the same surface of the heat sink can be electrically connected to each other in parallel and/or in series.

Figure 18:
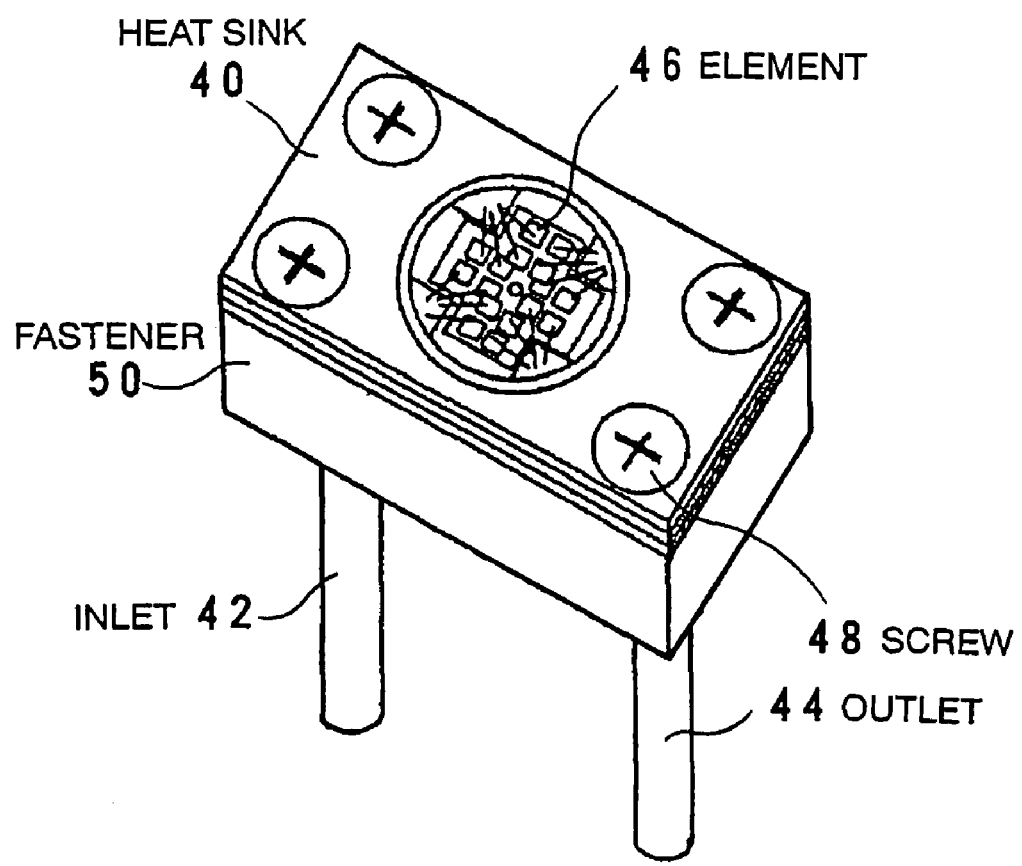
FIG. 18 is a view showing a unit module of light source apparatus with an LED light source according to the embodiment of the present invention.

As shown in FIG. 18, the semiconductor apparatus according to the present invention has a heat sink 40. For example, the cooling fluid flows inside the heat sink 40 through an inlet 42 and an outlet 44 that are provided on the outside surface of the heat sink 40. Heat that is generated by semiconductor elements 46 as the heat generating elements is excellently dissipated the cooling fluid that flows inside the heat sink 40. The heat sink 40 is a laminated plate-shaped member that is formed of two or more plate-shaped members attached to each other, for example. The plate-shaped members are firmly bonded with each other with a eutectic material or a metal layer with wettability provided thereon. Accordingly, cooling water does leak inside the heat sink 40. In the case where a semiconductor light emitting element, particularly a semiconductor laser is used as the heat generating element according to the present invention, it is possible to provide a high-power laser light source apparatus that emits laser light in a short wavelength range of 500 nm or less. Needless to say, this embodiment can be applied to the case where a light emitting diode, a photoreceptor element, and so on, are used as the heat generating element.

Figure 19:
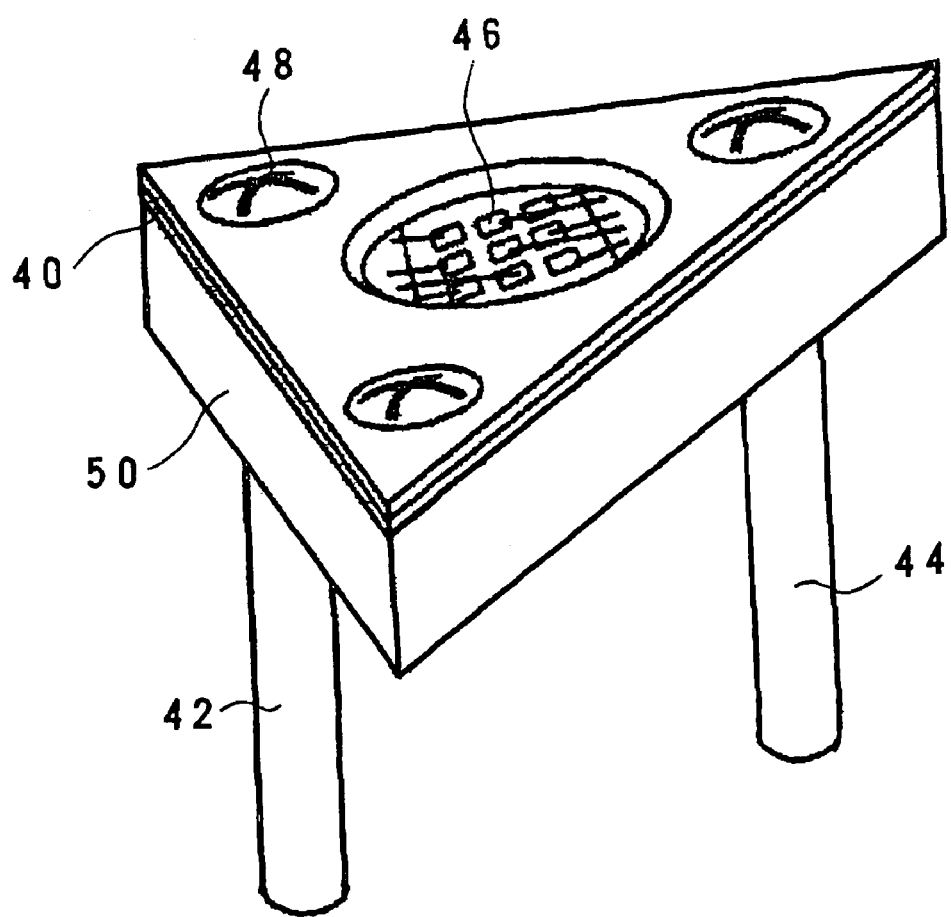
FIG. 19 is a view showing a unit module of light source apparatus with an LED light source according to the embodiment of the present invention.

A unit module type light source apparatus with LED light sources (FIG. 18) can be given as an example of the semiconductor apparatus o the construction according to the present invention. The outline of light source apparatus has the heat sink 40, a fastener 50 for fastening it, and screws 48. In addition, a member that connects an inlet and an outlet of the heat sink 40 to and an inlet 42 and an outlet 44 of the fastener 50 without leakage may be used between the heat sink 40 and the fastener 50. This member can be made of resin or metal, for example. The aforementioned unit module type light source apparatus with LED light sources can have an appearance of a quadrangle as shown in FIG. 18, or a triangle and as shown in FIG. 19. In FIGS. 18 and 19, wiring for supplying electric power from a power supply is omitted for the sake of brevity.

Figure 20:
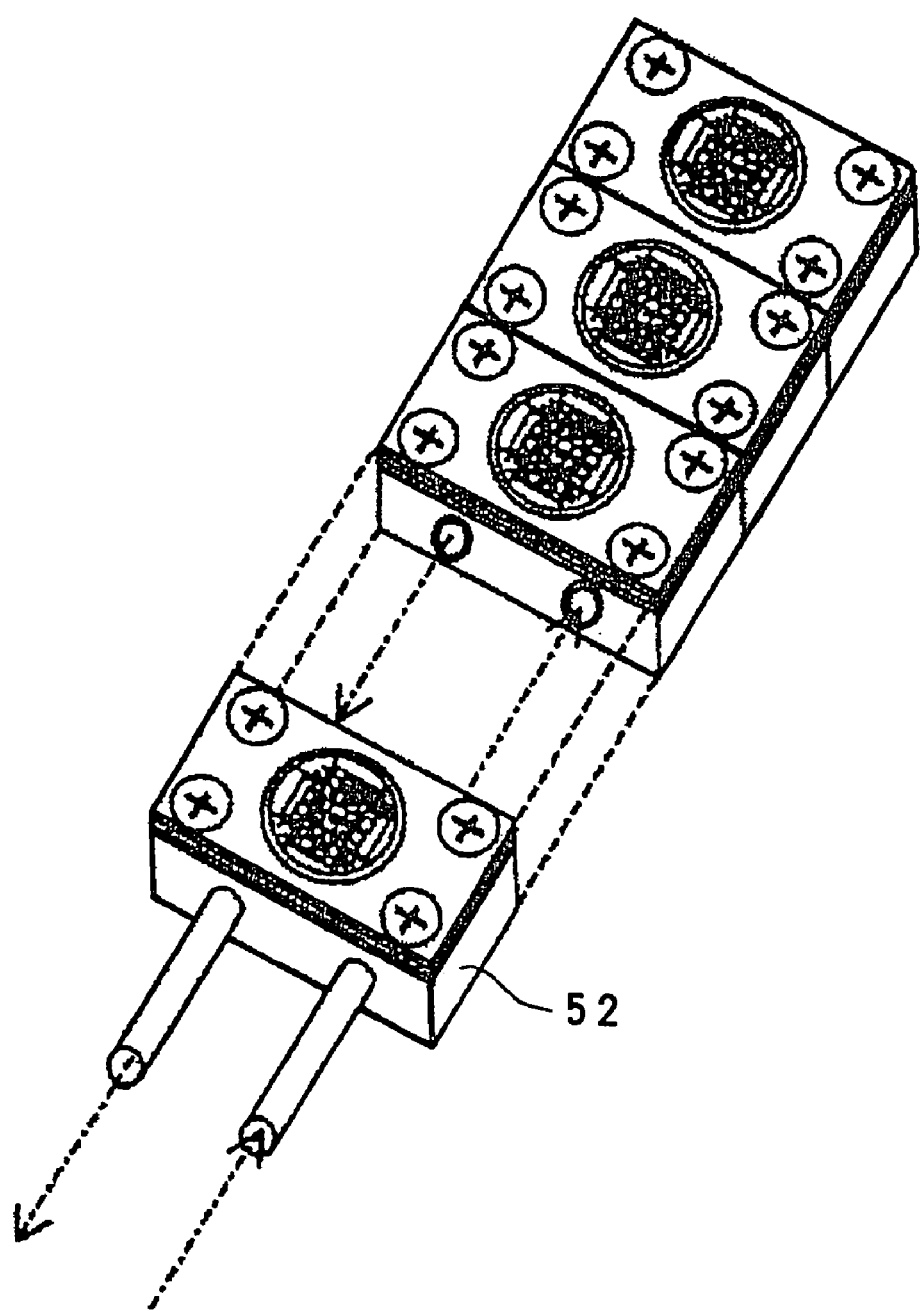
FIG. 20 is a view showing an ultra high power unit module of light source apparatus with an LED light source according to the embodiment of the present invention.
Figure 21:
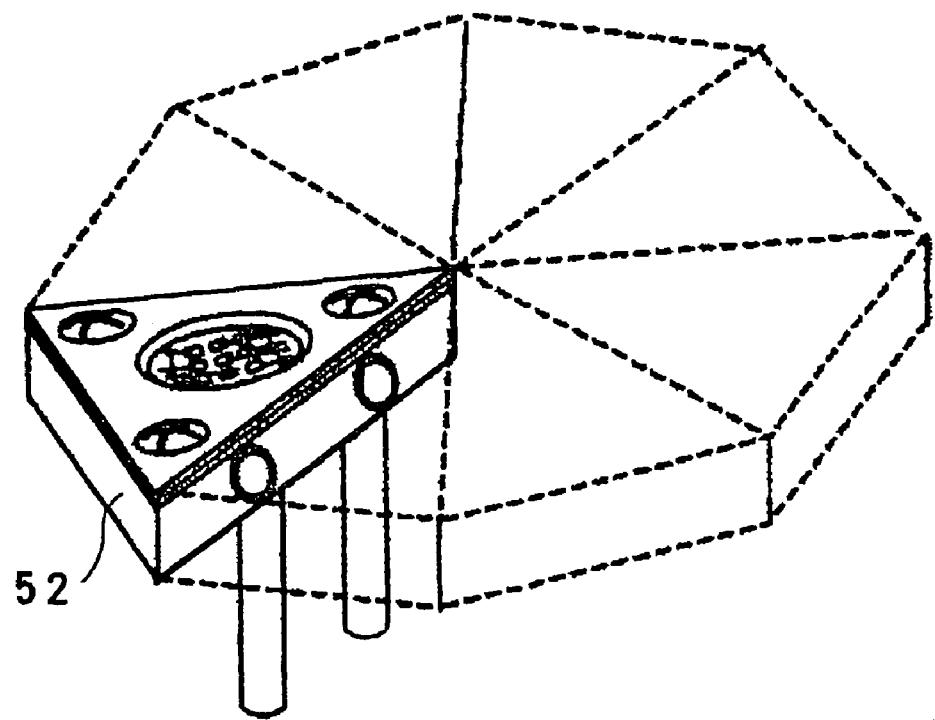
FIG. 21 is a view showing an ultra high power unit module of light source apparatus with an LED light source according to the embodiment of the present invention.

In the case where the unit module type light source apparatuses with LED light sources of the aforementioned construction are arranged, it is possible to an ultra high-power module type light source apparatus. FIG. 20 shows an ultra high-power module type light source apparatus. When unit module type light source apparatuses with LED light sources 52 have an appearance of a quadrangle as shown in FIG. 20, the light source apparatuses are arranged in an array alignment or in a matrix alignment to provide a higher-power light source. In this case, it is preferable that inlets and outlets of cooling fluid of the module type light source apparatuses 52 are communicated to each other in series or in parallel. That is, the inlets or outlets of the module type light source apparatuses 52 can be communicated to each other. Alternatively, the outlet of one of the module type light source apparatuses 52 can be repeatedly connected to the inlet of a subsequent unit module type light source apparatus. When the aforementioned unit module type light source apparatuses with LED light sources 52 have an appearance of a triangle as shown in FIG. 21, they can be circularly arranged such that their edges successively overlap one another. Thus, the whole shape of them forms a polygon. In this arrangement, it is possible to provide construction of a higher-power light source with a small area. In addition, the ultra high-power module type light source apparatus can have a member that connects inlets and outlets between the unit module type light source apparatuses that compose the ultra high-power module type light source apparatus. This member can be made of resin or metal, for example. In this case, in serial connection where the unit module type light source apparatuses are arranged in an array shape, a matrix shape, or a circular shape, even if high pressure is required, it is possible to prevent leakage.

EXAMPLES

Examples of the light emitting device according to the present invention are described. However, the present invention is not limited to these examples. Additionally, the sizes and the arrangement relationships of the members in each of drawings are occasionally shown larger exaggeratingly for ease of explanation. In this specification, in light emitting devices of the following examples, a material, a shape, and an arrangement of conductive wiring and a conductive wire that supply electric power to a semiconductor light-emitting element can have various forms. In this specification, their description and illustrations are occasionally omitted for sake of brevity.

Example 1

FIG. 1 shows a cross-sectional view schematically showing a light emitting device according to this example. A light emitting device 100 according to this example has a heat dissipation member 102 that includes a flow path 105 of a refrigerant, and a support member 103 that is provided a recessed portion 106 on which a plurality of semiconductor light emitting elements 104 are mounted to be arranged in a matrix shape. In addition, a light conversion member 101 is applied on a surface of the aforementioned heat dissipation members 102 where light emitted by a light emitting device 100 is observed.

The semiconductor light emitting element 104 according to this example has a light-emission peak wavelength of 365 nm. The light conversion member 101 contains a material that is mixed with a phosphor suitably selected from the aforementioned phosphors to emit white range light. The heat dissipation member 102 is made of a quartz glass, and has an inlet and an outlet (not shown) for providing the refrigerant to the flow path 105. The support member 103 is formed of a plate-shaped member of oxygen-free copper on which the recessed portion 106 is formed by processing.

The light emitting device 100 formed as discussed above is attached to a water cooling device, and pure water as the refrigerant is provided to the flow path inside the light emitting device through the inlet.

While cooling water is circulated in the light emitting device according to the present invention, electric power is supplied for 60 sec such that the light emitting element emits light at light density of 4.9 W/cm$^2$. Reduction of output is not observed.

The temperature of the light conversion member for light density of the light emitting element, and the light output of the light emitting device are measured. The temperature of the light conversion member is measured by a thermistor that is inserted to the light conversion member. Table 1 shows the result. FIG. 5(*a*) schematically shows the case where electric power is supplied to the light emitting device for 60 sec. FIG. 5(*b*) schematically shows time variation of relative output of the light emitting device according to this example. As is evident from this embodiment, the light density of light from the light emitting element can be 3.0 W/cm$^2$ or more, and the temperature of the light conversion member can be suppressed to at least 200° C. or more, preferably 120° C., more preferably 100° C. or less.

According to the light emitting device of this embodiment, even in the case where light from the light emitting element that excites the phosphor has a short wavelength and is emitted at high density as excitation light, it is possible to suppresses self-heat generation of the phosphor to a negligible extent, and to keep the light conversion efficiency optimized. Therefore, it is possible to provide a light emitting device capable of emitting light at high luminance.

Example 2

A light emitting device is configured similar to the example 1 except that a refrigerant is not provided to a flow path. In this light emitting device, light emitting elements emitting ultraviolet light are arranged in a matrix shape in a recessed portion of a first heat dissipation member. A light conversion member that contains a phosphor material so as to emit white range light is located directly above the light emitting elements at a distance of about 2 mm. The light emitting element has a light emission peak wavelength of 365 nm. The phosphor is suitably selected from the aforementioned phosphors to emit white range light and is mixed. The heat dissipation member is made of a quartz glass material. The light conversion member is applied to a surface of the quartz glass in a side where light is observed. The temperature of the light conversion member is measured by a thermistor that is inserted to the light conversion member. The light density of the light emitting element, the temperature of the light conversion member for electric power to the light emitting element, and the light output of the light emitting device are measured. The following table shows the result. FIG. 5(a) schematically shows the case where electric power is supplied to the light emitting device for time of 60 sec. As for the respective light densities of light emitting element, FIG. 5(b) schematically shows time variation of relative light output of the light emitting device. As for the light densities of light emitting element, FIG. 5(c) schematically shows time variation of the temperature of the light conversion member.

TABLE 1

| Light Density [W/cm²] | Electric Power [W] | Temp of Light Conversion Member [° C.] |
|---|---|---|
| 1.5 | 15 | About 60 |
| 2.7 | 30 | About 85 |
| 4.9 | 70 | About 120 |

When the electric power is 15 W, the temperature of the light conversion member is about 60° C., and the light output is sufficiently stable, as shown in FIG. 5(b). When the electric power is 30 W, the temperature of the light conversion member is about 85° C., and the light output of white light as a second light slightly decreases at first but became sufficiently stable. When the electric power is 70 W, the temperature of the light conversion member reaches about 120° C. at 60 sec after the electric power is supplied. The output light of the light emitting device decreases to about 75% of the initial output after the electric power is supplied, but shows a tendency to be stable at a certain output.

Example 3

Figure 2:
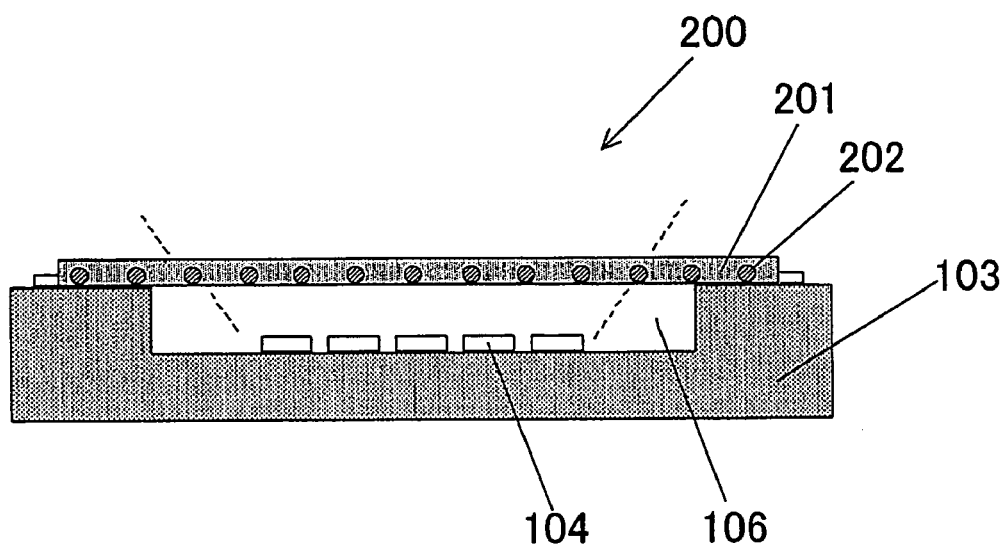
FIG. 2 is a cross-sectional view schematically showing a light emitting device according to one embodiment of the present invention.

FIG. 2 shows a cross-sectional view schematically showing a light emitting device 200 according to this example. A heat dissipation member 202 according to this example is formed of a plate-shaped metal material that has a plurality of through holes arranged in a matrix shape as viewed from a side of the light emitting device 200 where light is observed. A light conversion member 201 is formed on a surface in a side where light from the semiconductor light emitting element 104 is incident, the through holes, and a surface where light is observed in the heat dissipation member 202. Thus, the heat dissipation member 202 extends in a net shape inside the light conversion member 201. As viewed from a side where light is observed, the heat dissipation member 202 or the periphery of the light conversion member 201 is thermally connected to the support member 103. The light emitting device is configured similar to the example 1 except the above construction. According to the construction of this example as discussed above, the light emitting device has effects substantially similar to the example 1, and additionally aids heat dissipation from the central part of the light conversion member to the periphery. Thus, the light emitting device provides high power.

Example 4

Figure 3:
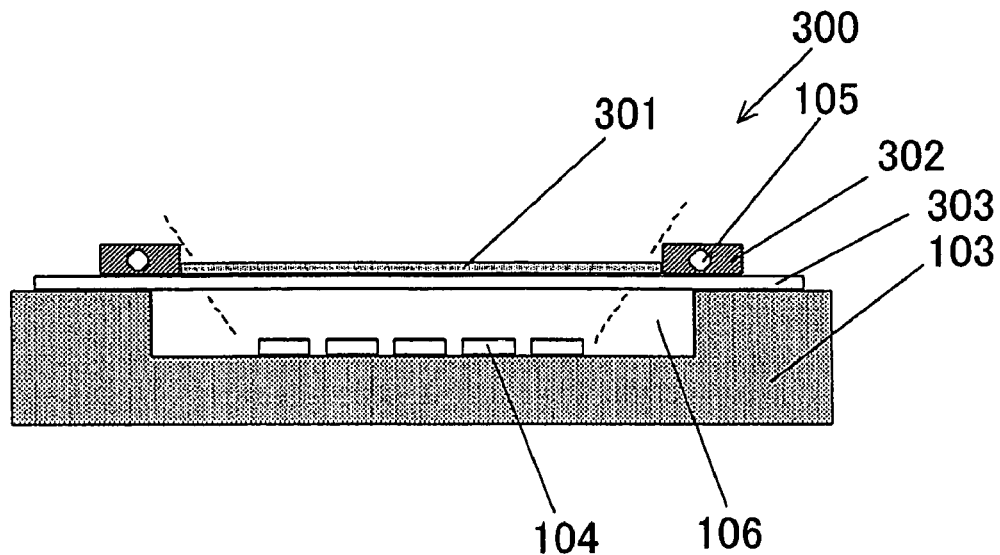
FIG. 3 is a cross-sectional view schematically showing a light emitting device according to one embodiment of the present invention.

FIG. 3 shows a cross-sectional view schematically showing a light emitting device 300 according to this example. Both a light conversion member 301 and a heat dissipation member 302 according to this example are provided on the upper surface side where light from the light emitting device 300 is observed in the upper and lower surfaces of a transparent member 303. The transparent member 303 is formed of a plate-shaped material that passes light from at least the semiconductor light emitting element 104, and is made of glass, transparent resin, or the like, as its material, specifically. The light conversion member 301 is dimensioned to an area where the light that passes through the aforementioned transparent member 303 is incident, in other words, it is dimensioned to the size of an opening of the recessed portion 106. The heat dissipation member 302 has the flow path of a refrigerant therein, and is formed so as to surround the rim of the light conversion member 301. The flow path of the refrigerant inside the heat dissipation member 302 is formed so as to surround the light conversion member 301. As viewed from a side where light is observed, the periphery of the transparent member 303 may contain filler in a portion that is in contact with at least the support member 103 in order to improve heat conductivity. The light emitting device is configured similar to the example 1 except the above construction. According to the construction of this example as discussed above, the light emitting device has effects substantially similar to the example 1 without that the heat dissipation member affects the optical characteristics of light that outgoes from the light emitting device. Thus, the light emitting device provides higher power.

Example 5

Figure 4:
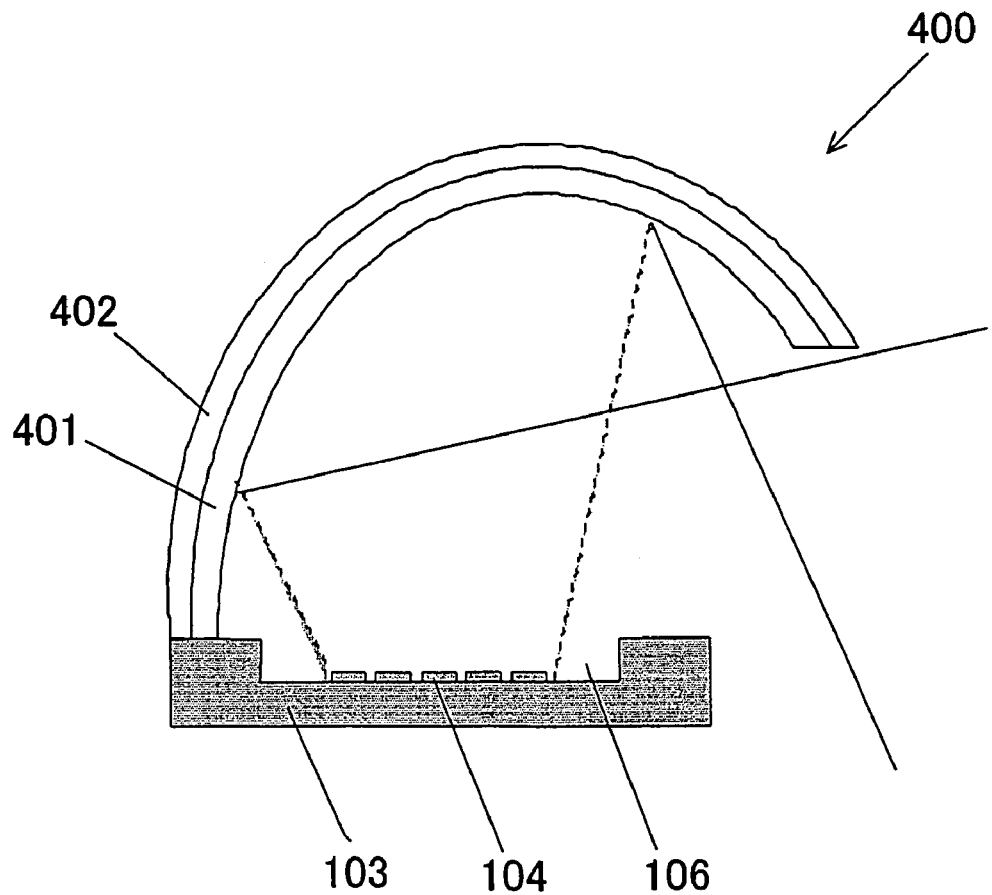
FIG. 4 is a cross-sectional view schematically showing a light emitting device according to one embodiment of the present invention.
Figure 5:
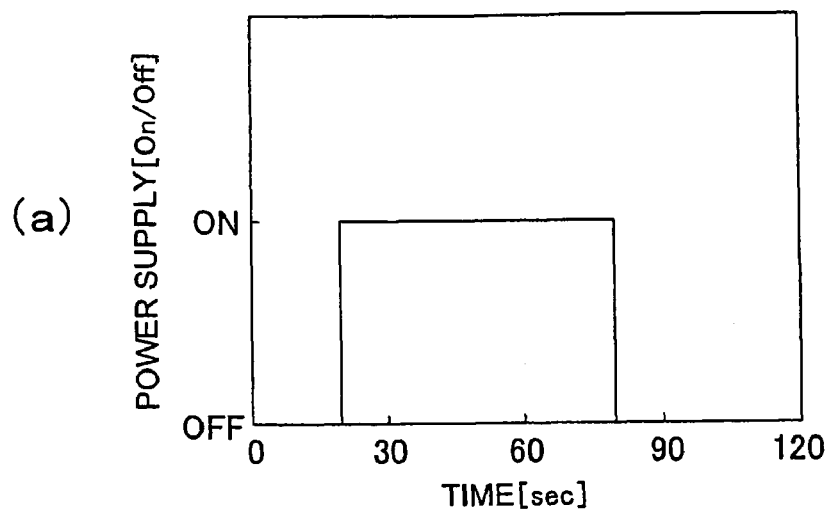
FIG. 5 shows characteristics of examples according to the present invention and a comparative example.
Figure 5:
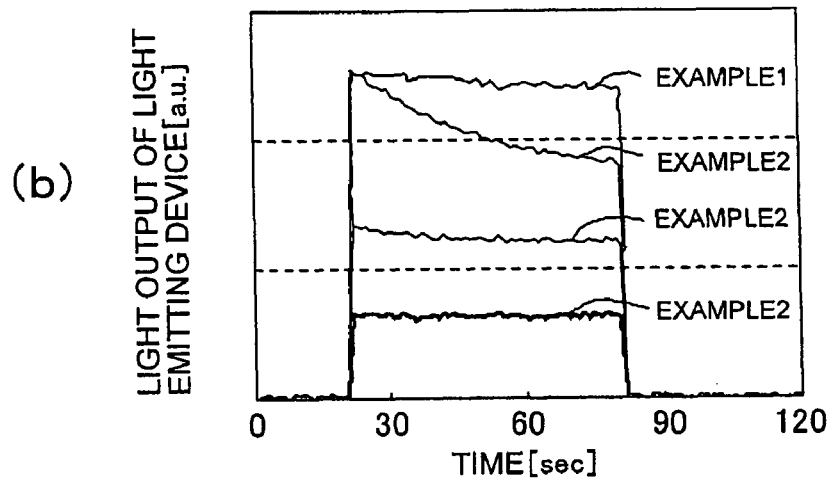
Figure 5:
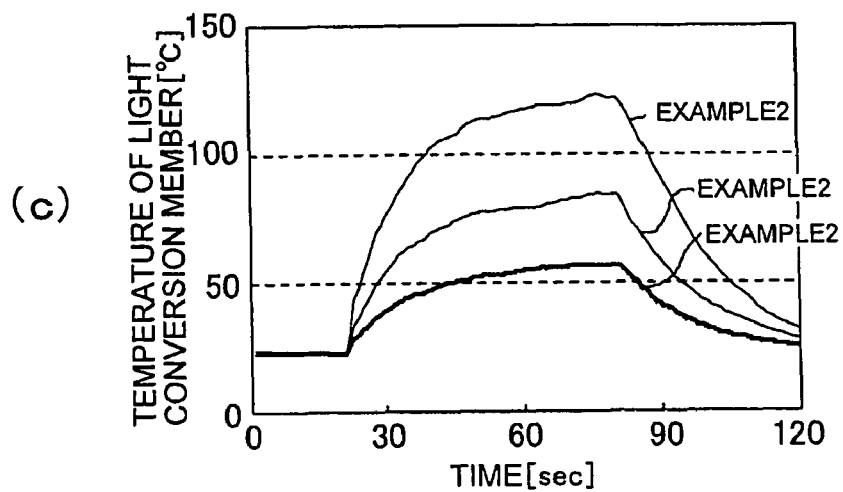

FIG. 4 shows a cross-sectional view schematically showing a light emitting device 400 according to this example. The light emitting device 400 according to this example has a curve-shaped heat dissipation member 402 in an opening orientation of the recessed portion 106 of the support member 103 on which the semiconductor light emitting element 104 is mounted. A light conversion member 401 is applied an inner wall surface of the heat dissipation member 402 (a surface where light from the light emitting element 104 is incident). An end of the heat dissipation member 402 is thermally connected to the support member 103. Another end is spaced away from the support member 103 so as to allow light emitted by the light emitting device to pass between them. According to this construction, light from the semiconductor light emitting element 104 (as illustrated by dotted lines in the Figure, for example) is incident on the light conversion member. Then, light with a wavelength converted by a phosphor is reflected by the inner wall surface of the heat dissipation member 402 and is radiated from the light emitting device 400 (as illustrated by solid lines in the Figure, for example). The light emitting device is configured similar to the example 1 except the above construction. According to this example, the light emitting device has effects substantially similar to the example 1. Additionally, the light emitting device radiates light with the wavelength converted by the phosphor toward a desired direction.

Example 6

Figure 8:
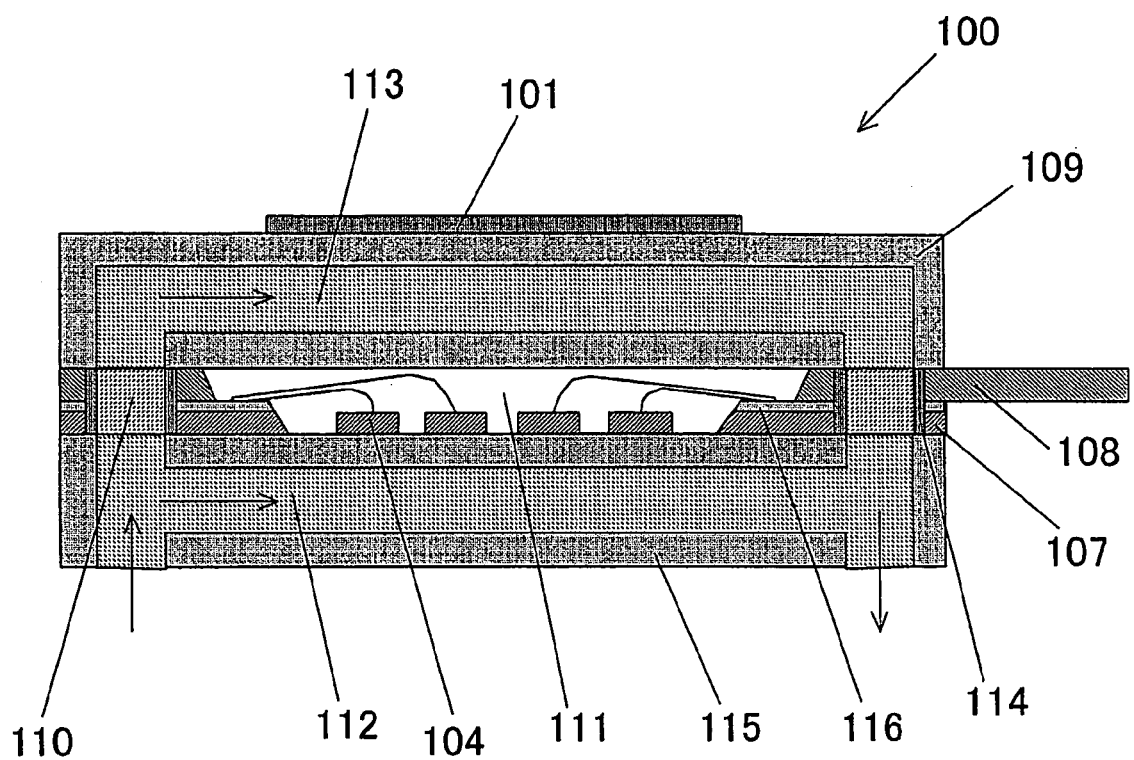
FIG. 8 is a cross-sectional view schematically showing a light emitting device according to one embodiment of the present invention.

FIG. 6 shows a perspective view and a partial cross-sectional view schematically showing a light emitting device according to this example. FIG. 7 is a perspective view schematically showing components of the light emitting device according to this example of the present invention. FIG. 8 is a cross-sectional view of the light emitting device of FIG. 6 as seen along the line X-X.

A light emitting device 100 according to example has a first heat dissipation member 115 with a first flow path 112, and a supporting substrate 108 that supplies electric power to light emitting elements 104. They are laminated so as to sandwich an insulating member 107. A second heat dissipation member 109 with a second flow path 113 is laminated on the aforementioned supporting substrate 108. The light conversion member 101 containing a phosphor is coated on a main surface in a side where light is observed of the second heat dissipation member 109. An inlet for admission of a refrigerant to the aforementioned flow path, and an outlet for ejection of the refrigerant external of the light emitting device through the aforementioned flow path are formed in a main surface side of the first heat dissipation member 115, in other words, a side where the light emitting device 100 is mounted. The insulating member 107 and the supporting substrate 108 have through holes in the principle side. The through holes are opposed to the aforementioned inlet and outlet, and serves as third flow paths 110 for communicating the aforementioned first and second flow paths 112 and 113. In addition, a through hole that surrounds mounted semiconductor light emitting elements is formed in the supporting substrate 108. The through hole has an inner wall surface that is tapered so as to reflect light from the light emitting elements toward a side where the light is observed.

A plurality of the light emitting elements 201 are arranged in a matrix shape in a recessed portion of the first heat dissipation member. The light conversion member containing the phosphor to provide white range light is provided on the second heat dissipation member. The light emitting element according to this example has a light emission peak wavelength of 365 nm. The phosphor is suitably selected from the aforementioned phosphors to provide white range light and is mixed. The second heat dissipation member is made of a quartz glass material. The light conversion member is applied to a surface of the quartz glass in a side where light is observed. A formation method of the light emitting device according this example is now described.

First, the first heat dissipation member 115 that cools the light emitting elements is formed. As shown in FIG. 7, material plates of oxygen-free copper are processed to form the first and second plate-shaped members 115a and 115b. The first and second plate-shaped members have 200 μm. Fastening screw holes for are formed at four corners of the first plate-shaped member 115a. The through holes that serve as side walls of the third flow paths are formed in a surface that is opposed to the principle of surface the semiconductor light emitting elements are mounted. After the screw holes are formed, as shown in FIG. 2, at the four corners, asperities that form the first flow path 112, the inlet for admission of the refrigerant into the light emitting device, and the outlet for ejection of the refrigerant external of the light emitting device are formed. In addition, main surfaces of the first and second plate-shape members that are opposed to each other are provided with Au and/or an alloy layer of Au and Sn formed thereon. After that, the first and second plate-shape members are attached to each other by thermal treatment of 300 to 400° C. in a nitrogen atmosphere to form the first heat dissipation member with the laminated plate-shaped members. The aforementioned asperities define space that forms the first flow path between the first and second plate-shape members.

Subsequently, the light conversion member is coated to form the second heat dissipation member 109 for cooling the light conversion member itself. The second heat dissipation member 109 is made of a material that has transparency for at least light of a main wavelength of the semiconductor light emitting element, preferably of light of the light emitting element and the phosphor. For example, the two plate-shaped members 109a and 109b are made of synthetic quarts glass and transparent resin. The asperities, inlet, and outlet are formed in a main surface of at least one of the plate-shaped member. After that, two plate-shaped members are attached to each other to form the second heat dissipation member 109.

In addition, the first heat dissipation member 115 for cooling the light emitting elements to be mounted, the insulating member 107, and the second member on which the light conversion member is coated are successively laminated. In this case, the through holes are previously formed in the insulating member, and the openings of components are positioned such that the inlets and outlets of the first and second heat dissipation members are aligned, respectively. The upper and lower surfaces of the insulating member 107 are electrically insulated. Screw holes corresponding to the aforementioned the screw holes are provided in the insulating member 107. The diameter of the openings of the through hole provided in the insulating member 107 are dimensioned to be smaller than the diameters of the inlet and outlet of the first or second heat dissipation member, and O-rings are preferably provided to the openings. The O-rings are ring-shaped members made of an elastic material such as rubber and silicone resin, and are inserted into the through holes. This construction can prevent leakage of the refrigerant from the light emitting device. As discussed above, the support member on which the semiconductor light emitting elements are mounted is formed.

The semiconductor light emitting elements are mounted on the first heat dissipation member 115 with a conductive adhesive agent. The light conversion member 101 with the phosphor bounded with a transparent resin is coated on an upper surface in a side where light is observed of the second heat dissipation member 109. The semiconductor light emitting elements are mounted with Au—Sn as an adhesive agent in the recessed portion 111 that is formed by the first heat dissipation member and the supporting substrate 108. In this case, the eutectic temperature of Au—Sn when the semiconductor light emitting elements are mounted is set lower than the eutectic temperature of Au—Sn when the plate-shaped members consisting principally of the aforementioned copper are bonded. This can prevent the plate-shaped members from peeling off.

The light emitting device 100 formed as discussed above is attached to a water cooling device, and pure water as the refrigerant is provided to the flow path inside the light emitting device through the inlet. As shown in FIG. 8, pure water that is continuously supplied to the light emitting device through the inlet separately flows in the first flow path 112 and in the second flow path through the third flow path 110, for example. The pure water that separately flows meets again in the periphery of the outlet and is elected external of the light emitting device 100. In the case of circulation of pure water inside the light emitting device, since components are bonded to each other with Au—Sn as an adhesive agent, and the light emitting device according to this example has the O-rings as discussed above, the refrigerant does not leak from a heat sink.

While cooling water is circulated in the light emitting device according to the present invention, electric power is supplied for 60 sec such that the light emitting element emits light at light density of 4.9 W/cm². Reduction of output is not observed.

The temperature of the light conversion member for light density of the light emitting element, and the light output of the light emitting device are measured. The temperature of the light conversion member is measured by a thermistor that is inserted to the light conversion member. As is evident from this example, the light density of light from the light emitting element can be 3.0 W/cm² or more, and the temperature of the light conversion member can be suppressed to at least 200° C. or more, preferably 120° C., more preferably 100° C. or less.

According to the light emitting device of this embodiment, even in the case where light from the light emitting element that excites the phosphor has a short wavelength and is emitted at high density as excitation light, it is possible to suppresses self-heat generation of the phosphor to a negligible extent, and to keep the light conversion efficiency optimized. Therefore, it is possible to provide a light emitting device capable of emitting light at high luminance.

Example 7

Material plates of oxygen-free copper with a thickness of 200 µm are processed to form first and second plate-shaped members as shown in FIGS. 14 and 15. Screw holes are formed at four corners of the first plate-shaped member. Asperities are formed on a second surface that is opposed to a first surface on which a heat generating element is formed (FIG. 14). Screw holes are formed at four corners of the second plate-shaped member. In addition, an inlet for admission of a fluid and an outlet are formed (FIG. 15). Formation surfaces of these members are provided with an Au layer and/or AuSn layer formed thereon. After that, the members are attached by thermal treatment at 300° C. to 400° C. in an N₂ gas atmosphere to form a laminated plate-shaped member. The heat generating element is mounted in the laminated plate-shaped member with an adhesive material such as AuSn. In this case, the weight ratio of AuSn is controlled such that the eutectic temperature when the heat generating member is mounted is low compared with the eutectic temperature in the processing on a copper thin plate. This can suppress peel-off of the heat sink when the heat generating element is bonded. In the state where the heat sink with the heat generating element formed thereon is attached to a water cooling device as discussed above, the fluid is not leaked from the heat sink when the fluid such as pure water is circulated.

Example 7-1

Figure 22:
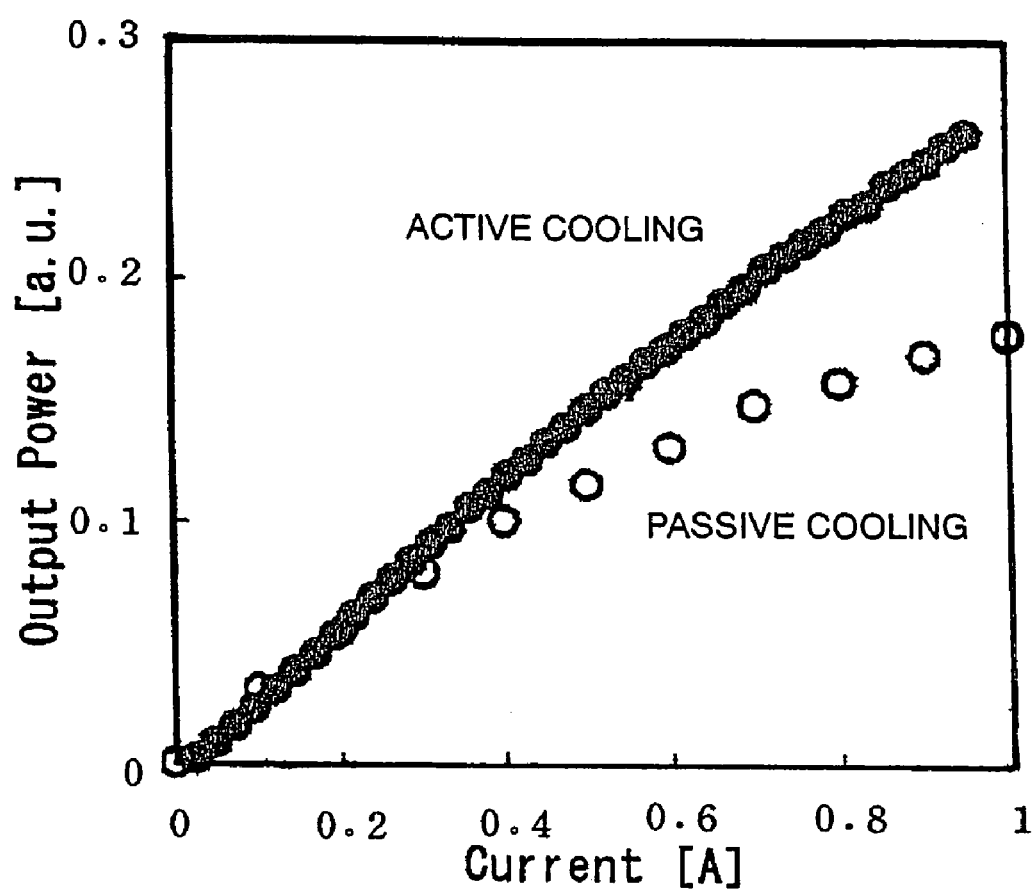
FIG. 22 shows relative comparison between the IL characteristics of an LED device with active cooling means according to the embodiment of the present invention, and an LED device with passive cooling means.
Figure 23:
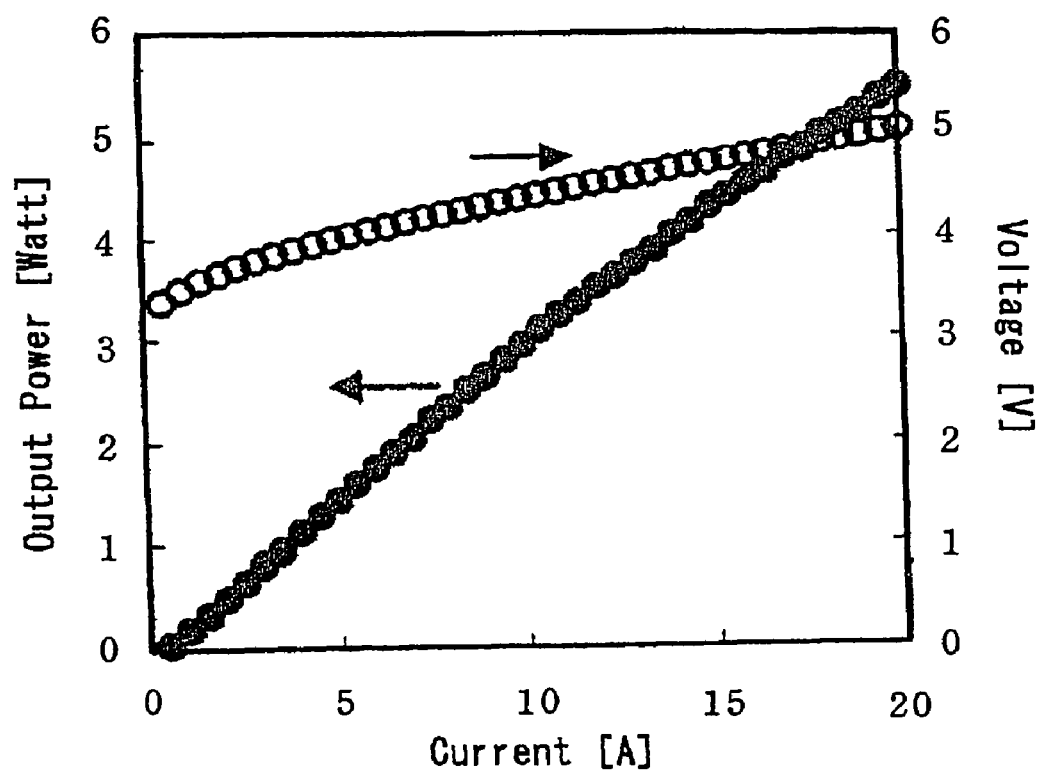
FIG. 23 shows the IL characteristics of a high brightness LED light source according to the embodiment of the present invention.

A heat sink is composed of a laminated plate-shaped member having the aforementioned first plate-shaped member with a second surface on which asperities is formed by chemical etching, and so on. Twenty-one of LED elements formed of a nitride semiconductor with 1 mm square are mounted. Thus, a prototype LED light source with an opening diameter of about 8 mm is produced. A recessed part in the asperities has a width of 200 µm and a depth of 200 µm. A protruding part has a width of 800 µm. The I-L characteristic of one typical element in the twenty-one of elements that composes the LED light source, and the I-L characteristic of one element that is cooled by a conventional passive cooling means are observed. In this observation, in the case of the passive cooling means shown by non-solid circular points, its line is deviated from linearity form 0.3 A to 0.5 A as shown in FIG. 22. On the contrary to this, in the active cooling means according to this example, as shown by a solid line, even in the case of the semiconductor apparatus with the twenty-one LED elements are mounted, it is observed that it has linearity even in the range beyond 0.5 A. As shown in FIG. 23, the semiconductor apparatus with the twenty-one LED elements with 1 mm square are mounted thereon provides light output of over 5 watts. Even in consideration of thermal interference in the case of an interval between the elements of about 200 µm, although the elements are mounted at high density, the high brightness LED light source with excellent linearity is provided.

Example 7-2

Figure 24:
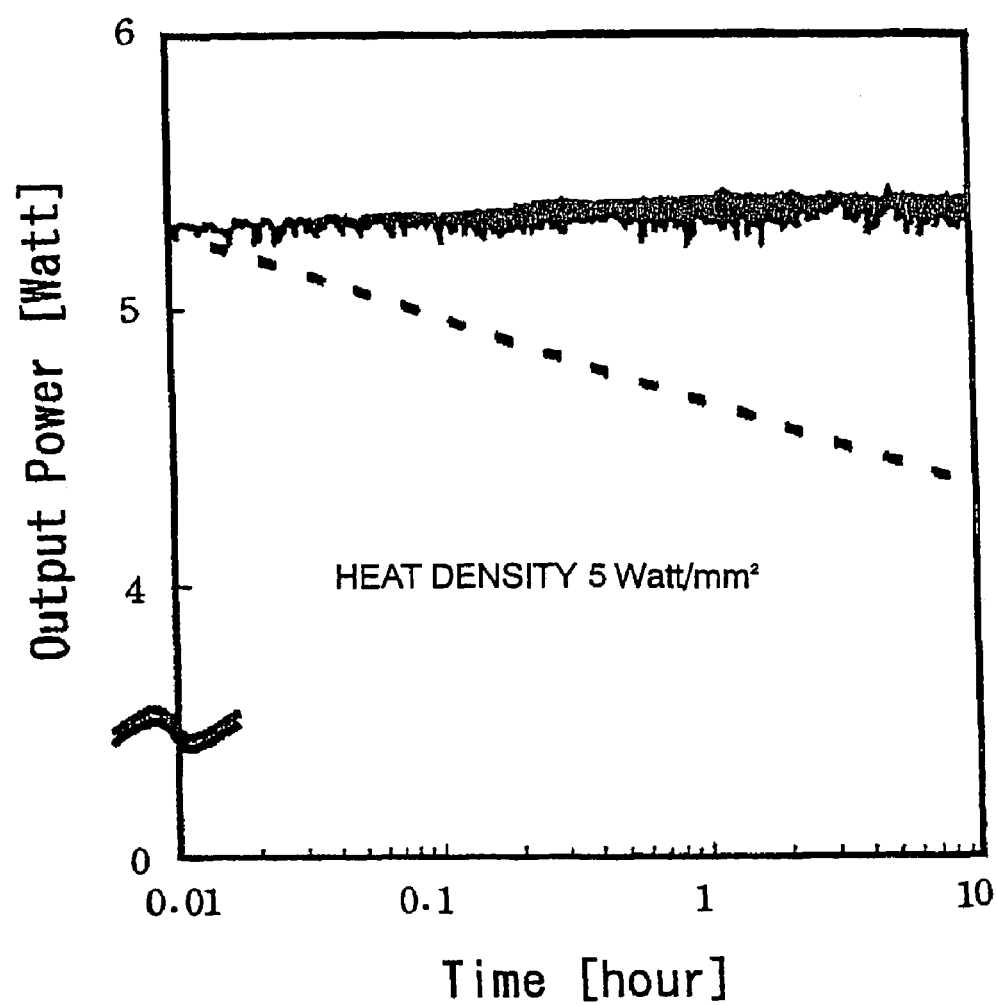
FIG. 24 is comparison of deterioration curves predicted based on between CW-ACC drive tests of a high brightness LED light source according to the embodiment of the present invention, and an LED 1 device with passive cooling means.
Figure 25:
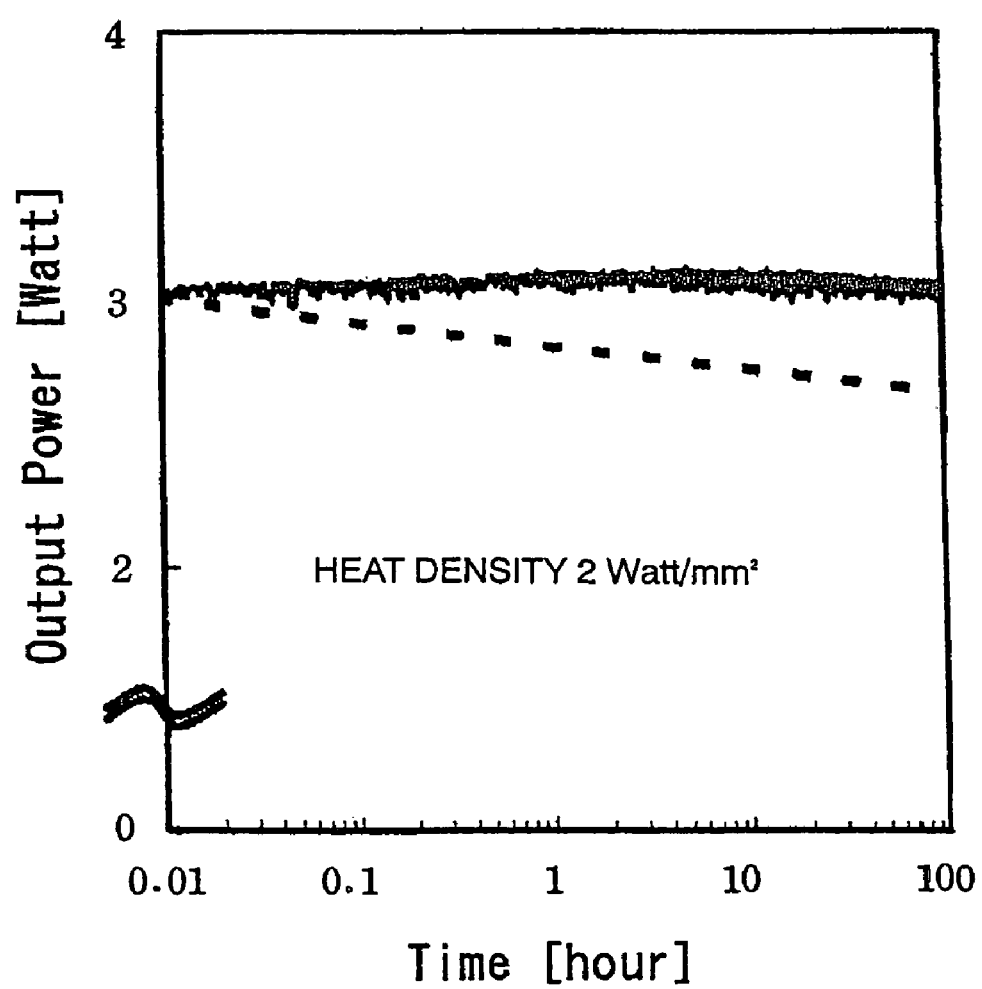
FIG. 25 is comparison of deterioration curves predicted based on between CW-ACC drive tests of a high brightness LED light source according to the embodiment of the present invention, and the LED 1 device with passive cooling means.

A semiconductor apparatus has twenty-one LED elements that are mounted on a heat sink according to the present invention. The semiconductor apparatus is driven at a constant current while pure water as a circulation cooling medium as a fluid is circulated (conditions of temperature 25° C., and flow rate 0.4 L/min). FIGS. 24 and 25 show the result.

The aforementioned semiconductor apparatus is driven at a constant current of 10.5 A (an applied current per element is 0.5 A) while pure water is (conditions of temperature 250° C., and flow rate 0.4 L/min) circulated (FIG. 24). In a passive cooling method as a comparative example, if one element is applied with a current of 0.5 A, it is expected that its output will decrease to about 10% after 100 hours later as shown by a dotted line. However, in the case where it is mounted on the heat sinks that employs active cooling means according to the present invention, even when the LED elements as the heat generating elements are mounted at high density such as an interval between them of about 200 µm, their deterioration after 100 hours later is almost not observed. In this case, although heat density is about 2 Watts/mm², the light output is over 3 Watts.

Example 7-3

A semiconductor apparatus has twenty-one LED elements that are mounted on a heat sink according to the present invention. The semiconductor apparatus is driven at a constant current of 20 A (an applied current per element is 0.95 A) while pure water (conditions of temperature 25° C., and flow rate 0.4 L/min) is circulated (FIG. 25). In a passive cooling method, if one element is applied with a current of 1 A, it is expected that its output will decrease to about 15% after 10 hours later. However, in the case where it is mounted on the heat sinks that employ active cooling means according to the present invention, even when the LED elements are mounted at high density such as an interval between them of about 200 µm, their deterioration after 10 hours later is almost not observed. In this case, although heat density is about 5 Watts/mm², the light output is over 5 Watts.

Example 7-4

Figure 26:
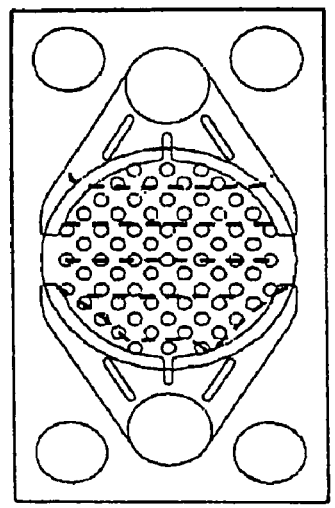
FIGS. 26(a) to (c) show pressure contours of examples according to the present invention and a comparative example.
Figure 26:
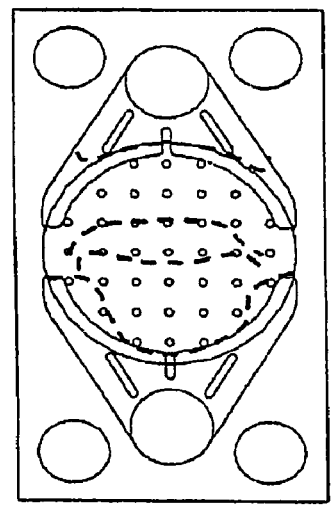
Figure 26:
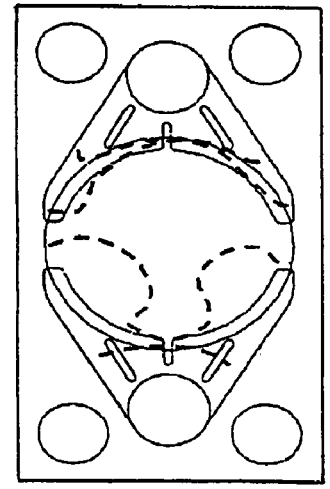

Simulation is performed on an apparatus (hereinafter, referred to as a "system") that has heat generating elements mounted in a matrix shape on a heat sink assuming that it is placed in a vacuum thermally insulated space and cooling water of 25° C. is circulated in the heat sink. FIG. 26 shows the simulation result. In FIG. 26(*a*), simulation is performed by using a heat sink that has protruding portions with a large diameter located at the center and four corners of the heat generating element (hereinafter, referred to as simply "(a)"). In FIG. 26(*b*), simulation is performed by using a heat sink that has protruding portions with a small diameter located at the center of the heat generating element (hereinafter, referred to as simply "(b)"). In FIG. 26(*c*), simulation is performed by using a heat sink that did not have any protruding portions (hereinafter, referred to as simply "(c)").

In the case of (b) rather than (c), and in the case of (a) rather than (b), water pressure distribution of the cooling fluid tends to have contour lines that are perpendicular to the fluid flow. Additionally, the cooling fluid tends to flow uniformly in the whole of flow path. Accordingly, it is found that, in the case of the light emitting device using the heat sink with the protruding portions set as (a), characteristics unevenness due to heat is suppressed.

In the simulation, since cooling water of 25° C. is constantly circulated, if the minimum temperature of the system is 25° C. or more, heat is stored in the heat sink. In other words, practically, since heat is dissipated toward materials external of the system, it is assumed that the temperature of a package increases.

Figure 27:
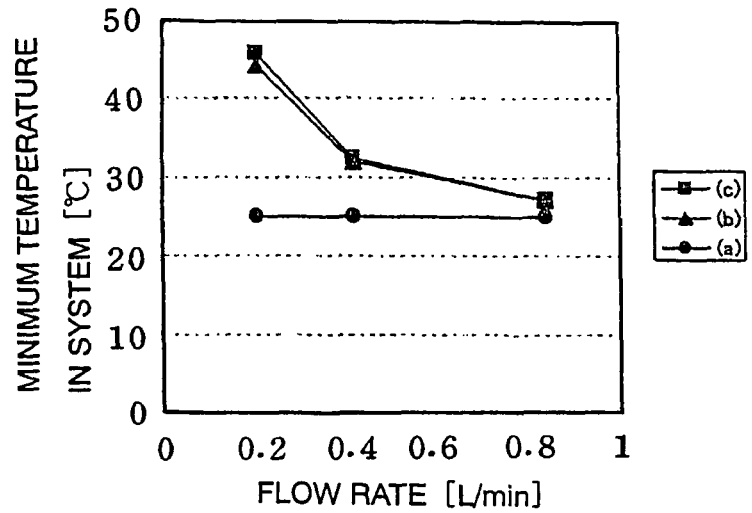
FIG. 27 shows a relationship between the minimum temperature of heat dissipation member of each of the light emitting devices of example according to the present invention and a comparative example, and the flow rate of fluid.
Figure 28:
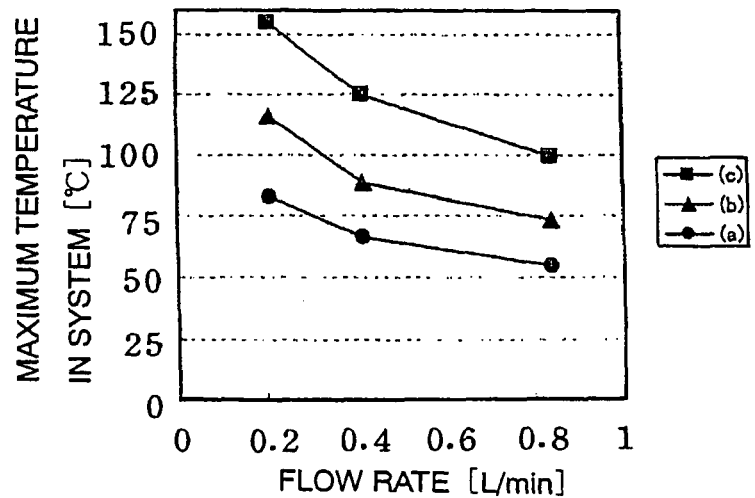
FIG. 28 shows a relationship between the minimum temperature of heat dissipation member of each of the light emitting devices of example according to the present invention and a comparative example, and the flow rate of fluid.
Figure 29:
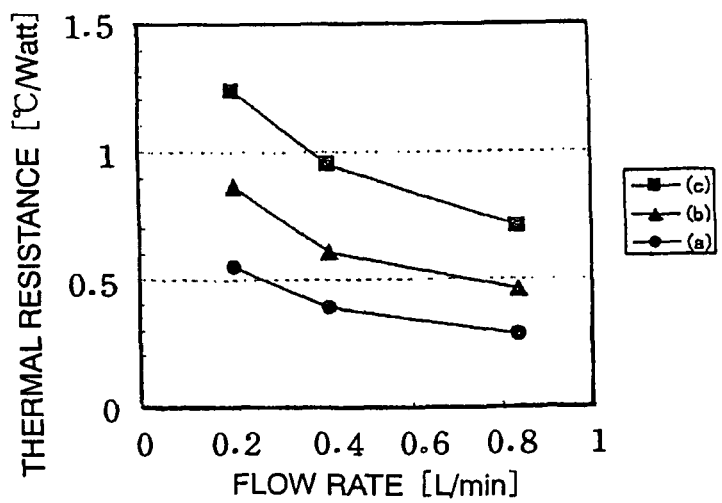
FIG. 29 shows a relationship between the thermal resistance of heat dissipation member of each of the light emitting devices of example according to the present invention and a comparative example, and the flow rate of fluid.

In the light emitting device that uses the heat sink with protruding portions set as (a), as shown in FIGS. 27 and 28, even in the case of small flow rate, since the minimum temperature in the system (the lowest temperature in the heat sink) and the maximum temperature in the system (the highest temperature in the heat sink, i.e., the temperature of the heat generating element itself) are low, heat dissipation external of the system is suppressed. Accordingly, thermal equilibrium can be obtained.

FIG. 20 shows a relationship between thermal resistance calculated based on the maximum temperature of the system and flow rate. The light emitting device that uses the heat sink with protruding portions set as (a) can provide thermal resistance of 0.5° C./Watt or less in the flow rate of 0.3 to 0.7 L/min. This shows that very high density heat can be ejected.

According to the light emitting device according to this example, a high-power light emitting device that can be handled with bare hands even in the case where electric power over 100 Watts is continuously applied can be provided.

INDUSTRIAL APPLICABILITY

A light emitting device can be applied to light emitting devices such as general lighting of phosphor lamp, lighting for signals or automobiles, backlight for LCDs, and display, particularly to white range light and multi-color light emitting devices that use semiconductor light emitting elements.

According to the present invention, since heat dissipation characteristics are excellent, and a phosphor does not deteriorate, the present invention can be applied to a lighting apparatus that has reliability and emits high-power light.

Moreover, the present invention can be applied to a heat sink with a semiconductor light emitting element or a semiconductor photoreceptor element, or a heat generating element such as semiconductor device, formed thereon and to a semiconductor apparatus having this heat sink.

The invention claimed is:

1. A semiconductor light emitting apparatus comprising:
a heat dissipation member to dissipate heat generated by a heat generating element, the heat dissipation member being formed of a first plate-shaped member and a second plate-shaped member that form a flow path for flowing cooling fluid between them; and
a plurality of light emitting elements that are mounted to be two-dimensionally arranged on a main surface of the heat dissipation member,
wherein said heat dissipation member defines an inlet for an intake of the cooling fluid and an outlet communicating with the inlet for an ejection of the cooling fluid,
wherein a plurality of protruding portions are formed on a surface of said first plate-shaped member inside said flow path, and
wherein said second plate-shaped member defines a fan-shaped recessed section that extends from said inlet and/or said outlet toward a center part of said second plate-shaped member substantially in a fan shape on a surface of said second plate-shaped member inside said flow path.

2. The semiconductor light emitting apparatus according to claim 1, wherein said plurality of protruding portions are arranged apart from each other in a bent manner such that line segments that successively connect the protruding portions closest to each other repeatedly change their direction from the inlet to the outlet of said flow path.

3. The semiconductor light emitting apparatus according to claim 1, wherein at least some of said plurality of protruding portions are formed between said light emitting elements.

4. The semiconductor light emitting apparatus according to claim 1, wherein at least some of said plurality of protruding portions are formed such that their centers are located between said light emitting elements and a substantially central part of said light emitting element.

5. The semiconductor light emitting apparatus according to claim 1, wherein said plurality of protruding portions are located at a substantially central part of and in the peripheries of the corners of the light emitting element.

6. The semiconductor light emitting apparatus according to claim 1, wherein an upper surface of the protruding portion is bonded with the surface of the second plate-shaped member.

7. The semiconductor light emitting apparatus according to claim 1, wherein said flow path is formed in a substantially circular or oval cross section.

8. The semiconductor light emitting apparatus according to claim 1, wherein said inlet and/or said outlet of the flow path is formed in an arc-shape.

9. The semiconductor light emitting apparatus according to claim 1, wherein a metal material containing Au coats attaching surfaces of said first plate-shaped member and said second plate-shaped member.

10. The semiconductor light emitting apparatus according to claim 1, wherein said second plated-shaped member defines a plurality of support pillars formed on a bottom of the fan-shaped recessed section.

11. The semiconductor light emitting apparatus according to claim 1, wherein said second plated-shaped member is positioned lower than said first plate-shaped member.

\* \* \* \* \*